United States Patent
Shimizu et al.

(10) Patent No.: US 7,420,905 B2
(45) Date of Patent: Sep. 2, 2008

(54) INFORMATION REPRODUCING METHOD JUDGING A MULTIVALUED LEVEL OF A PRESENT CELL BY REFERRING TO JUDGED MULTIVALUED LEVELS OF A PRECEDING CELL AND AN ENSUING CELL

(75) Inventors: Akihiko Shimizu, Kanagawa (JP); Koubun Sakagami, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/698,160

(22) Filed: Jan. 26, 2007

(65) Prior Publication Data

US 2007/0121465 A1 May 31, 2007

Related U.S. Application Data

(63) Continuation of application No. 11/339,669, filed on Jan. 26, 2006, which is a continuation of application No. 10/207,176, filed on Jul. 30, 2002, now Pat. No. 7,082,091.

(30) Foreign Application Priority Data

Jul. 31, 2001 (JP) .............................. 2001-232471
Jul. 31, 2001 (JP) .............................. 2001-232474

(51) Int. Cl.
*G11B 7/00* (2006.01)
(52) U.S. Cl. ............. 369/59.24; 369/47.17; 369/124.02
(58) Field of Classification Search ............. 369/59.24, 369/47.17, 124.02

(56) References Cited

U.S. PATENT DOCUMENTS

| | | | |
|---|---|---|---|
| 3,713,140 A | 1/1973 | Mesiener | |
| 5,200,841 A | 4/1993 | Kotaki et al. | |
| 5,270,714 A | 12/1993 | Tanaka et al. | |
| 5,546,369 A | 8/1996 | Lee et al. | |
| 5,808,988 A * | 9/1998 | Maeda et al. | 369/47.17 |
| 6,693,872 B1 * | 2/2004 | Brewen et al. | 369/124.02 |
| 6,754,141 B1 * | 6/2004 | Uchida et al. | 369/13.54 |
| 6,940,790 B1 | 9/2005 | Powelson et al. | |
| 6,967,911 B1 * | 11/2005 | Ishibashi et al. | 369/47.17 |
| 7,082,091 B2 | 7/2006 | Shimizu et al. | |

FOREIGN PATENT DOCUMENTS

| | | |
|---|---|---|
| JP | 5-54391 | 3/1993 |
| JP | 11-25456 | 1/1999 |

* cited by examiner

*Primary Examiner*—Gautam R Patel
(74) *Attorney, Agent, or Firm*—Dickstein Shapiro LLP

(57) ABSTRACT

A mark representing information of a multivalued level is recorded in each of cells arranged in a recording medium. Upon reproducing the multivalued level from a reproduction signal of the recording medium, the multivalued level of a present cell is judged by referring to a judged multivalued level of a preceding cell preceding the present cell or an ensuing cell ensuing the present cell, or by referring to the judged multivalued levels of both the preceding cell and the ensuing cell.

17 Claims, 43 Drawing Sheets

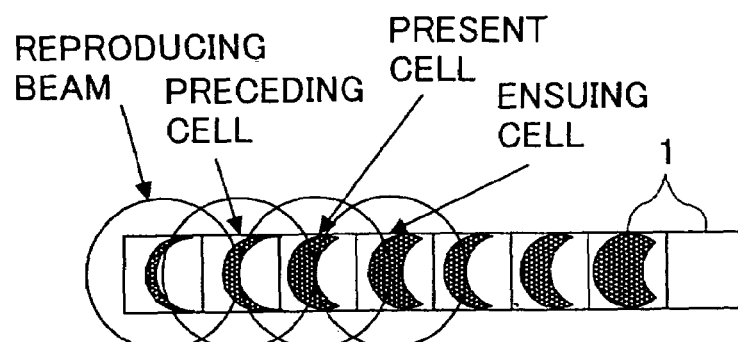
FIG.1A
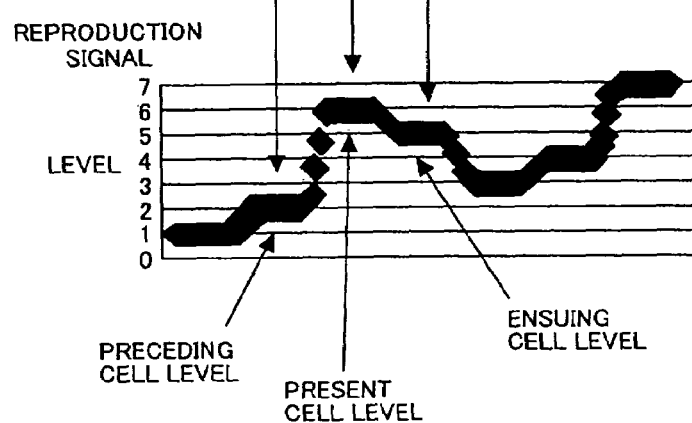
FIG.1B
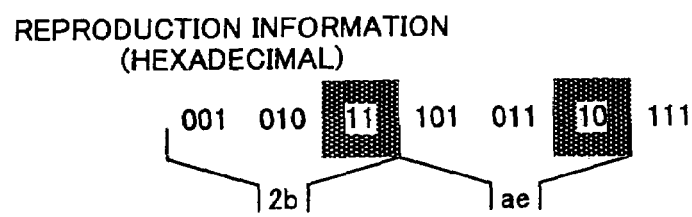
FIG.1C
FIG.1D

FIG.9

| | 0 | 1 | 2 | 3 | 4 | ...... | 124 | 125 | 126 | 127 | 128 | 129 | 130 | 131 | 132 | 133 | 134 | 135 | 136 | ...... | 1020 | 1021 | 1022 | 1023 | |
|---|---|---|---|---|---|---|---|---|---|---|---|---|---|---|---|---|---|---|---|---|---|---|---|---|---|
| 0 | 0 | 0 | 0 | 0 | 0 | | 0 | 0 | 0 | 1 | 1 | 1 | 1 | 1 | 1 | 1 | 1 | 1 | 1 | | 7 | 7 | 7 | 7 | ← PRECEDING CELL=0 |
| 1024 | 0 | 0 | 0 | 0 | 0 | | 0 | 0 | 0 | 0 | 1 | 1 | 1 | 1 | 1 | 1 | 1 | 1 | 1 | | 7 | 7 | 7 | 7 | ← PRECEDING CELL=1 |
| 2048 | 0 | 0 | 0 | 0 | 0 | | 0 | 0 | 0 | 0 | 0 | 1 | 1 | 1 | 1 | 1 | 1 | 1 | 1 | | 7 | 7 | 7 | 7 | ← PRECEDING CELL=2 |
| 3072 | 0 | 0 | 0 | 0 | 0 | | 0 | 0 | 0 | 0 | 0 | 0 | 0 | 0 | 1 | 1 | 1 | 1 | 1 | | 7 | 7 | 7 | 7 | ← PRECEDING CELL=3 |
| 4096 | 0 | 0 | 0 | 0 | 0 | | 0 | 0 | 0 | 0 | 0 | 0 | 0 | 0 | 0 | 0 | 1 | 1 | 1 | | 7 | 7 | 7 | 7 | ← PRECEDING CELL=4 |
| 5120 | 0 | 0 | 0 | 0 | 0 | | 0 | 0 | 0 | 0 | 0 | 0 | 0 | 0 | 0 | 1 | 1 | 1 | 1 | | 7 | 7 | 7 | 7 | ← PRECEDING CELL=5 |
| 6144 | 0 | 0 | 0 | 0 | 0 | | 0 | 0 | 0 | 0 | 0 | 0 | 0 | 1 | 1 | 1 | 1 | 1 | 1 | | 7 | 7 | 7 | 7 | ← PRECEDING CELL=6 |
| 7168 | 0 | 0 | 0 | 0 | 0 | | 0 | 0 | 0 | 0 | 0 | 0 | 1 | 1 | 1 | 1 | 1 | 1 | 1 | | 7 | 7 | 7 | 7 | ← PRECEDING CELL=7 |

PRESENT CELL LEVEL

| | 0 | 16 | 32 | 48 | 64 | 80 | 96 | 112 | 128 | 144 | 160 | 176 | 192 | 208 | 224 | 240 | ...... | 911 | 927 | 943 | 959 | 975 | 991 | 1007 | 1023 |
|---|---|---|---|---|---|---|---|---|---|---|---|---|---|---|---|---|---|---|---|---|---|---|---|---|---|
| EVEN-NUMBER VALUE → VALUE $y_0$ | 0 | 1 | 2 | 3 | 4 | 5 | 6 | 7 | | | | | | | | | ...... | | | | | | | | |

PRESENT CELL LEVEL

| | 0 | 16 | 32 | 48 | 64 | 80 | 96 | 112 | 128 | 144 | 160 | 176 | 192 | 208 | 224 | 240 | ...... | 911 | 927 | 943 | 959 | 975 | 991 | 1007 | 1023 |
|---|---|---|---|---|---|---|---|---|---|---|---|---|---|---|---|---|---|---|---|---|---|---|---|---|---|
| ODD-NUMBER VALUE → VALUE $y_0$ | 0 | 1 | 2 | 3 | 4 | 5 | 6 | 7 | | | | | | | | | ...... | | | | | | | | |

PRESENT CELL LEVEL 0 16 32 48 64 80 96 112 128 144 160 176 192 208 224 240 ... 911 927 943 959 975 991 1007 1023

| 0 | 1 | 2 | 3 | 4 | 5 | 6 | 7 | 0 | 1 | 2 | 3 | 4 | 5 | 6 | 7 | ... | 0 | 1 | 2 | 3 | 4 | 5 | 6 | 7 |

EVEN-NUMBER VALUE → VALUE y1

PRECEDING CELL LEVEL = 0    PRECEDING CELL LEVEL = 1    PRECEDING CELL LEVEL = 7

PRESENT CELL LEVEL 0 16 32 48 64 80 96 112 128 144 160 176 192 208 224 240 ... 911 927 943 959 975 991 1007 1023

| 0 | 1 | 2 | 3 | 4 | 5 | 6 | 7 | 0 | 1 | 2 | 3 | 4 | 5 | 6 | 7 | ... | 0 | 1 | 2 | 3 | 4 | 5 | 6 | 7 |

ODD-NUMBER VALUE → VALUE y1

PRECEDING CELL LEVEL = 0    PRECEDING CELL LEVEL = 1    PRECEDING CELL LEVEL = 7

EVEN-NUMBER VALUE → VALUE y2

0  16  32  48  64  80  96  112 128 144 160 176 192 208 224 240    911 927 943 959 975 991 1007 1023

| 0 | 1 | 2 | 3 | 4 | 5 | 6 | 7 | 0 | 1 | 2 | 3 | 4 | 5 | 6 | 7 | ...... | ...... | 0 | 1 | 2 | 3 | 4 | 5 | 6 | 7 |

ENSUING CELL LEVEL = 0    ENSUING CELL LEVEL = 1    PRESENT CELL LEVEL    ENSUING CELL LEVEL = 7

ODD-NUMBER VALUE → VALUE y2

0  16  32  48  64  80  96  112 128 144 160 176 192 208 224 240    911 927 943 959 975 991 1007 1023

| 0 | 1 | 2 | 3 | 4 | 5 | 6 | 7 | 0 | 1 | 2 | 3 | 4 | 5 | 6 | 7 | ...... | ...... | 0 | 1 | 2 | 3 | 4 | 5 | 6 | 7 |

ENSUING CELL LEVEL = 0    ENSUING CELL LEVEL = 1    PRESENT CELL LEVEL    ENSUING CELL LEVEL = 7

FIG.21

| PRECEDING LEVEL | ENSUING LEVEL | | | | | | | | | | | | | | | | | | | | | | | |
|---|---|---|---|---|---|---|---|---|---|---|---|---|---|---|---|---|---|---|---|---|---|---|---|---|
| | 0 | 16 | 32 | 48 | 64 | 80 | 96 | 112 | 128 | 144 | 160 | 176 | 192 | 208 | 224 | 240 | ... | 911 | 927 | 943 | 959 | 975 | 991 | 1007 1023 |
| | 0 | 1 | 2 | 3 | 4 | 5 | 6 | 7 | 0 | 1 | 2 | 3 | 4 | 5 | 6 | 7 | ... | 0 | 1 | 2 | 3 | 4 | 5 | 6 | 7 |
| 0      0 | 0 | 0 | 0 | 0 | 0 | 0 | 0 | 0 | 1 | 1 | 1 | 1 | 1 | 1 | 1 | 1 | ... | 7 | 7 | 7 | 7 | 7 | 7 | 7 | 7 |
| 1024   1 | 0 | 0 | 0 | 0 | 0 | 0 | 0 | 0 | 1 | 1 | 1 | 1 | 1 | 1 | 1 | 1 | ... | 7 | 7 | 7 | 7 | 7 | 7 | 7 | 7 |
| 2048   2 | 0 | 0 | 0 | 0 | 0 | 0 | 0 | 0 | 1 | 1 | 1 | 1 | 1 | 1 | 1 | 1 | ... | 7 | 7 | 7 | 7 | 7 | 7 | 7 | 7 |
| 3072   3 | 0 | 0 | 0 | 0 | 0 | 0 | 0 | 0 | 1 | 1 | 1 | 1 | 1 | 1 | 1 | 1 | ... | 7 | 7 | 7 | 7 | 7 | 7 | 7 | 7 |
| 4096   4 | 0 | 0 | 0 | 0 | 0 | 0 | 0 | 0 | 1 | 1 | 1 | 1 | 1 | 1 | 1 | 1 | ... | 7 | 7 | 7 | 7 | 7 | 7 | 7 | 7 |
| 5120   5 | 0 | 0 | 0 | 0 | 0 | 0 | 0 | 0 | 1 | 1 | 1 | 1 | 1 | 1 | 1 | 1 | ... | 7 | 7 | 7 | 7 | 7 | 7 | 7 | 7 |
| 6144   6 | 0 | 0 | 0 | 0 | 0 | 0 | 0 | 0 | 1 | 1 | 1 | 1 | 1 | 1 | 1 | 1 | ... | 7 | 7 | 7 | 7 | 7 | 7 | 7 | 7 |
| 7168   7 | 0 | 0 | 0 | 0 | 0 | 0 | 0 | 0 | 1 | 1 | 1 | 1 | 1 | 1 | 1 | 1 | ... | 7 | 7 | 7 | 7 | 7 | 7 | 7 | 7 |

PRESENT CELL LEVEL = 0   PRESENT CELL LEVEL = 1   PRESENT CELL LEVEL = 7

EXTRACT EIGHT REFERENCE VALUES FOR PRESENT-CELL LEVEL FROM LEARNED TABLE, CORRESPONDING TO (CLn−1 = 1) AND (CLn+1 = 5)

37

| 1 | σ10 | σ11 | DETERMINE A COMBINATION PATH INVOLVING SMALLEST SUM OF SQUARES $\Sigma(\sigma i0^2 + \sigma ij^2)$ TO BE CORRECT |
| --- | --- | --- | --- |
| 2 | | σ12 | |
| 3 | | σ13 | |
| 4 | σ20 | σ21 | |
| 5 | | σ22 | |
| 6 | | σ23 | |
| 7 | σ30 | σ31 | |
| 8 | | σ32 | |
| 9 | | σ33 | |

FIG.26

| # | | | | |
|---|---|---|---|---|
| 1 | | | $\sigma 111$ | |
| 2 | | $\sigma 110$ | $\sigma 112$ | |
| 3 | | | $\sigma 113$ | |
| 4 | | | $\sigma 121$ | |
| 5 | $\sigma 100$ | $\sigma 120$ | $\sigma 122$ | |
| 6 | | | $\sigma 123$ | |
| 7 | | | $\sigma 131$ | |
| 8 | | $\sigma 130$ | $\sigma 132$ | |
| 9 | | | $\sigma 133$ | |
| 10 | | | $\sigma 211$ | |
| 11 | | $\sigma 210$ | $\sigma 212$ | |
| 12 | | | $\sigma 213$ | |
| 13 | | | $\sigma 221$ | COMPARE SUMS OF |
| 14 | $\sigma 200$ | $\sigma 220$ | $\sigma 222$ | SQUARES OF ERRORS |
| 15 | | | $\sigma 223$ | |
| 16 | | | $\sigma 231$ | |
| 17 | | $\sigma 230$ | $\sigma 232$ | |
| 18 | | | $\sigma 233$ | |
| 19 | | | $\sigma 311$ | |
| 20 | | $\sigma 310$ | $\sigma 312$ | |
| 21 | | | $\sigma 313$ | |
| 22 | | | $\sigma 321$ | |
| 23 | $\sigma 300$ | $\sigma 320$ | $\sigma 322$ | |
| 24 | | | $\sigma 323$ | |
| 25 | | | $\sigma 331$ | |
| 26 | | $\sigma 330$ | $\sigma 332$ | |
| 27 | | | $\sigma 333$ | |

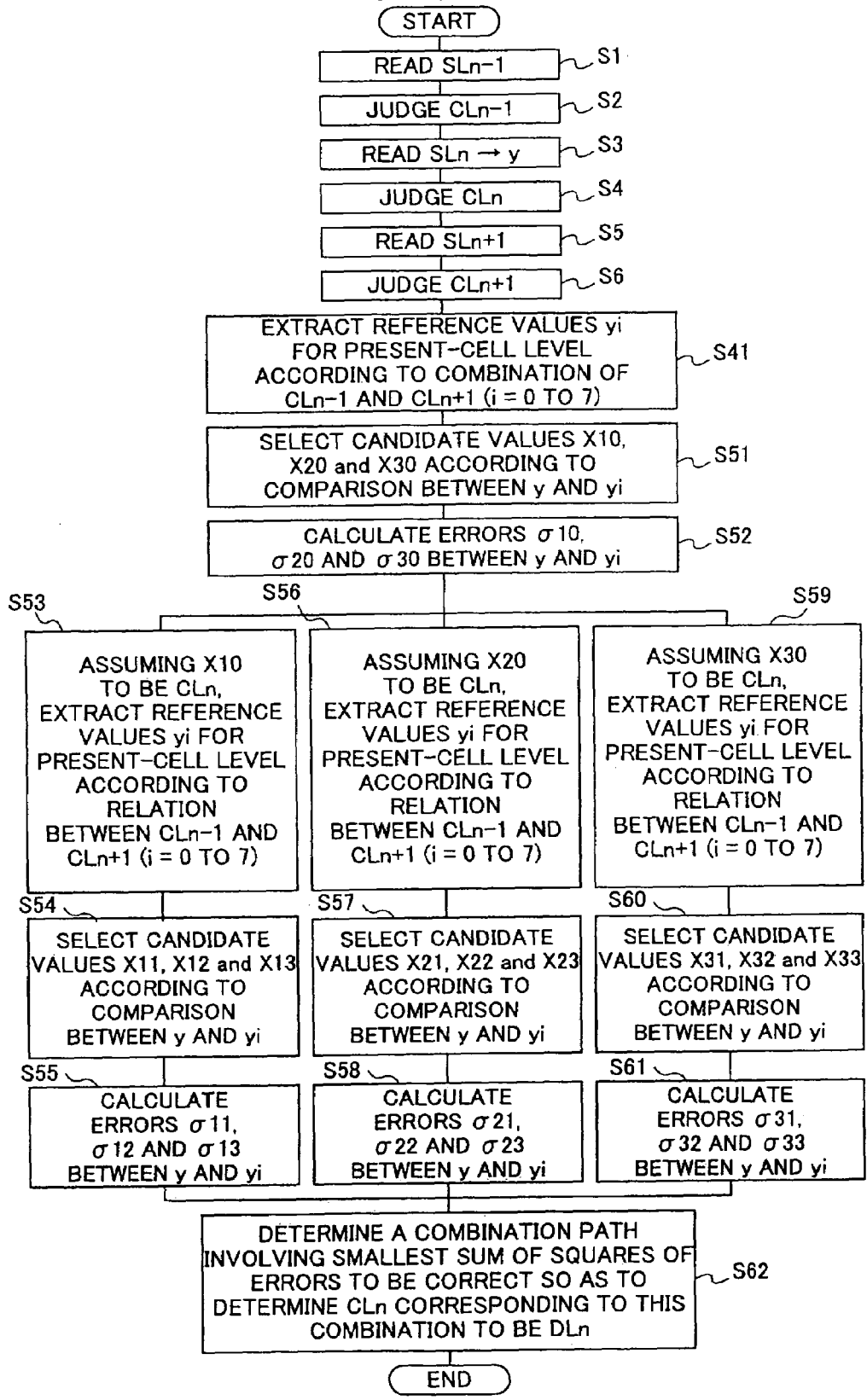

FIG.30

| | 0 | 1 | 2 | 3 | ... | 129 | 130 | 131 | 132 | 133 | ... | 255 | 256 | 257 | 258 | 259 | 260 | 261 | 262 | 263 | ... | 1022 | 1023 | |
|---|---|---|---|---|---|---|---|---|---|---|---|---|---|---|---|---|---|---|---|---|---|---|---|---|
| 0 | 0 | 0 | 0 | 0 | | 1 | 1 | 1 | 1 | 1 | | 1 | 2 | 2 | 2 | 2 | 2 | 2 | 2 | 2 | | 7 | 7 | ← EIGHT-VALUED CELL: PRECEDING CELL = 0 |
| 1024 | 0 | 0 | 0 | 0 | | 1 | 1 | 1 | 1 | 1 | | 1 | 1 | 2 | 2 | 2 | 2 | 2 | 2 | 2 | | 7 | 7 | ← EIGHT-VALUED CELL: PRECEDING CELL = 1 |
| 2048 | 0 | 0 | 0 | 0 | | 0 | 1 | 1 | 1 | 1 | | 1 | 1 | 1 | 1 | 2 | 2 | 2 | 2 | 2 | | 7 | 7 | ← EIGHT-VALUED CELL: PRECEDING CELL = 2 |
| 3072 | 0 | 0 | 0 | 0 | | 0 | 0 | 0 | 1 | 1 | | 1 | 1 | 1 | 1 | 1 | 1 | 2 | 2 | 2 | | 7 | 7 | ← EIGHT-VALUED CELL: PRECEDING CELL = 3 |
| 4096 | 0 | 0 | 0 | 0 | | 0 | 0 | 0 | 0 | 0 | | 1 | 1 | 1 | 1 | 1 | 1 | 1 | 2 | 2 | | 7 | 7 | ← EIGHT-VALUED CELL: PRECEDING CELL = 4 |
| 5120 | 0 | 0 | 0 | 0 | | 0 | 0 | 0 | 0 | 1 | | 1 | 1 | 1 | 1 | 1 | 1 | 1 | 1 | 2 | | 7 | 7 | ← EIGHT-VALUED CELL: PRECEDING CELL = 5 |
| 6144 | 0 | 0 | 0 | 0 | | 0 | 0 | 0 | 0 | 1 | | 1 | 1 | 1 | 1 | 1 | 2 | 2 | 1 | 2 | | 7 | 7 | ← EIGHT-VALUED CELL: PRECEDING CELL = 6 |
| 7168 | 0 | 0 | 0 | 0 | | 0 | 0 | 0 | 0 | 0 | | 1 | 1 | 1 | 1 | 2 | 2 | 2 | 2 | 2 | | 7 | 7 | ← EIGHT-VALUED CELL: PRECEDING CELL = 7 |
| 8192 | 0 | 0 | 0 | 0 | | 0 | 0 | 0 | 0 | 0 | | 0 | 0 | 0 | 0 | 0 | 2 | 2 | 2 | 2 | | 6 | 6 | ← FOUR-VALUED CELL TABLE |

| | 0 | 1 | 2 | 3 | ... | 129 | 130 | 131 | 132 | 133 | ... | 255 | 256 | 257 | 258 | 259 | 260 | 261 | 262 | 263 | ... | 1022 | 1023 | |
|---|---|---|---|---|---|---|---|---|---|---|---|---|---|---|---|---|---|---|---|---|---|---|---|---|
| 0 | 0 | 0 | 0 | 0 | | 1 | 1 | 1 | 1 | 1 | | 1 | 2 | 2 | 2 | 2 | 2 | 2 | 2 | 2 | | 7 | 7 | ⎫ PRECEDING-CELL-BASED TABLE |
| 1024 | 0 | 0 | 0 | 0 | | 1 | 1 | 1 | 1 | 1 | | 1 | 1 | 2 | 2 | 2 | 2 | 2 | 2 | 2 | | 7 | 7 | |
| 2048 | 0 | 0 | 0 | 0 | | 0 | 1 | 1 | 1 | 1 | | 1 | 1 | 1 | 1 | 2 | 2 | 2 | 2 | 2 | | 7 | 7 | ⎭ |
| ...... | | | | | | | | | | | | | | | | | | | | | | | | |
| 7168 | 0 | 0 | 0 | 0 | | 0 | 0 | 1 | 1 | 1 | | 1 | 1 | 1 | 1 | 1 | 1 | 1 | 1 | 2 | | 7 | 7 | ⎫ FOUR-VALUED CELL TABLE |
| 8192 | 0 | 0 | 0 | 0 | | 0 | 0 | 0 | 0 | 0 | | 0 | 0 | 0 | 0 | 2 | 2 | 2 | 2 | 2 | | 6 | 6 | ⎭ |
| 9216 | 0 | 0 | 0 | 0 | | 0 | 1 | 1 | 1 | 1 | | 1 | 1 | 2 | 2 | 2 | 2 | 2 | 2 | 2 | | 7 | 7 | ⎫ ENSUING-CELL-BASED TABLE |
| 10240 | 0 | 0 | 0 | 0 | | 0 | 1 | 1 | 1 | 1 | | 1 | 1 | 1 | 1 | 2 | 2 | 2 | 2 | 2 | | 7 | 7 | |
| ...... | | | | | | | | | | | | | | | | | | | | | | | | |
| 16384 | 0 | 0 | 0 | 0 | | 0 | 0 | 0 | 0 | 0 | | 1 | 1 | 1 | 1 | 1 | 2 | 2 | 2 | 2 | | 7 | 7 | ⎭ |

FIG.44

| | 0 | 1 | 2 | 3 | ...129 | 130 | 131 | 132 | 133 | ...255 | 256 | 257 | 258 | 259 | 260 | 261 | 262 | 263 | ...1022 | 1023 |
|---|---|---|---|---|---|---|---|---|---|---|---|---|---|---|---|---|---|---|---|---|
| 0 | 0 | 0 | 0 | 0 | | | | | | | 1 | 2 | 2 | 2 | 2 | 2 | 2 | 2 | 7 | 7 | PRECEDING-CELL-BASED TABLE
| 1024 | 0 | 0 | 0 | 0 | 1 | 1 | 1 | 1 | 1 | 1 | 1 | 2 | 2 | 2 | 2 | 2 | 2 | 2 | 7 | 7 |
| 2048 | 0 | 0 | 0 | 0 | 0 | 0 | 0 | 1 | 1 | 1 | 1 | 2 | 1 | 2 | 2 | 2 | 2 | 2 | 7 | 7 |
| ... | | | | | | | | | | | | | | | | | | | | |
| 7168 | 0 | 0 | 0 | 0 | 0 | 0 | 1 | 1 | 1 | 1 | 1 | 1 | 1 | 1 | 2 | 2 | 2 | 2 | 7 | 7 |
| 8192 | 0 | 0 | 0 | 0 | 0 | 0 | 0 | 0 | 0 | 0 | 0 | 0 | 0 | 1 | 2 | 2 | 2 | 2 | 6 | 6 | FOUR-VALUED CELL TABLE
| 9216 | 0 | 0 | 0 | 0 | 0 | 0 | 1 | 1 | 1 | 1 | 1 | 2 | 2 | 2 | 2 | 2 | 2 | 2 | 7 | 7 | ENSUING-CELL-BASED TABLE
| 10240 | 0 | 0 | 0 | 0 | 0 | 0 | 1 | 1 | 1 | 1 | 1 | 1 | 1 | 2 | 2 | 2 | 2 | 2 | 7 | 7 |
| ... | | | | | | | | | | | | | | | | | | | | |
| 16384 | 0 | 0 | 0 | 0 | 0 | 0 | 1 | 1 | 1 | 1 | 1 | 1 | 1 | 1 | 2 | 2 | 2 | 2 | 7 | 7 |
| 17408 | 0 | 0 | 0 | 0 | 1 | 1 | 1 | 1 | 1 | 1 | 1 | 2 | 2 | 2 | 2 | 2 | 2 | 2 | 7 | 7 | PRECEDING-AND-ENSUING-CELL-BASED TABLE
| 18432 | 0 | 0 | 0 | 0 | 1 | 1 | 1 | 1 | 1 | 1 | 1 | 1 | 1 | 2 | 2 | 2 | 2 | 2 | 7 | 7 |
| 19456 | 0 | 0 | 0 | 0 | 0 | 0 | 1 | 1 | 1 | 1 | 1 | 1 | 1 | 1 | 2 | 2 | 2 | 2 | 7 | 7 |
| ... | | | | | | | | | | | | | | | | | | | | |
| 80896 | 0 | 0 | 0 | 0 | 0 | 0 | 0 | 0 | 1 | 1 | 1 | 1 | 1 | 1 | 1 | 1 | 2 | 2 | 7 | 7 |
| 81926 | 0 | 0 | 0 | 0 | 0 | 0 | 0 | 1 | 1 | 1 | 1 | 1 | 1 | 1 | 1 | 2 | 2 | 2 | 7 | 7 |

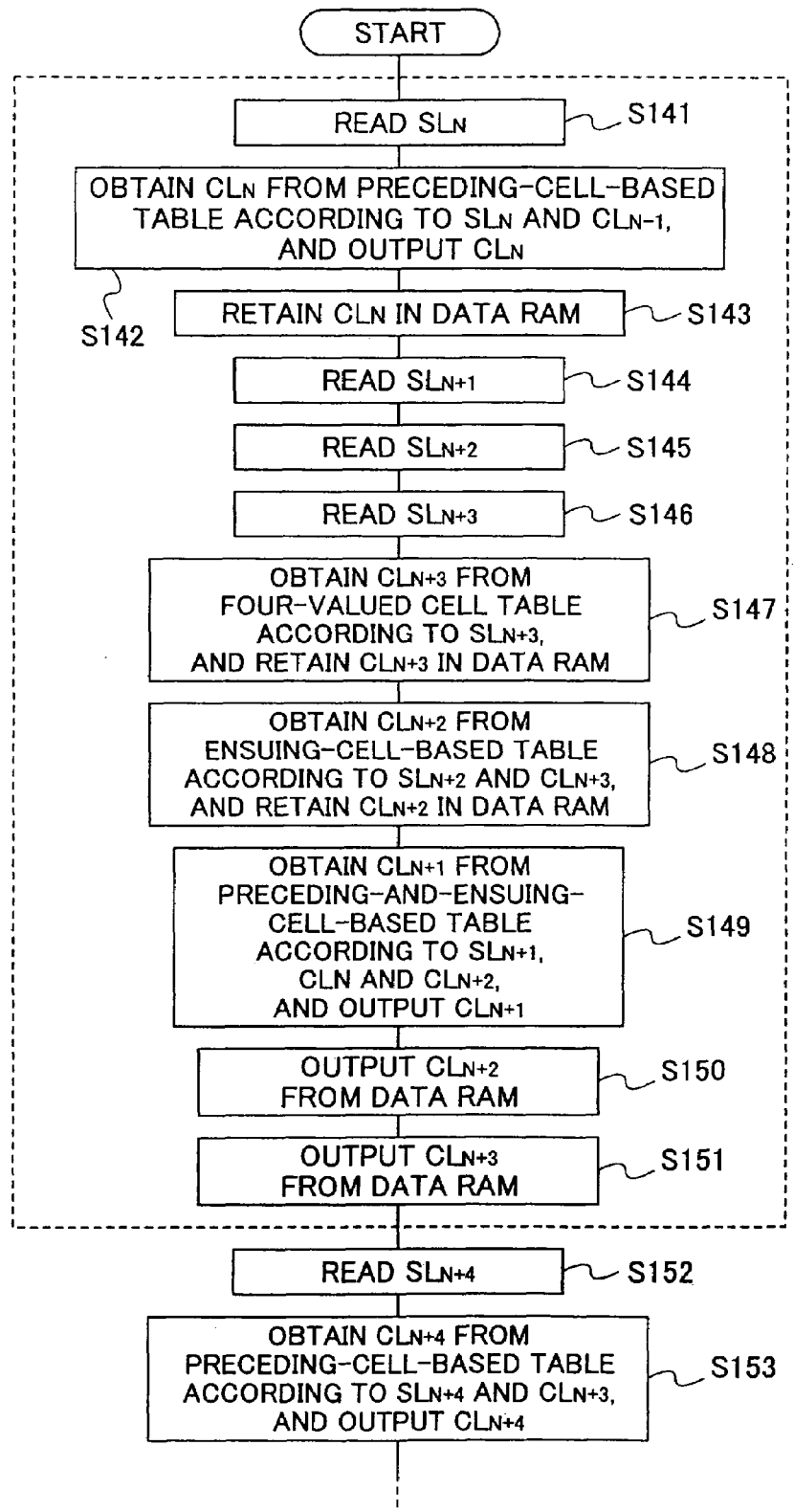

INFORMATION REPRODUCING METHOD JUDGING A MULTIVALUED LEVEL OF A PRESENT CELL BY REFERRING TO JUDGED MULTIVALUED LEVELS OF A PRECEDING CELL AND AN ENSUING CELL

This is a continuation of application Ser. No. 11/339,669, filed Jan. 26, 2006, which is a continuation of application Ser. No. 10/207,176, filed Jul. 30, 2002, now U.S. Pat. No. 7,082,091, the entire disclosures of which are incorporated herein by reference.

BACKGROUND OF THE INVENTION

1. Field of the Invention

The present invention generally relates to an information recording method, an information recording device, an information reproducing method, an information reproducing device, an information recording/reproducing device, and a recording medium, and more particularly, to an information recording method, an information recording device, an information reproducing method, an information reproducing device, an information recording/reproducing device, and a recording medium which deal with data having a mark representing information of a multivalued level recorded on a cell.

2. Description of the Related Art

Conventionally, in an optical disc, binary digital data is recorded on a spiral or concentric track, in such forms as uneven pits formed by embossing, etc. (on a ROM disc), holes formed in an inorganic/organic recording film (on a recordable (write-once) disc), differences between crystal conditions (on a phase change disc), or differences between magnetization directions (on a magneto-optical disc). Upon reproducing these recorded data, a laser beam is projected on the track, and differences in intensities of reflected lights therefrom or differences in polarization directions due to magnetic Kerr effects are detected so as to obtain a reproduction RF signal. Then, the obtained reproduction RF signal is processed according to a constant threshold value, for example, so as to detect the binary data.

For the purpose of increasing a recording density of information, a method of recording, not binary data, but ternary or further multivalued-level data, has been contrived; however, in an optical disc, a level fluctuation or an amplitude fluctuation occurs in a reproduction signal due to various factors, such as differences in reflectance among various types of optical discs, or differences in reproduction frequency characteristics between inner and outer tracks in one optical disc. Therefore, when a threshold value used in detecting multivalued-level data is constant, the reproduction signal is possibly detected at a wrong value. Especially, since multivalued-level data, such as three-valued or four-valued data, require a plurality of threshold values, the multivalued-level data is more likely to be detected incorrectly.

For the purpose of solving the above-described problems, Japanese Laid-Open Patent Application No. 5-54391 discloses as follows. A reproduction signal reproduced from a recording medium on which multivalued-level data is recorded is subjected to an A/D conversion according to a reference clock, and a signal level data obtained by this A/D conversion is compared with threshold values so as to detect the multivalued-level data; in this course, the signal level data obtained from the reproduction signal by the above-mentioned A/D conversion is stored in a memory means on a predetermined signal unit basis, and distribution information of the signal level data is obtained for each of the predetermined signal units stored in the memory means; then, this distribution information determines threshold values used for detecting the multivalued-level data from the signal level data in the present signal unit. Further, the above-mentioned course is based on a use of a format in which a proportion of level values of recorded data is fixed.

For example, on a predetermined signal unit basis, such as a reproduction signal in sector units in a recording format on an optical disc, a signal level data obtained from the reproduction signal by an A/D conversion is temporarily stored in a memory, and distribution information of occurrence frequencies thereof is obtained by using a CPU so as to obtain optimal threshold values as criteria for detecting multivalued-level data; and multivalued-level data is redetected from the stored signal level data by using the threshold values. Therefore, even when a level fluctuation or an amplitude fluctuation occurs in the reproduction signal, the multivalued-level data is less likely to be detected incorrectly so as to realize an accurate multi-value detection, which consequently promotes an increase in a recording density of recording data.

In Japanese Laid-Open Patent Application No. 5-54391, for the purpose of dealing with a fluctuation in a long period, such as a signal level fluctuation in inner and outer tracks of an optical disc, threshold values used for detecting multivalued-level data are optimized on an individual sector basis, for example. Additionally, a restriction is imposed on a format as a precondition so as to orderly separate multivalued-levels which include variations.

By the way, increasing a recording density of information necessitates, not only the use of multivalued data, but also a miniaturization of a unit of data recording/reproduction (hereinafter referred to as an "information cell" or simply a "cell"). When the information cell is so miniaturized that a plurality of information cells become encompassed within a reproduction light beam spot (see a description made later with reference to FIG. 1A to FIG. 1D), an output level of a reproduction signal of the information cell comes under influences of preceding and ensuing information cells such that output levels of reproduction signals corresponding to a same multivalued level shift (vary) depending on which multivalued level the preceding and ensuing information cells possess, as a result of which a variation (an expansion) of each of multi-valued levels becomes larger, apparently. Therefore, when compiled in a long period, such as a sector unit, distributions of adjacent multi-valued levels overlap one another. FIG. 2, details of which will be described hereinafter, shows an actual example of a level distribution of reproduction signals in a case where a multi-valued level (=eight-valued data level) is recorded in one information cell, and the reproduction light beam spot has a size encompassing three information cells. In this example, distributions overlap between levels 1 and 2, levels 2 and 3, and levels 4 and 5.

When applying a detecting method as disclosed in Japanese Laid-Open Patent Application No. 5-54391 to such a reproduction signal as described above, there is a problem that a level of an information cell is highly likely to be detected incorrectly due to the overlap of distributions, in whatever manner the threshold values are determined. Further, the restriction imposed on a degree of freedom regarding a format is also a problem.

SUMMARY OF THE INVENTION

It is a general object of the present invention to provide an improved and useful information recording method, an information recording device, an information reproducing method, an information reproducing device, an information recording/reproducing device, and a recording medium in which the above-mentioned problems are eliminated.

A more specific object of the present invention is to provide an information recording method, an information recording device, an information reproducing method, an information reproducing device, an information recording/reproducing device, and a recording medium which can reduce a likelihood of erroneously judging a multivalued level upon reproducing a cell in which information of the multivalued level is recorded, and furthermore, which can prevent influences of an erroneous judgment of a multivalued level from being propagated to other cells even when such an erroneous judgment occurs due to a defect and so forth.

Especially, an object of the present invention is to provide an information reproducing method, an information reproducing device, an information recording/reproducing device, and a recording medium which can prevent an erroneous judgment due to an inter-code interference between a present cell being processed and each of preceding and ensuing cells.

Further, an object of the present invention is to provide an information reproducing method, an information reproducing device, an information recording/reproducing device, and a recording medium which can perform an excellent multivalued level judgment by effectively utilizing a degree of an inter-code interference between a present cell being processed and each of preceding and ensuing cells.

In order to achieve the above-mentioned objects, there is provided according to one aspect of the present invention an information recording method for recording a mark representing information of a multivalued level on each of cells of an information recording medium, the method comprising the step of recording an M-valued mark on one cell in every predetermined number of cells so as to intervene between cells having N-valued marks, where N is an integer equal to or larger than 3, and M is an integer smaller than N.

According to the present invention, upon reproducing, at least a level of the M-valued mark can be judged without error. Therefore, the information recording method according to the present invention improves a reliability of reproducing multivalued information, compared to a uniform recording with N-valued marks.

Additionally, in the information recording method according to the present invention, N may be $2^T$ representing T-bit data, and M may be $2^{T-1}$ representing (T−1)-bit data having a lowest-order bit fixed at one of 0 and 1.

According to the present invention, N is set at 8, and M is set at 4, for example, so that the M-valued mark assumes thinned out levels compared to the N-valued mark, whereas the M-valued mark and the N-valued mark can be recorded according to a common marking system. Additionally, a level of the M-valued mark can be judged more correctly.

In order to achieve the above-mentioned objects, there is also provided according to another aspect of the present invention an information reproducing method for reproducing a multivalued level from a reproduction signal of a recording medium in which a mark representing information of the multivalued level is recorded on a cell, the method comprising, a judging step of judging a multivalued level of a present cell by referring to a judged multivalued level of at least one, i.e., both or either, of a preceding cell preceding the present cell and an ensuing cell ensuing the present cell.

According to the present invention, even when an output level of a reproduction signal is subjected to influences of marks recorded on preceding and/or ensuing cells, a multivalued level of a present cell can be judged with less probability of erroneous judgment by referring to judged multivalued levels of the preceding cell and/or the ensuing cell. This method involves no inconveniences, such as imposing a restriction on a format of the recording medium.

Additionally, the information reproducing method according to the present invention may comprise a re-judging step of selecting either of the judged multivalued levels of the preceding cell and the ensuing cell according to an amount of an inter-code interference from either of the preceding cell and the ensuing cell to the reproduction signal of the present cell so as to re-judge the multivalued level of the present cell by referring to the selected judged multivalued level.

According to the present invention, influences imposed by marks of preceding and ensuing cells on a multivalued-level judgment of a present cell are determined from magnitudes of inter-code interferences so as to switch judged multivalued levels to be used in re-judging the multivalued level of the present cell. Therefore, even when a reproduction signal is subjected to the influences of the marks recorded on the preceding and/or ensuing cells, the multivalued level of the present cell can be judged with less probability of erroneous judgment.

Additionally, the information reproducing method according to the present invention may comprise a step of determining the amount of the inter-code interference according to a result of a multivalued-level judgment performed by using a level of the reproduction signal deriving from each of the present cell, the preceding cell and the ensuing cell.

According to the present invention, amounts of inter-code interferences imposed from marks of preceding and ensuing cells to a multivalued-level judgment of a present cell are determined beforehand according to a result of a multivalued-level judgment performed by referring to the reproduction signal deriving from each of the cells. Therefore, a judged multivalued level to be referred to can be selected appropriately among the preceding cell and the ensuing cell so as to enhance a reliability of the multivalued-level judgment.

Additionally, in the information reproducing method according to the present invention, the re-judging step may re-judge the multivalued level of the present cell by referring to the judged multivalued level of the preceding cell when the amount of the inter-code interference from the preceding cell to the reproduction signal of the present cell is larger than the amount of the inter-code interference from the ensuing cell to the reproduction signal of the present cell.

According to the present invention, degrees of inter-code interferences are used effectively so as to appropriately select the judged multivalued level of the preceding cell, enhancing a reliability of the multivalued-level judgment.

Additionally, in the information reproducing method according to the present invention, the re-judging step may re-judge the multivalued level of the present cell by referring to the judged multivalued level of the ensuing cell when the amount of the inter-code interference from the preceding cell to the reproduction signal of the present cell is smaller than the amount of the inter-code interference from the ensuing cell to the reproduction signal of the present cell.

According to the present invention, degrees of inter-code interferences are used effectively so as to appropriately select the judged multivalued level of the ensuing cell, enhancing a reliability of the multivalued-level judgment.

Additionally, in the information reproducing method according to the present invention, the re-judging step may determine a judged multivalued level of the present cell to be either of Y1 and Y2, Y1 being a judged multivalued level of the present cell re-judged by referring to the judged multivalued level of the preceding cell, and Y2 being a judged multivalued level of the present cell re-judged by referring to the judged multivalued level of the ensuing cell, when the amount of the inter-code interference from the preceding cell to the reproduction signal of the present cell is substantially equal to the amount of the inter-code interference from the ensuing cell to the reproduction signal of the present cell, and the judged multivalued levels Y1 and Y2 coincide.

According to the present invention, degrees of inter-code interferences are used effectively so as to appropriately perform the multivalued-level judgment when the amounts of the inter-code interferences are substantially equal.

Additionally, the information reproducing method according to the present invention may comprise a step of comparing magnitudes of |y-y1| and |y-y2|, y1 being a learned level value of the reproduction signal estimated from a judged multivalued level Y1 of the present cell re-judged by referring to the judged multivalued level of the preceding cell, y2 being a learned level value of the reproduction signal estimated from a judged multivalued level Y2 of the present cell re-judged by referring to the judged multivalued level of the ensuing cell, and y being an actually measured level value of the reproduction signal of the present cell, in a case where the amount of the inter-code interference from the preceding cell to the reproduction signal of the present cell is substantially equal to the amount of the inter-code interference from the ensuing cell to the reproduction signal of the present cell, and the judged multivalued level Y1 and the judged multivalued level Y2 do not coincide, wherein the re-judging step determines a judged multivalued level of the present cell to be the judged multivalued level Y1 when |y-y1| is smaller than |y-y2|, and determines a judged multivalued level of the present cell to be the judged multivalued level Y2 when |y-y1| is larger than |y-y2|.

According to the present invention, amounts of inter-code interferences imposed from marks of preceding and ensuing cells to a judged level of a mark of a present cell are determined by comparing errors between signal values estimated according to learned results and an actually measured value. Therefore, even when results are vague in determining amounts of the inter-code interferences according to a judged value obtained by performing a multivalued-level judgment based on the reproduction signal deriving from each of the cells, a multivalued level of the mark of the present cell can be judged appropriately so as to enhance a reliability of the multivalued-level judgment.

Additionally, the information reproducing method according to the present invention may comprise a step of determining the amount of the intet-code interference by comparing a learned level value y1 of the reproduction signal estimated from a judged multivalued level Y1 of the present cell re-judged by referring to the judged multivalued level of the preceding cell, a learned level value y2 of the reproduction signal estimated from a judged multivalued level Y2 of the present cell re-judged by referring to the judged multivalued level of the ensuing cell, and an actually measured level value y of the reproduction signal of the present cell, after performing a multivalued-level judgment by using a level of the reproduction signal deriving from each of the present cell, the preceding cell and the ensuing cell.

According to the present invention, a result of comparing errors between signal values estimated according to learned results and an actually measured value is used in determining amounts of inter-code interferences imposed from marks of preceding and ensuing cells to a multivalued-level judgment of a present cell. Therefore, a judged multivalued level to be referred to can be selected appropriately among the preceding cell and the ensuing cell so as to enhance a reliability of the multivalued-level judgment.

Additionally, in the information reproducing method according to the present invention, the re-judging step may determine a judged multivalued level of the present cell to be the judged multivalued level Y1 when |y-y1| is smaller than |y-y2|, and may determine a judged multivalued level of the present cell to be the judged multivalued level Y2 when |y-y1| is larger than |y-y2|, according to a result of comparing magnitudes of |y-y1| and |y-y2|.

According to the present invention, degrees of inter-code interferences are used effectively so as to appropriately determine a judged multivalued level of a present cell, enhancing a reliability of the multivalued-level judgment.

Additionally, in the information reproducing method according to the present invention, a judged multivalued level of the present cell is used for judging multivalued levels of ensuing cells when the judged multivalued level of the present cell is rewritten.

According to the present invention, a result of re-judging a multivalued level of a present cell is fed back to multivalued-level judgments of ensuing cells so as to increase a reliability of results of determining amounts of inter-code interferences imposed from marks of preceding and ensuing cells to a judged level of a mark of the present cell, enhancing a reliability of the multivalued-level judgments.

Additionally, the information reproducing method according to the present invention may comprise a reproducing step of reproducing learned pattern information of known multivalued levels from the recording medium in which all combination patterns of a group of three marks are recorded beforehand as the learned pattern information, and a creating step of creating at least one criterion table according to level-value information of the reproduction signal obtained from the learned pattern information, wherein the criterion table is used for judging the multivalued level of the present cell.

According to the present invention, a multivalued level of a present cell is judged by using the criterion tables created according to level-value information of a reproduction signal obtained from the learned pattern information; thereby, the above-described information reproducing method according to the present invention can be realized with ease. Additionally, the criterion tables are created according to results of statistical processing applied to the learned pattern information of known multivalued levels reproduced from information area in which the learned pattern information is recorded beforehand. Thereby, disturbances, such as fluctuations in write/read optical powers and a distortion of a medium substrate, can be learned so as to create the criterion tables enabling a correction of erroneous judgment due to these disturbances.

Additionally, in the information reproducing method according to the present invention, the creating step may create a present-cell judgment table, a preceding-cell reference table and an ensuing-cell reference table as the criterion tables.

According to the present invention, the present-cell judgment table, the preceding-cell reference table and the ensuing-cell reference table are used as the criterion tables so as to appropriately determine factors, such as amounts of inter-code interferences, which consequently enhances a reliability of the multivalued-level judgment.

Additionally, in the information reproducing method according to the present invention, the creating step may create the present-cell judgment table according to a process ignoring level values of the preceding cell and the ensuing cell among the level-value information of the reproduction signal obtained from the learned pattern information, may create the preceding-cell reference table according to a process ignoring a level value of the ensuing cell among the level-value information of the reproduction signal obtained from the learned pattern information, and may create the ensuing-cell reference table according to a process ignoring a level value of the preceding cell among the level-value information of the reproduction signal obtained from the learned pattern information.

According to the present invention, the criterion tables can be created according to as few processes as possible.

In order to achieve the above-mentioned objects, there is also provided according to another aspect of the present invention an information reproducing method for reproducing a multivalued level from a reproduction signal of an information recording medium in which a mark representing information of the multivalued level is recorded on each of cells so that an M-valued mark is recorded on one cell in every predetermined number of cells so as to intervene between cells having N-valued marks, where N is an integer equal to or larger than 3, and M is an integer smaller than N, the method comprising the step of switching numbers of multivalued judgment levels between N and M with each predetermined number of the cells so as to judge a multivalued level of a present cell having one of the N-valued mark and the M-valued mark.

According to the present invention, upon reproducing, at least a level of the M-valued mark can be judged without error.

Additionally, in the information reproducing method according to the present invention, the multivalued level of the present cell having the M-valued mark may be judged by switching the number of the multivalued judgment levels to M so that the multivalued level of the present cell is judged according to the reproduction signal of the present cell alone.

According to the present invention, the multivalued level of the present cell having the M-valued mark that has a smaller number of levels than the N-valued mark can be determined uniformly according to the reproduction signal of the present cell alone.

Additionally, in the information reproducing method according to the present invention, the multivalued level of the present cell having the N-valued mark may be judged by switching the number of the multivalued judgment levels to N so that the multivalued level of the present cell is judged according to criteria determined by referring to a judged multivalued level of a preceding cell preceding the present cell.

According to the present invention, even when an output level of the reproduction signal of the present cell is subjected to an influence of the preceding cell, the multivalued level of the present cell can be prevented from being judged incorrectly. Additionally, as for the M-valued mark recorded on one cell in every predetermined number of cells, a multivalued level of the cell having the M-valued mark can be judged without error according to the reproduction signal of the cell alone. Therefore, a propagation of a level judgment error occurring due to a defect and so forth can be stopped at each cell having the M-valued mark so as to prevent successive reproduction errors.

Additionally, in the information reproducing method according to the present invention, the multivalued level of the present cell having the N-valued mark may be judged by switching the number of the multivalued judgment levels to N so that the multivalued level of the present cell is judged according to criteria determined by referring to a judged multivalued level of an ensuing cell ensuing the present cell.

According to the present invention, even when an output level of the reproduction signal of the present cell is subjected to an influence of the ensuing cell, the multivalued level of the present cell can be prevented from being judged incorrectly. Additionally, as for the M-valued mark recorded on one cell in every predetermined number of cells, a multivalued level of the cell having the M-valued mark can be judged without error according to the reproduction signal of the cell alone. Therefore, a propagation of a level judgment error occurring due to a defect and so forth can be stopped at each cell having the M-valued mark so as to prevent successive reproduction errors.

Additionally, in the information reproducing method according to the present invention, the multivalued level of the present cell having the N-valued mark may be judged by switching the number of the multivalued judgment levels to N so that the multivalued level of the present cell is judged according to criteria determined by referring to judged multivalued levels of a preceding cell preceding the present cell and an ensuing cell ensuing the present cell.

According to the present invention, even when an output level of the reproduction signal of the present cell is subjected to influences of the preceding cell and the ensuing cell, the multivalued level of the present cell can be prevented from being judged incorrectly. Additionally, as for the M-valued mark recorded on one cell in every predetermined number of cells, a multivalued level of the cell having the M-valued mark can be judged without error according to the reproduction signal of the cell alone. Therefore, a propagation of a level judgment error occurring due to a defect and so forth can be stopped at each cell having the M-valued mark so as to prevent successive reproduction errors.

Additionally, in the information reproducing method according to the present invention, the multivalued level of the present cell having the N-valued mark may be judged by switching the number of the multivalued judgment levels to N so that the multivalued level of the present cell ensuing a cell having the M-valued mark is judged according to criteria determined by referring to a judged multivalued level of the cell having the M-valued mark preceding the present cell, and that the multivalued level of the present cell preceding a cell having the M-valued mark is judged according to criteria determined by referring to a judged multivalued level of the cell having the M-valued mark ensuing the present cell, when the predetermined number of the cells is three.

According to the present invention, when the M-valued mark is recorded on one cell in every three cells, the present cell having the N-valued mark is adjacent to either of the preceding cell having the M-valued mark and the ensuing cell having the M-valued mark. Accordingly, the multivalued level of the present cell can be judged more appropriately by referring to a judged multivalued level of either of the preceding cell and the ensuing cell.

Additionally, in the information reproducing method according to the present invention, the multivalued level of the present cell having the N-valued mark may be judged by switching the number of the multivalued judgment levels to N so that the multivalued level of the present cell ensuing a cell having the M-valued mark is judged according to criteria determined by referring to a judged multivalued level of the cell having the M-valued mark preceding the present cell, that the multivalued level of the present cell preceding a cell having the M-valued mark is judged according to criteria determined by referring to a judged multivalued level of the cell having the M-valued mark ensuing the present cell, and that the multivalued level of the present cell not adjacent to a cell having the M-valued mark is judged according to criteria determined by referring to judged multivalued levels of a preceding cell preceding the present cell and an ensuing cell ensuing the present cell, when the predetermined number of the cells is four.

According to the present invention, when the M-valued mark is recorded on one cell in every four cells, the present cell having the N-valued mark is adjacent to either of the preceding cell having the M-valued mark and the ensuing cell having the M-valued mark, or is adjacent to neither the preceding cell having the M-valued mark nor the ensuing cell having the M-valued mark. Accordingly, the multivalued level of the present cell adjacent to either of the preceding cell having the M-valued mark and the ensuing cell having the M-valued mark can be judged more appropriately by referring to a judged multivalued level of either of the preceding cell and the ensuing cell; the multivalued level of the intermediate cell adjacent to neither the preceding cell having the M-valued mark nor the ensuing cell having the M-valued mark can be judged more appropriately by referring to judged multivalued levels of a preceding cell preceding the intermediate cell and an ensuing cell ensuing the intermediate cell.

In order to achieve the above-mentioned objects, there is also provided according to another aspect of the present invention an information reproducing device reproducing a multivalued level from a reproduction signal of a recording medium in which a mark representing information of the multivalued level is recorded on a cell, the device comprising, an A/D converting unit converting the reproduction signal into digital data, a multivalued level data retaining unit retaining multivalued level data of a preceding cell preceding a present cell, a judging-criteria changing unit changing criteria for judging a multivalued level of the present cell according to individual multivalued levels of the preceding cell, and an operation unit determining multivalued level data of the present cell according to the criteria changed by the judging-criteria changing unit based on the digital data converted by the A/D converting unit and the multivalued level data of the preceding cell retained by the multivalued level data retaining unit.

According to the present invention, even when an output level of a reproduction signal is subjected to an influence of a mark recorded on a preceding cell, a multivalued level of a present cell can be judged with less probability of erroneous judgment by changing criteria for judging the multivalued level of the present cell according to a multivalued level of the preceding cell.

In order to achieve the above-mentioned objects, there is also provided according to another aspect of the present invention an information reproducing device reproducing a multivalued level from a reproduction signal of a recording medium in which a mark representing information of the multivalued level is recorded on a cell, the device comprising an A/D converting unit converting the reproduction signal into digital data, a digital-data retaining unit retaining the digital data converted by the A/D converting unit, an ensuing cell level operation unit determining multivalued level data of an ensuing cell ensuing a present cell prior to determining multivalued level data of the present cell, a judging-criteria changing unit changing criteria for judging a multivalued level of the present cell according to individual multivalued levels of the ensuing cell, and an operation unit determining the multivalued level data of the present cell according to the criteria changed by the judging-criteria changing unit based on the digital data retained by the digital-data retaining unit and the multivalued level data of the ensuing cell determined by the ensuing cell level operation unit.

According to the present invention, even when an output level of a reproduction signal is subjected to an influence of a mark recorded on an ensuing cell, a multivalued level of a present cell can be judged with less probability of erroneous judgment by changing criteria for judging the multivalued level of the present cell according to a multivalued level of the ensuing cell.

In order to achieve the above-mentioned objects, there is also provided according to another aspect of the present invention an information reproducing device reproducing a multivalued level from a reproduction signal of a recording medium in which a mark representing information of the multivalued level is recorded on a cell, the device comprising, an A/D converting unit converting the reproduction signal into digital data, a digital-data retaining unit retaining the digital data converted by the A/D converting unit, a multivalued level data retaining unit retaining multivalued level data of a preceding cell preceding a present cell, an ensuing cell level operation unit determining multivalued level data of an ensuing cell ensuing the present cell prior to determining multivalued level data of the present cell, a judging-criteria changing unit changing criteria for judging a multivalued level of the present cell according to individual multivalued levels of the preceding cell and the ensuing cell, and an operation unit determining multivalued level data of the present cell according to the criteria changed by the judging-criteria changing unit based on the digital data retained by the digital-data retaining unit, the multivalued level data of the preceding cell retained by the multivalued level data retaining unit, and the multivalued level data of the ensuing cell determined by the ensuing cell level operation unit.

According to the present invention, even when an output level of a reproduction signal is subjected to influences of marks recorded on preceding and ensuing cells, a multivalued level of a present cell can be judged with less probability of erroneous judgment by changing criteria for judging the multivalued level of the present cell according to multivalued levels of the preceding and ensuing cells.

In order to achieve the above-mentioned objects, there is also provided according to another aspect of the present invention an information reproducing device reproducing a multivalued level from a reproduction signal of a recording medium in which a mark representing information of the multivalued level is recorded on a cell, the device comprising, an A/D converting unit converting the reproduction signal into digital data, a digital-data retaining unit retaining the digital data, a primary operation unit judging a multivalued level of the digital data according to the reproduction signal deriving only from the mark of a present cell, a judged-value retaining unit temporarily retaining the judged multivalued level judged by the primary operation unit, an ensuing cell level operation unit determining a multivalued level of an ensuing cell ensuing the present cell prior to re-judging the multivalued level of the present cell, a reference judged value selecting unit selecting either of the judged multivalued levels of a preceding cell preceding the present cell and the ensuing cell according to an amount of an inter-code interference from either of the preceding cell and the ensuing cell to the reproduction signal of the present cell, and a re-judgment operation unit re-judging the multivalued level of the present cell by referring to the judged multivalued level selected by the reference judged value selecting unit.

According to the present invention, influences imposed by marks of preceding and ensuing cells on a multivalued-level judgment of a present cell are determined from magnitudes of inter-code interferences so as to switch judged multivalued levels to be used by the re-judgment operation unit in re-judging the multivalued level of the present cell. Therefore, even when a reproduction signal is subjected to the influences of the marks recorded on the preceding and ensuing cells, the multivalued level of the present cell can be judged with less probability of erroneous judgment.

In order to achieve the above-mentioned objects, there is also provided according to another aspect of the present invention an information recording and reproducing device reproducing a multivalued level from a reproduction signal of a writable recording medium in which a mark representing information of the multivalued level is recorded on a cell, the device comprising, an A/D converting unit converting the reproduction signal into digital data, a digital-data retaining unit retaining the digital data, a primary operation unit judging a multivalued level of the digital data according to the reproduction signal deriving only from the mark of a present cell, a judged-value retaining unit temporarily retaining the judged multivalued level judged by the primary operation unit, an ensuing cell level operation unit determining a multivalued level of an ensuing cell ensuing the present cell prior to re-judging the multivalued level of the present cell, a reference judged value selecting unit selecting either of the judged multivalued levels of a preceding cell preceding the present cell and the ensuing cell according to an amount of an inter-code interference from either of the preceding cell and the ensuing cell to the reproduction signal of the present cell, a re-judgment operation unit re-judging the multivalued level of the present cell by referring to the judged multivalued level selected by the reference judged value selecting unit, a learned-pattern recording unit recording all combination patterns of a group of three marks as learned pattern information of known multivalued levels in the recording medium, a learning unit reproducing the learned pattern information from the recording medium, and a criterion-table creating unit creating at least one criterion table according to level-value information of the reproduction signal obtained from the learned pattern information by the learning unit, the criterion table being used for judging the multivalued level of the present cell.

According to the present invention, a multivalued level of a present cell is judged by using the criterion tables created according to level-value information of a reproduction signal obtained from the learned pattern information; thereby, the above-described information recording and reproducing device according to the present invention can be realized with ease. Additionally, the criterion tables are created according to results of statistical processing applied to the learned pattern information of known multivalued levels reproduced from the recording medium in which the learned pattern information is actually recorded by the information recording and reproducing device beforehand. Thereby, disturbances, such as fluctuations in write/read optical powers and a distortion of a medium substrate, can be learned so as to create the criterion tables enabling a correction of erroneous judgment due to these disturbances.

Additionally, in the information recording and reproducing device according to the present invention, the learned-pattern recording unit may record all the combination patterns outside a user data area in the recording medium.

According to the present invention, the learned pattern information of known multivalued levels can be recorded actually in the recording medium without affecting a user data area so that the learned pattern information is used in creating the criterion tables.

In order to achieve the above-mentioned objects, there is also provided according to another aspect of the present invention a recording medium in which a mark representing information of a multivalued level is recorded on a cell, wherein all combination patterns of a group of three marks are recorded beforehand as learned pattern information of known multivalued levels so as to be used for creating at least one criterion table used for judging the multivalued level.

According to the present invention, all combination patterns of a group of three marks are recorded beforehand as learned pattern information of known multivalued levels in the so-called read-only recording medium. By reproducing this learned pattern information from the recording medium, disturbances, such as fluctuations in write/read optical powers and a distortion of a medium substrate, can be learned so as to create the criterion tables enabling a correction of erroneous judgment due to these disturbances, as a result of which the criterion tables can be used appropriately in the multivalued-level judgment.

In order to achieve the above-mentioned objects, there is also provided according to another aspect of the present invention a recording medium in which a mark representing information of a multivalued level is recorded on a cell, the recording medium comprising, a learned pattern information area in which all combination patterns of a group of three marks are recorded beforehand as learned pattern information of known multivalued levels so as to be used for creating at least one criterion table used for judging the multivalued level, the learned pattern information area being located outside a user data area.

According to the present invention, the so-called recordable recording medium includes a learned pattern information area in which all combination patterns of a group of three marks are recorded beforehand as learned pattern information of known multivalued levels. By recording the learned pattern information in this learned pattern information area, and thereafter reproducing this learned pattern information therefrom, disturbances, such as fluctuations in write/read optical powers and a distortion of a medium substrate, can be learned so as to create the criterion tables enabling a correction of erroneous judgment due to these disturbances, as a result of which the criterion tables can be used appropriately in the multivalued-level judgment.

Other objects, features and advantages of the present invention will become more apparent from the following detailed description when read in conjunction with the accompanying drawings.

BRIEF DESCRIPTION OF THE DRAWINGS

FIG. 1A to FIG. 1D are explanatory diagrams of an example of an information recording/reproducing method, including mark forms and a reproduction signal, for the purpose of explaining principles of embodiments according to the present invention;

FIG. 9 is an explanatory diagram illustrating an example of data in a table RAM shown in FIG. 8;

FIG. 12 is an explanatory diagram illustrating a present-cell judgment table and a creating method thereof;

FIG. 13A is an explanatory diagram illustrating a present-cell judgment table regarding a cell having four even-number values;

FIG. 13B is an explanatory diagram illustrating a present-cell judgment table regarding a cell having four odd-number values;

FIG. 14 is an explanatory diagram illustrating a preceding-cell reference table and a creating method thereof;

FIG. 15A is an explanatory diagram illustrating a preceding-cell reference table regarding a cell having four even-number values;

FIG. 15B is an explanatory diagram illustrating a preceding-cell reference table regarding a cell having four odd-number values;

FIG. 16 is an explanatory diagram illustrating an ensuing-cell reference table and a creating method thereof;

FIG. 17A is an explanatory diagram illustrating an ensuing-cell reference table regarding a cell having four even-number values;

FIG. 17B is an explanatory diagram illustrating an ensuing-cell reference table regarding a cell having four odd-number values;

FIG. 21 is an explanatory diagram illustrating a three-successive-recording-mark learned table and a data extracting method thereof according to a fourth embodiment of the present invention;

FIG. 26 is an explanatory diagram illustrating an error sum algorithm thereof;

FIG. 27 is a flowchart outlining an example of a process of judging a multivalued level;

FIG. 30 is an explanatory diagram illustrating an example of data in a table RAM shown in FIG. 29;

FIG. 34A and FIG. 34B are explanatory diagrams illustrating an example of data in table RAMs shown in FIG. 33;

FIG. 38 is an explanatory diagram illustrating an example of data in a table RAM shown in FIG. 37;

FIG. 41 is an explanatory diagram illustrating an example of data in a table RAM according to a ninth embodiment of the present invention;

FIG. 44 is an explanatory diagram illustrating an example of data in a table RAM according to a tenth embodiment of the present invention;

FIG. 46 is a flowchart of the example of the information reproducing process according to the tenth embodiment of the present invention.

DETAILED DESCRIPTION OF THE PREFERRED EMBODIMENTS

Figure 2:
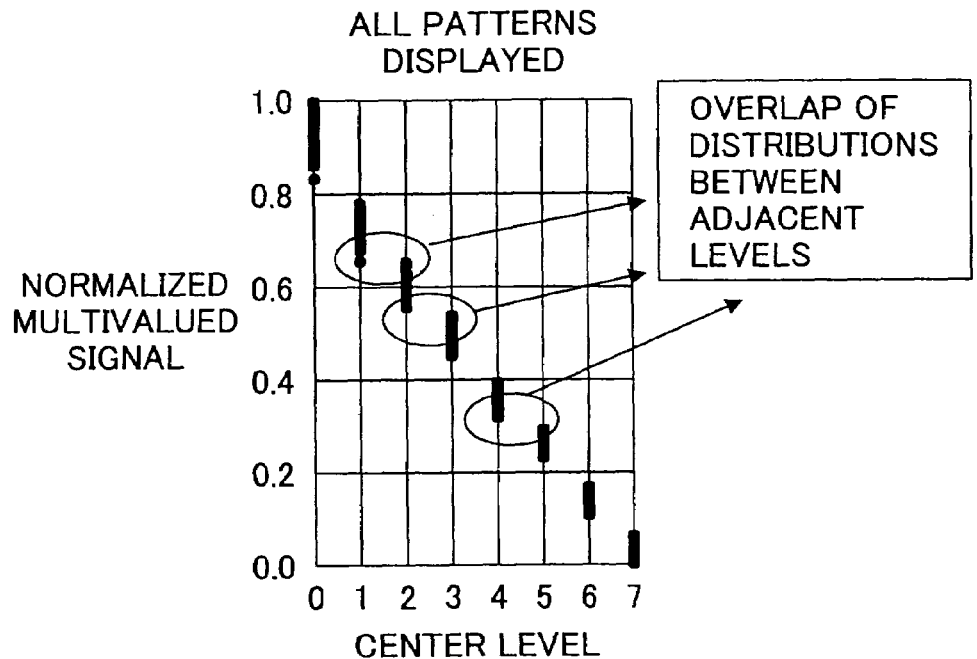
FIG. 2 is a characteristic diagram representing a change of level of a present cell caused by influences of preceding and ensuing cells.

A description will now be given, with reference to the drawings, of principles of embodiments according to the present invention.

FIG. 1A to FIG. 1D are explanatory diagrams of an example of an information recording/reproducing method according to the present invention. A tracking groove is formed on a surface of an information recording medium. A recording material allowing information recorded thereon to be erased is applied also on the information recording medium. Information is recorded as marks at predetermined time intervals on the recording medium. An area corresponding to each of the predetermined time intervals is a unit of a multivalued information recording/reproduction referred to as an information cell (or simply, a cell) 1. For example, when an information recording film composed of phase change (PC) material is used as the recording-erasable recording materials a laser light is projected on this cell 1, and amounts and timings of a recording light and an erasing light are adjusted so as to change forms of the recording marks into recording marks at a plurality of reproduction levels. FIG. 1A illustrates an example where the cells 1 are recorded so as to have eight (=N) values at multivalued levels ranging from level 0 with no recording mark to level 7 with a largest recording mark. Each of the cells 1 includes 3-bit (=T-bit) information, because of ($8=2^3$: $N=2^T$, $T=3$). Reproducing the multivalued levels of the cells 1 as recorded results in a recording capacity three times as large as a normal optical disc on which 2-bit information is recorded. Besides, in order to increase the recording capacity, each of the cells 1 needs to be made smaller. When each of the cells 1 is made smaller, marks of two to three cells 1 become encompassed within a diameter of a reproducing beam, as shown in FIG. 1A.

Additionally, other than the phase change (PC) recording film, an information recording film composed of magneto-optical (MO) material can be used as the above-mentioned recording-erasable recording material. In this case, an associated operation of a magnetic field applied from a magnetic head (not shown in the figure) with the above-mentioned laser light changes the forms of the recording marks into the recording marks at a plurality of the reproduction levels. Further, a non-erasable recording material allowing information to be only recorded and reproduced is also applicable. An organic dye or a metal film can be used as the non-erasable recording material. In this case, a laser light is projected on the cell, and an amount and a timing of a recording light are adjusted so as to change the forms of the recording marks into the recording marks at a plurality of the reproduction levels. Also, in a read-only recording medium used only for reproduction, recording marks can be formed on a substrate as uneven forms referred to as phase pits. In this case, a multi-valued-level recording can be performed by modulating an area or an optical depth of each of the phase pits.

Based on such multivalued-level recordings as described above, the principles of the embodiments according to the present invention will be described hereinbelow by taking the case using the phase change recording film, as an example.

Here, an actual example of multi-value recording/reproduction will be described. In this example, the multi-value recording/reproduction is realized by a rewritable-DVD recording device used in general. A recording/reproducing wavelength λ is 650 nm; a numerical aperture (NA) of an objective lens is 0.65. A diameter of a light converged on an optical information recording medium (a recording medium) is approximately 0.8 μm. A rewritable type of a phase change material AgInSbTe is used as the optical information recording medium. Recording marks are formed on a groove. An interval (a track pitch) between adjacent grooves is 0.74 μm. A width of the groove is approximately 0.4 μm. A linear velocity of recording/reproducing is approximately 3.5 m/s. A length of the cell 1 in a circumferential direction of the disc is approximately 0.6 μm. An erase power is set 0.5 to 0.6 times as much as a record (write) power. The number (N) of levels of multivalued information is set at 8.

First, FIG. 2 shows a result of recording and reproducing random information. In FIG. 2, the axis of ordinates represents a normalized multivalued signal which is obtained by normalizing a reproduction level at the center of each cell 1 by a difference between a level (max) of a highest reflectance with no recording mark and a level (min) at which a mark is so recorded that a catoptric amount becomes lowest. Assuming that RF represents a reproduction signal, the normalized multivalued signal can be expressed as follows.

$$(\text{Normalized multivalued signal}) = (RF - \text{min})/(\text{max} - \text{min}) \quad (1)$$

According to the result shown in FIG. 2, the reproduction (reproduced) signal does not perfectly represent one of the eight values. Therefore, upon judging a level of the reproduction signal from level 0 to level 7, there may occur an instance where the reproduction signal is reproduced at level 2, despite having been recorded at level 1, for example. This level-judgment error is originated from an inter-code interference phenomenon caused by recording marks of the preceding and ensuing cells 1 being encompassed within the reproducing beam, resulting in the reproduction level of the present cell 1 being varied according as sizes of the recording marks of the preceding and ensuing cells 1.

Figure 3:
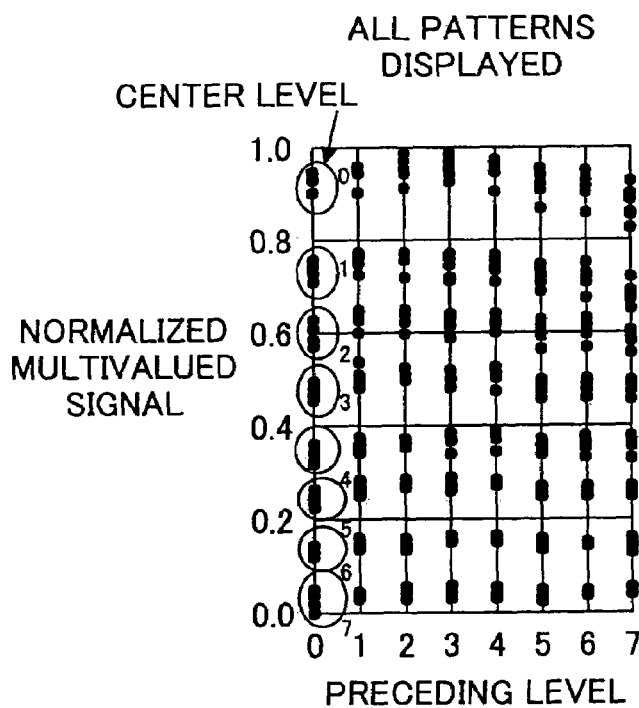
FIG. 3 is a characteristic diagram representing a change of level of the present cell according as a level of a preceding cell.

By contrast, in FIG. 3, the data shown in FIG. 2 is divided according to known multivalued levels of the preceding cell (represented by the axis of abscissas in FIG. 3: preceding levels). FIG. 3 illustrates how the reproduction level of the present cell is varied according as the preceding levels. According to the result shown in FIG. 2, a multivalued level cannot be determined uniquely from the reproduction signal. However, by learning relationships between multivalued levels of the preceding cell and multivalued levels of the present cell beforehand, storing the relationships as criteria for judging multivalued levels, and dividing the relationships according to the preceding levels of the preceding cell, a multivalued level of the present cell can be determined uniquely. A "first principle" of the present invention uses this principle: by "preparing criteria for judging multivalued levels of a present cell according to multivalued-level data of a preceding cell, and switching the criteria for judging the present cell after judging a multivalued level of the preceding cell so as to judge a multivalued level of the present cell," the level-judgment error originated from the inter-code interference phenomenon occurring in the state as shown in FIG. 2 can be prevented.

Figure 4:
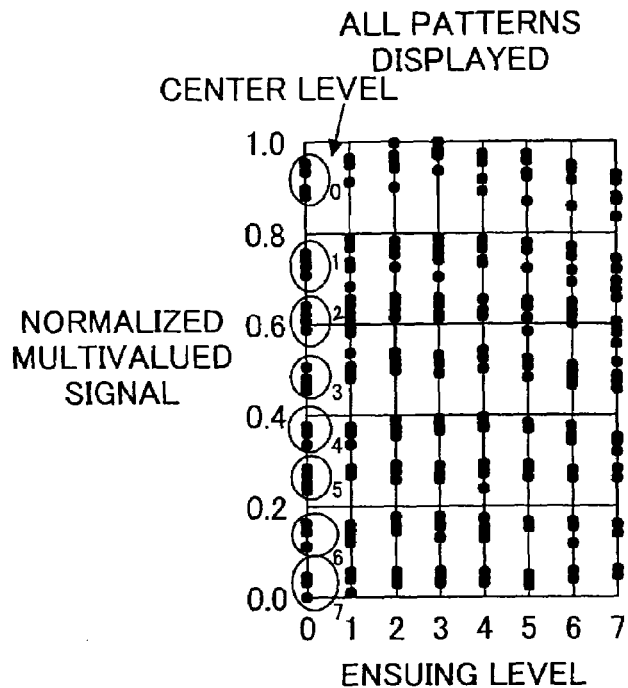
FIG. 4 is a characteristic diagram representing a change of level of the present cell according as a level of an ensuing cell.

Similarly, in FIG. 4, the data shown in FIG. 2 is divided according to multivalued levels of the ensuing cell (represented by the axis of abscissas in FIG. 4: ensuing levels). FIG. 4 illustrates how the reproduction level of the present cell is varied according as the ensuing levels. By learning relationships between multivalued levels of the ensuing cell and multivalued levels of the present cell beforehand, storing the relationships as criteria for judging multivalued levels, and dividing the relationships according to the ensuing levels of the ensuing cell, a multivalued level of the present cell can be determined uniquely. A "second principle" of the present invention uses this principle: by "preparing criteria for judging multivalued levels of a present cell according to multivalued-level data of an ensuing cell, and switching the criteria for judging the present cell after judging a multivalued level of the ensuing cell so as to judge a multivalued level of the present cell," the level-judgment error originated from the inter-code interference phenomenon occurring in the state as shown in FIG. 2 can be prevented.

Figure 5:
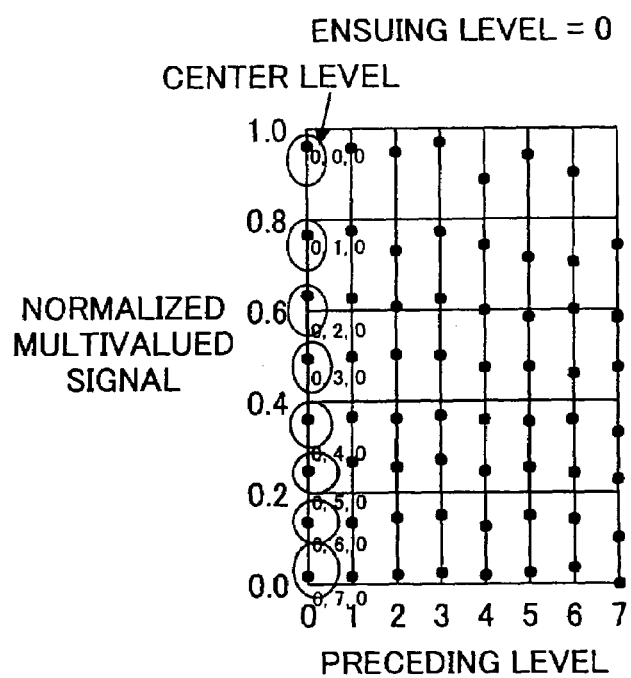
FIG. 5 is a characteristic diagram representing a change of level of the present cell according as levels of the preceding cell and the ensuing cell.

Further, when multivalued levels of the preceding and ensuing cells preceding and ensuing the present cell are learned respectively, levels of the multivalued reproduction signal are not spread, as shown in FIG. 5; thus, a multivalued level can be determined uniquely from the reproduction signal. It is noted that FIG. 5 shows multivalued levels of the present cell when the ensuing level is zero, and the preceding levels range from 0 to 7. A "third principle" of the present invention uses this principle: by "preparing criteria for judging multivalued levels of a present cell according to multivalued-level data of preceding and ensuing cells, and switching the criteria for judging the present cell after judging a cell level of the preceding cell and a cell level of the ensuing cell so as to judge a multivalued level of the present cell," the level-judgment error originated from the inter-code interference phenomenon occurring in the state as shown in FIG. 2 can be prevented. In other words, the third principle of the present invention is a combination of the first principle and the second principle of the present invention.

Table 1 below shows results of level judgments actually performed based on the reviews of the criteria for judging multivalued levels according to the first to third principles of the present invention. In No. 2 and No. 8, levels of the present cell are judged to be "0" according to reproduction signal values of the present cell, which are erroneous judgments in light of correct levels "1". However, by referring to values in a preceding-level table including criteria for judging multivalued levels according to levels of the preceding cell, or by referring to values in an ensuing-level table including criteria for judging multivalued levels according to levels of the ensuing cell, the levels of e present cell are judged to be "1" in No. 2 and No. 8, which are correct judgments.

① It is under a relationship of (X>Z) that a level of Y is judged correctly at a high probability by referring to the preceding-level table.

② It is under a relationship of (X<Z) that a level of Y is judged correctly at a high probability by referring to the ensuing-level table.

It is noted that each of multivalued levels represented by X, Y and Z becomes larger as an area of a mark recorded on the cell 1 becomes larger. In No. 25 in Table 1, (X, Y, Z) is (2, 2, 7), which satisfies the relationship of (X<Z), corresponding to the case ②. In this case, the level judged by referring to the ensuing-level table is "2" which is correct; thus, a multivalued-level judgment correctly judging the level of the present cell can be selected. This constitutes a "fourth principle" of the present invention. This phenomenon is governed by the principle that "one of a preceding cell and an ensuing cell that includes a recording mark having a larger area poses a larger amount of inter-code interference manifested as an optical influence on a present cell."

Next, a description will be given of a principle of a level judgment under a relationship other than the relationships set

TABLE 1

| No. | Correct level | Normalized reproduction signal | Present cell | | Preceding-level table | | Ensuing-level table | | Error judgment | |
|---|---|---|---|---|---|---|---|---|---|---|
| | | | Value | Judgment | Value | Judgment | Value | Judgment | Value | Judgment |
| 1 | 4 | 0.37545 | 4 | | 4 | | 4 | | 4 | |
| 2 | 1 | 0.84738 | 0 | err | 1 | | 1 | | 1 | |
| 3 | 2 | 0.61683 | 2 | | 2 | | 2 | | 2 | |
| 4 | 4 | 0.33477 | 4 | | 4 | | 4 | | 4 | |
| 5 | 7 | 0.05081 | 7 | | 7 | | 7 | | 7 | |
| 6 | 0 | 0.88015 | 0 | | 0 | | 0 | | 0 | |
| 7 | 5 | 0.24922 | 5 | | 5 | | 5 | | 5 | |
| 8 | 1 | 0.84841 | 0 | err | 1 | | 1 | | 1 | |
| 9 | 2 | 0.67702 | 2 | | 2 | | 2 | | 2 | |
| 10 | 0 | 0.95384 | 0 | | 0 | | 0 | | 0 | |
| 11 | 0 | 0.95784 | 0 | | 0 | | 0 | | 0 | |
| 12 | 2 | 0.65826 | 2 | | 2 | | 2 | | 2 | |
| 13 | 2 | 0.68140 | 2 | | 2 | | 2 | | 2 | |
| 14 | 2 | 0.61079 | 2 | | 2 | | 2 | | 2 | |
| 15 | 6 | 0.14009 | 6 | | 6 | | 6 | | 6 | |
| 16 | 4 | 0.36896 | 4 | | 4 | | 4 | | 4 | |
| 23 | 5 | 0.25405 | 5 | | 5 | | 5 | | 5 | |
| 24 | 2 | 0.66783 | 2 | | 2 | | 2 | | 2 | |
| 25 | 2 | 0.58196 | 3 | err | 3 | err | 2 | | 2 | |
| 26 | 7 | 0.06542 | 7 | | 7 | | 7 | | 7 | |
| 27 | 4 | 0.39899 | 4 | | 4 | | 4 | | 4 | |
| 227 | 7 | 0.04583 | 7 | | 7 | | 7 | | 7 | |
| 228 | 6 | 0.10722 | 6 | | 6 | | 6 | | 6 | |
| 229 | 0 | 0.84590 | 1 | err | 1 | err | 0 | | 0 | |
| 230 | 6 | 0.17278 | 6 | | 6 | | 6 | | 6 | |
| 231 | 6 | 0.17744 | 6 | | 6 | | 6 | | 6 | |

However, further according to the judgment results shown in Table 1, there are cases in which a level judged by referring to the preceding-level table and a level judged by referring to the ensuing-level table do not coincide. This phenomenon can be observed in No. 25 in Table 1 above, in which the level judged by referring to the preceding-level table is "3" which is incorrect, and the level judged by referring to the ensuing-level table is "2" which is correct. Examining many similar phenomena as the above-mentioned phenomenon reveals tendencies as follows.

Assuming that a combination of the three successive cells 1 is represented by (X, Y, Z) with Y being multivalued-level data of the present cell, the following cases ① and ② apply.

forth in the above-mentioned cases ① and ②, i.e., under a relationship of (X=Z). In No. 229 in Table 1 above, (X, Y, Z) is (6, 1, 6), which corresponds to the case of (X=Z). In this case, a level judged by referring to the preceding-level table is "1" which is incorrect, and a level judged by referring to the ensuing-level table is "0" which is correct.

In the above-mentioned relationships shown in FIG. 3 and FIG. 4, a distribution of combinations of a preceding level being "0" and a level of the present cell (named center level in the figures) being "0", for example, has a fluctuation band due to an influence of a recording mark of the ensuing cell. An average (a normalized reproduction signal value) of these distributed combinations of (X=0, Y=0, Z=any value) is treated as one of learned results (the preceding-level table)

learned in cases where judged values of recording marks of the ensuing cell are unknown, according to a statistical work ignoring the judged values of the recording marks of the ensuing cell.

A specific expression is expressed as follows:

$LR\ (Xi,\ Yj)$=[Total sum of normalized reproduction signal values of combinations $(Xi,\ Yj)$]/[Number of combinations $(Xi,\ Yj)$]

In this expression, Xi and Yj represent levels in a range that multivalued-level signals can assume; in the eight-value recording, the range is expressed as $(0 \leqq Xi,\ Yj \leqq 7)$.

Similarly, as to the ensuing-level table, a specific expression is expressed as follows:

$LR\ (Yi,\ Zj)$=[Total sum of normalized reproduction signal values of combinations $(Yi,\ Zj)$]/[Number of combinations $(Yi,\ Zj)$]

It is preferred that these learned results are obtained beforehand by reproducing an area in which all of known combination patterns of the three successive cells 1 are recorded, and performing the statistical processing.

These learned results obtained beforehand, i.e., learned results for preceding-level table: LR (Xi, Yj); and
learned results for ensuing-level table: LR (Yi, Zj), are hereinafter expressed as "ideal values". In the case of (X=Z), assuming that an actually measured reproduction signal value is y, that an ideal value calculated from the learned results for the preceding-level table is y1, and that an ideal value calculated from the learned results for the ensuing-level table is y2, selecting a judgment result involving a smaller error with respect to the ideal value enables a correct level judgment at a high probability, even in the case of (X=Z). This additional principle is referred to as a "fifth principle" of the present invention.

Specifically, in No. 229 in Table 1 created from actually measured data, y is 0.84590, y1 is 0.900420, and y2 is 0.894110; thus, respective errors satisfy the following magnitude relation.

|y-y1|=0.054521 (absolute value as to the preceding-level table result)>|y-y2|=0.048209 (absolute value as to the ensuing-level table result)

Accordingly, a judgment result of the ensuing-level table involving the smaller error with respect to the ideal value can be selected. As described above, judging a multivalued level of the present cell by using the fourth principle and the fifth principle of the present invention can further enhance a probability of correctly judging the multivalued level, compared with the level judgment by referring only to the preceding-level table or the ensuing-level table.

Figure 6A:
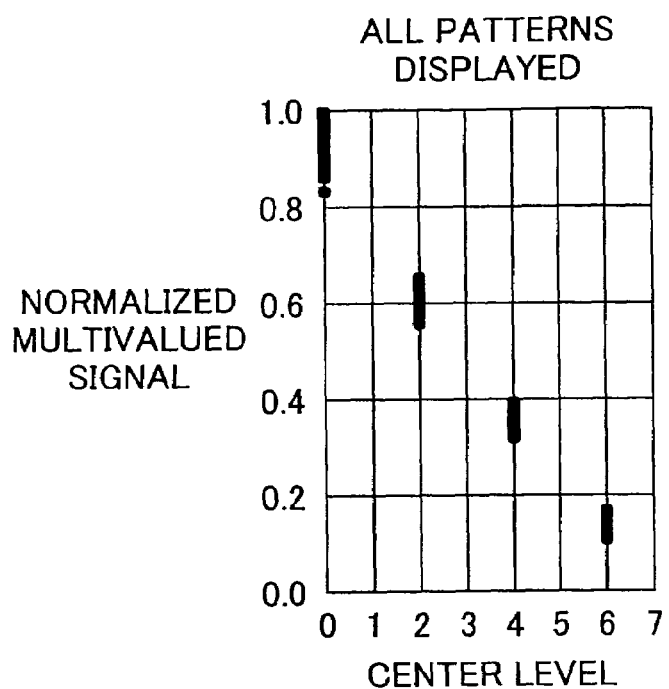
FIG. 6A is a characteristic diagram representing a change of level of a cell having four even-number values.
Figure 6B:
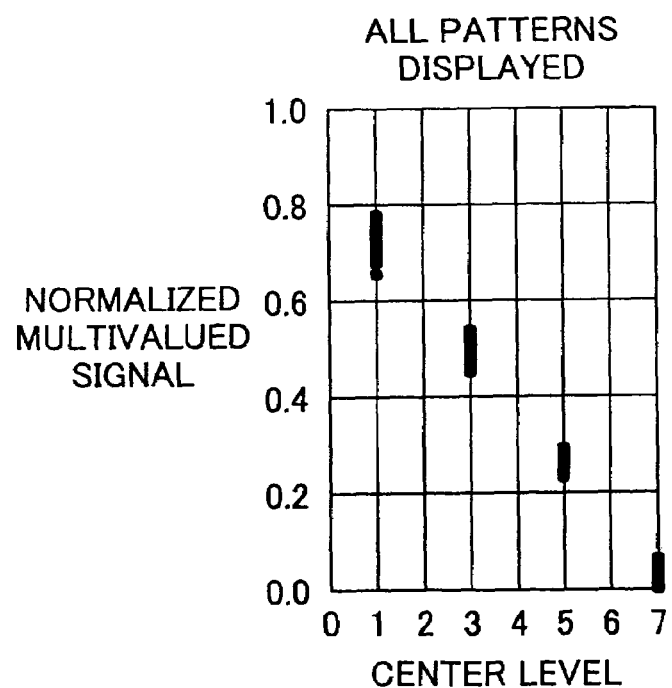
FIG. 6B is a characteristic diagram representing a change of level of a cell having four odd-number values.

Besides, when a reproduction signal cannot be judged uniquely to be one of the eight-value levels as shown in FIG. 2, reducing the number of multivalues of recording marks enables a unique judgment, as shown in FIG. 6A. and FIG. 6B. FIG. 6A shows an example where a lowest-order bit among the three (=T) bits is fixed at 0 so as to reduce the eight (=N) values down to four (=M=$2^{T-1}$) values. FIG. 6B shows an example where a lowest-order bit among the three (=T) bits is fixed at 1 so as to reduce the eight (=N) values down to four (=M=$2^{T-1}$) values. That is, instead of a uniform recording with N-valued marks, FIG. 6A and FIG. 6A indicate recording methods in each of which an M-valued mark is recorded on one cell in every predetermined number (=three) of cells so as to intervene between the N-valued marks. A "sixth principle" of the present invention uses this principle.

According to the above-mentioned first principle, in the course of repeatedly reproducing each present cell based on information of a preceding cell, erroneously reading the preceding cell due to a defect and so forth passes the error on to a following cell, possibly leading to successive erroneous reading of following cells. Thereupon, as shown in FIG. 1C, an M-valued mark with a reduced number of multivalued levels is recorded on one cell in every predetermined number (=n) of cells such that the cell with the reduced number of the multivalued levels is reproduced independently, and each of the other cells (the cells with N-valued marks) is reproduced based on level information of preceding and ensuing cells; thereby, successive erroneous reading of following cells can be prevented. In an example shown in FIG. 1C and FIG. 1D, data is recorded as a combination of an eight-valued mark, an eight-valued mark and a four-valued mark, and is reproduced as the combination of the eight-valued mark, the eight-valued mark and the four-valued mark. (In reality, either of marks "000", "010", "100" and "110" is recorded on a four-valued cell, and is reproduced with the lowest-order bit "0" being omitted, as shown in FIG. 1D. Accordingly, successive errors can be prevented.

Thus preventing successive errors of judgments, and further increasing a recording density with the length of the cell in the circumferential direction shortened to approximately 0.45 µm, starts to yield results contradicting the fourth principle and the fifth principle of the present invention. A cause thereof is a sampling timing error upon subjecting a multivalued-level signal of each of the cells 1 to an A/D conversion. Due to the sampling error, a sampling cannot be performed at the center of the cell 1 such that a balance of the inter-code interference becomes deviated from an ideal state. Accordingly, errors become likely to occur in level judgment results of a cell judged only by the present cell. Under these conditions, for the purpose of increasing a probability of correct judgment, the fourth principle is improved as follows.

The following results are obtained from learning of the preceding-level table and the ensuing-level table:

learned results for preceding-level table: LR (Xi, Yj); and
learned results for ensuing-level table: LR (Yi, Zj).

Assuming that an actually measured reproduction signal value is y, that an ideal value calculated from the learned results for the preceding-level table is y1, and that an ideal value calculated from the learned results for the ensuing-level table is y2, selecting a judgment result involving a smaller error with respect to the ideal value enables a correct level judgment at a high probability. This improved fourth principle is referred to as a "seventh principle" of the present invention.

TABLE 2

| No. | Correct level | Normalized reproduction signal | Present cell | | Preceding-level table | | Ensuing-level table | | Error judgment | |
|---|---|---|---|---|---|---|---|---|---|---|
| | | | Value | Judgment | Value | Judgment | Value | Judgment | Value | Judgment |
| 1 | 4 | 0.38099 | 4 | | 4 | | 4 | | 4 | |
| 2 | 1 | 0.84247 | 1 | | 1 | | 1 | | 1 | |

TABLE 2-continued

| No. | Correct level | Normalized reproduction signal | Present cell Value | Present cell Judgment | Preceding-level table Value | Preceding-level table Judgment | Ensuing-level table Value | Ensuing-level table Judgment | Error judgment Value | Error judgment Judgment |
|---|---|---|---|---|---|---|---|---|---|---|
| 3 | 2 | 0.71666 | 2 | | 2 | | 2 | | 2 | |
| 103 | 1 | 0.77924 | 1 | | 1 | | 1 | | 1 | |
| 104 | 6 | 0.18137 | 6 | | 6 | | 6 | | 6 | |
| 105 | 6 | 0.16647 | 6 | | 6 | | 6 | | 6 | |
| 106 | 1 | 0.82589 | 1 | | 0 | err | 1 | | 1 | |
| 107 | 1 | 0.78905 | 1 | | 1 | | 1 | | 1 | |
| 108 | 2 | 0.63709 | 2 | | 2 | | 2 | | 2 | |
| 109 | 6 | 0.18721 | 6 | | 6 | | 6 | | 6 | |
| 200 | 0 | 0.90720 | 0 | | 0 | | 0 | | 0 | |
| 201 | 6 | 0.13970 | 6 | | 6 | | 6 | | 6 | |
| 202 | 1 | 0.84643 | 0 | err | 0 | err | 1 | | 1 | |
| 203 | 3 | 0.53928 | 3 | | 3 | | 3 | | 3 | |
| 204 | 2 | 0.69804 | 2 | | 2 | | 2 | | 2 | |
| 205 | 6 | 0.15893 | 6 | | 6 | | 6 | | 6 | |

Specifically, in No. 106 in Table 2 created from actually measured data, y is 0.82589, y1 is 0.878425, and y2 is 0.798644; thus, respective errors satisfy the following magnitude relation.

$|y-y1|=0.052538$ (absolute value as to the preceding-level table result)$>|y-y2|=0.027242$ (absolute value as to the ensuing-level table result)

Accordingly, a judgment result of the ensuing-level table involving the smaller error with respect to the ideal value can be selected, and the judgment result is correct. Additionally, in No. 202 in Table 2, y is 0.84643, y1 is 0.878425, and y2 is 0.821804; thus, respective errors satisfy the following magnitude relation.

$|y-y1|=0.031990$ (absolute value as to the preceding-level table result)$>|y-y2|=0.024631$ (absolute value as to the ensuing-level table result)

Accordingly, a judgment result of the ensuing-level table involving the smaller error with respect to the ideal value can be selected, and the judgment result is correct.

As in these two examples, judging a multivalued level of the present cell by using the seventh principle of the present invention can further enhance a probability of correctly judging the multivalued level, compared with the combination of the fourth principle and the fifth principle. However, the seventh principle always necessitates an error judgment, which increases a calculation amount, in contrast to the fourth principle and the fifth principle; thus, the seventh principle requires a high calculation speed. Besides, using a result re-judged and fed back according to the principles of the present invention further in re-judgment can reduce a probability of erroneous judgment.

Hereinbelow, descriptions will be given of the embodiments based on the above-described principles according to the present invention.

First, a description will be given, with reference to FIG. 7 to FIG. 9, of a first embodiment according to the present invention. The present first embodiment adopts the first principle of the present invention.

Figure 7:
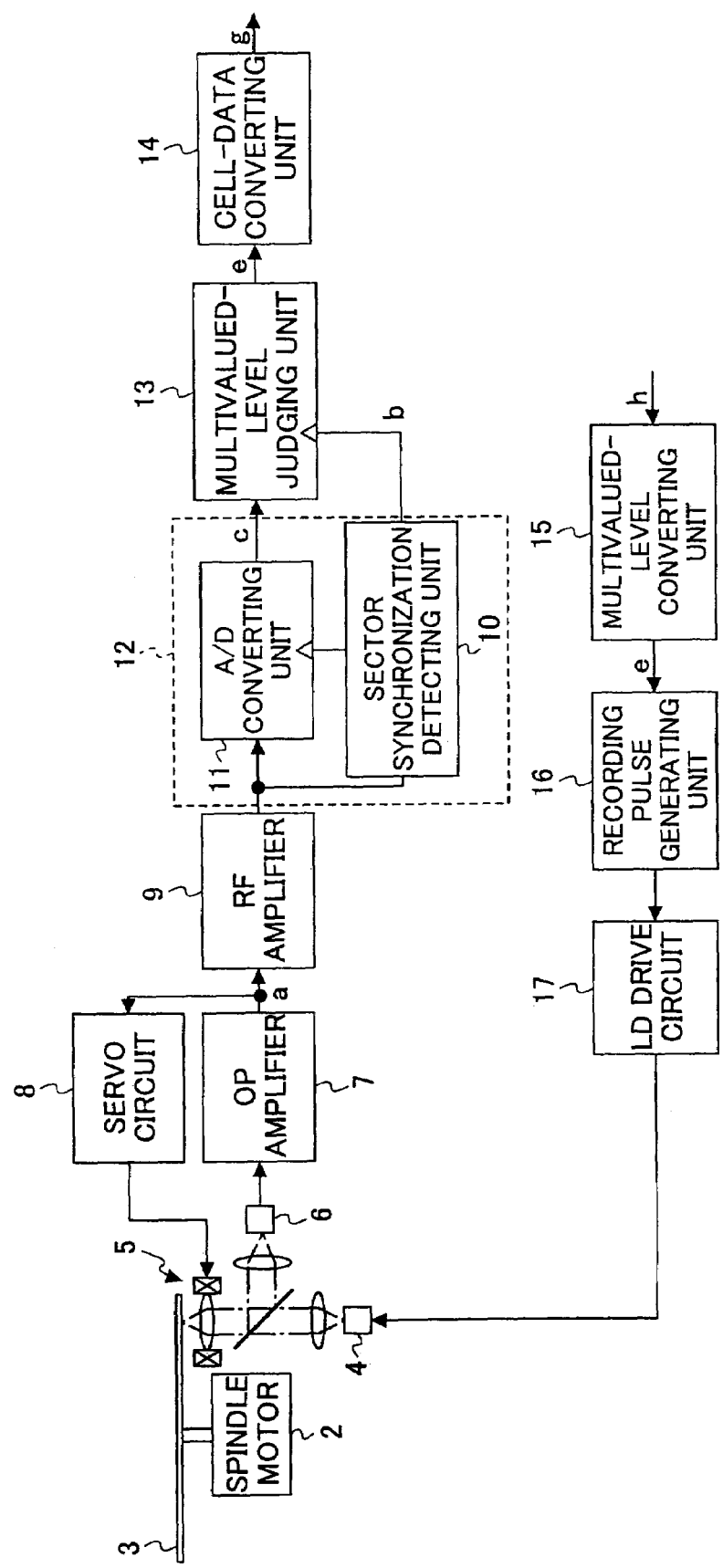
FIG. 7 is a block diagram of an information recording/reproducing device according to a first embodiment of the present invention.
Figure 8:
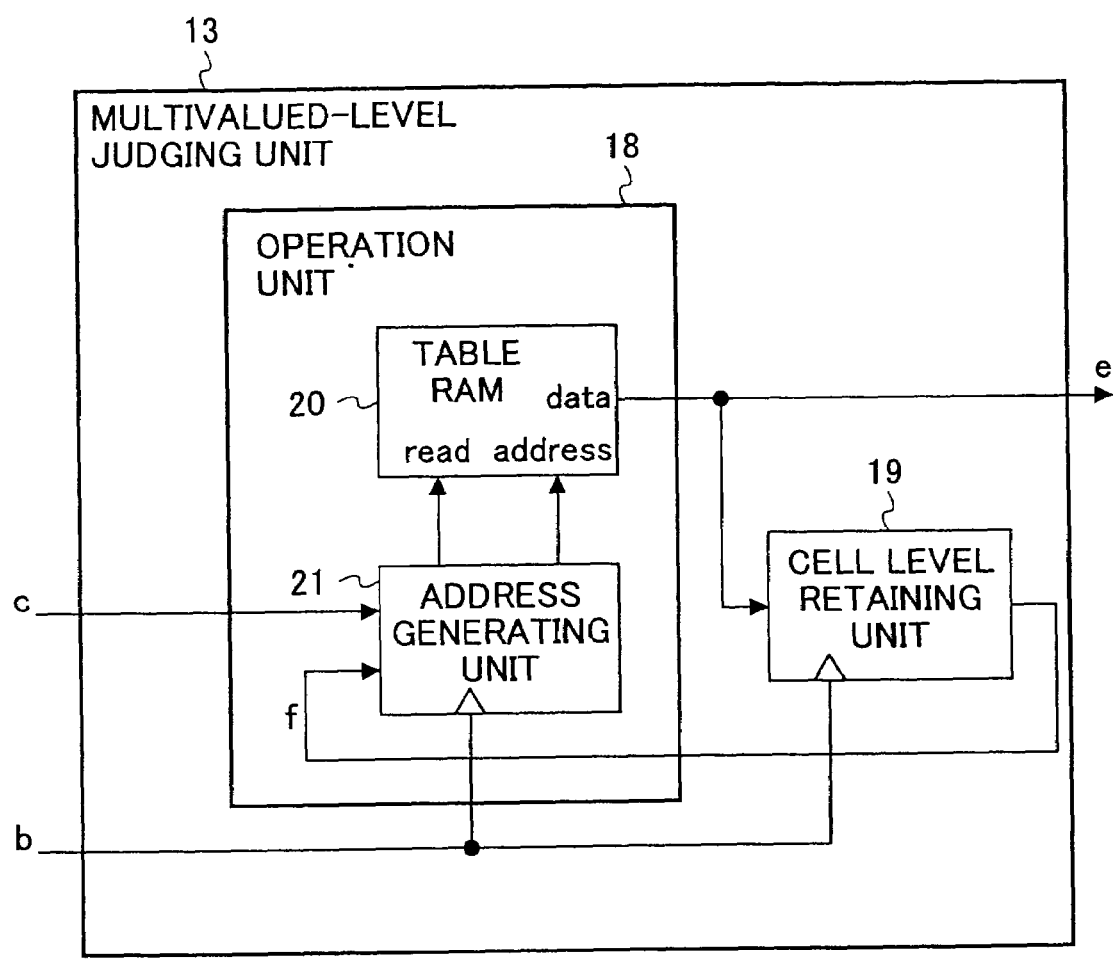
FIG. 8 is a block diagram of an example of a structure of a multivalued-level judging unit thereof.

FIG. 7 is a block diagram used for explaining a structure and an operation of an information recording/reproducing device according to the present first embodiment. While an information recording medium 3 is being revolved by a spindle motor 2, a laser beam emitted from a LD (laser diode) 4 is projected along a track on the information recording medium 3 by an optical head 5. A reflected light from the information recording medium 3 is detected by a PD (photodetector) 6, and is subjected to a focus/tracking control by an OP amplifier 7 and a servo circuit 8 so as to stably project the laser beam on the information track. Additionally, a reproduction signal "a" detected by the PD 6 is amplified by an RF amplifier 9, and thereafter, is converted into digital data c by a digital data converting unit 12 consisting of a sector synchronization detecting unit 10 and an A/D converting unit 11.

Besides, although not shown in FIG. 7, the digital data c is subjected to a normalization process as described above so that a value of reproduced digital data does not fluctuate. In FIG. 2, the normalization process is conducted such that a maximum level becomes "1", for the sake of easy comprehension. In FIG. 7, the digital data is normalized to become an integral value so that the data can be easily processed thenceforth. When the digital data is processed as 10-bit digital data, the digital data is normalized as follows.

$$(\text{Normalized digital data})=[(RF-\min)/(\max-\min)]\times 1024 \qquad (2)$$

This digital data c is detected and converted by a multivalued-level judging unit 13 into cell level data e corresponding to a multivalued level of each of the cells 1. The cell level data e is converted into reproduction information g by a cell-data converting unit 14. Thus, information is reproduced from the information recording medium 3 on which multivalued information is recorded.

On the other hand, upon recording, input information h is converted by a multivalued-level converting unit 15 into the cell level data e, and signals representing light intensities and timings of recording and erasing pulses are generated by a recording pulse generating unit 16, and are supplied to an LD drive circuit 17. Thereby, a recording mark is recorded on the information recording medium 3 by the LD 4. The LD 4, the LD drive circuit 17, the recording pulse generating unit 16, and other components together form a recording unit.

With the above-described structure, the present first embodiment, using the first principle, changes criteria for judging a present cell by a judging-criteria changing unit according to a preceding cell level so as to prevent a level-judgment error. Therefor, the multivalued-level judging unit 13 comprises an operation unit 18 judging a cell level, and a cell level retaining unit (a multivalued level data retaining unit) 19 retaining the cell level data of a preceding cell, as shown in FIG. 8. The operation unit 18 comprises a table RAM 20 storing level data corresponding to each input digital data (each reproduction level), and an address generating unit 21 reading the cell level data e from the table RAM 20 according to a preceding cell level f and a value of the digital data c.

The table RAM 20 functioning as the judging-criteria changing unit stores cell level data at addresses corresponding to values of the digital data c, the cell level data being divided according to cell level data of a preceding cell, as shown in FIG. 9. Thus, for example, when the cell level data of the preceding cell is "2", and the digital data is "131", cell level data "1" is read from an address of "2*1024+131". That is, by adding an offset generated from the cell level data of the preceding cell to the address of the digital data and reading from the address, criteria for judging the cell level can be changed according to the preceding cell so as to generate the cell level thereby. This 3-bit cell level data row reproduced from each cell is collected by the cell-data converting unit 14 so as to form the reproduction information g which is an 8-bit data row. Accordingly, whereas a micro cell, three of which become encompassed within a reproducing beam, conventionally causes a reproduction error due to an influence of the inter-code interference when reproduced cell by cell, such a micro cell can be reproduced without an error according to the present embodiment.

Besides, the table RAM 20 initially stores the cell level data as follows: cell level data of all combinations of three cells (8*8*8=512 combinations) are recorded beforehand on an area other than a user data area, such as a lead-in area, on the recording medium 3; the cell level data is reproduced so as to obtain a cell level of each combination of the three cells; and the cell levels are recorded on the table RAM 20 before reproducing the user data. Alternatively, a table containing the cell level data may be prepared beforehand; in this case, offset values are adjusted, for example, at level 0 to cancel such factors as a reflectance alteration.

Next, a description will be given, with reference to FIG. 10 to FIG. 19, of a second embodiment according to the present invention. The present second embodiment is an example of applying the present invention to a multi-value (eight-value) recording in which user data is recorded as a combination of an eight-valued mark, an eight-valued mark and a four-valued mark, as in the example shown in FIG. 1C and FIG. 1D. The present second embodiment uses the fourth and fifth principles in judging a multivalued level, which switches criteria for judging a cell level of a present cell by referring to a cell level of a preceding cell and a cell level of an ensuing cell so as to prevent a level-judgment error.

Figure 10:
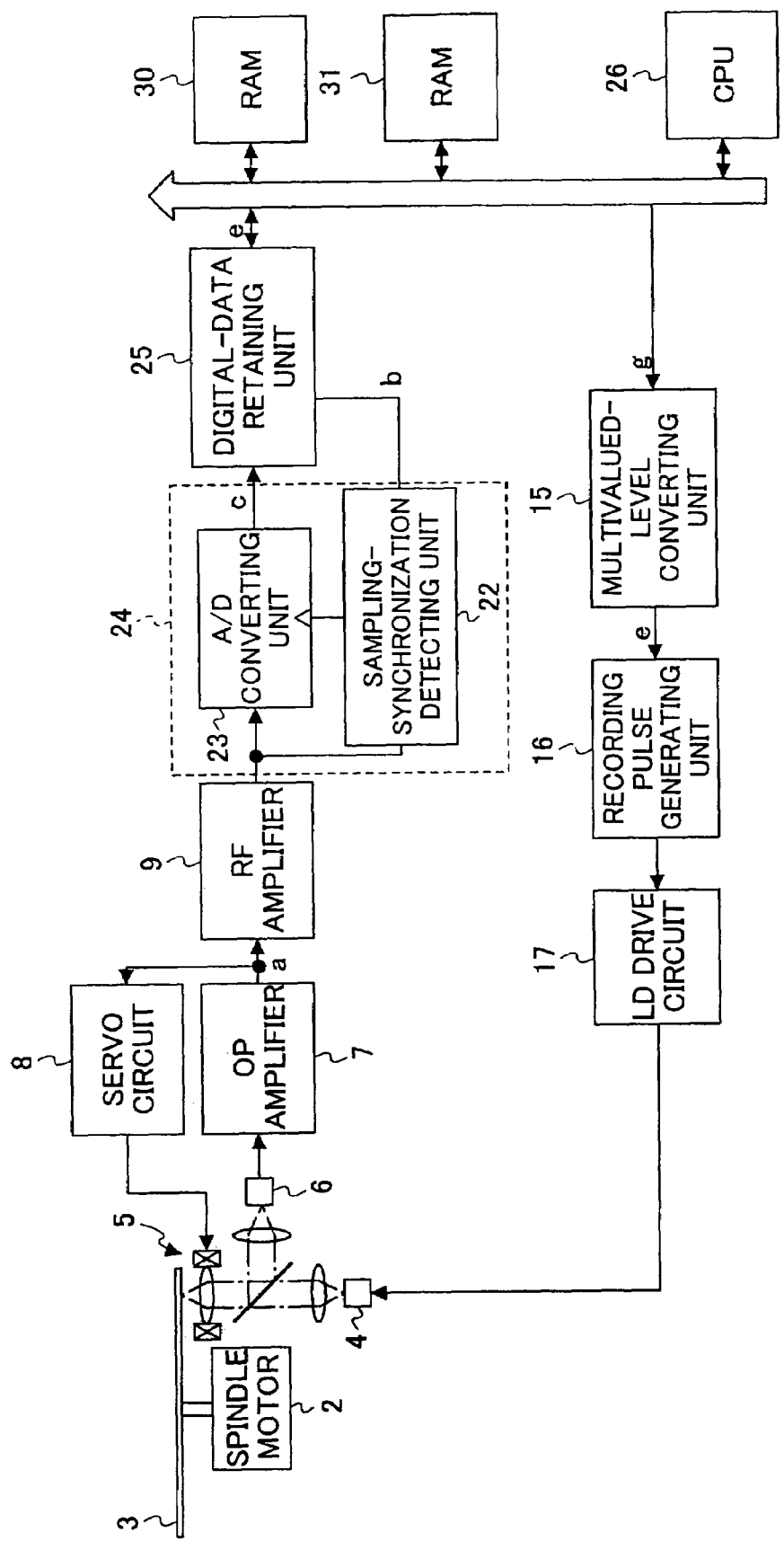
FIG. 10 is a block diagram of an information recording/reproducing device according to a second embodiment of the present invention.
Figure 11:
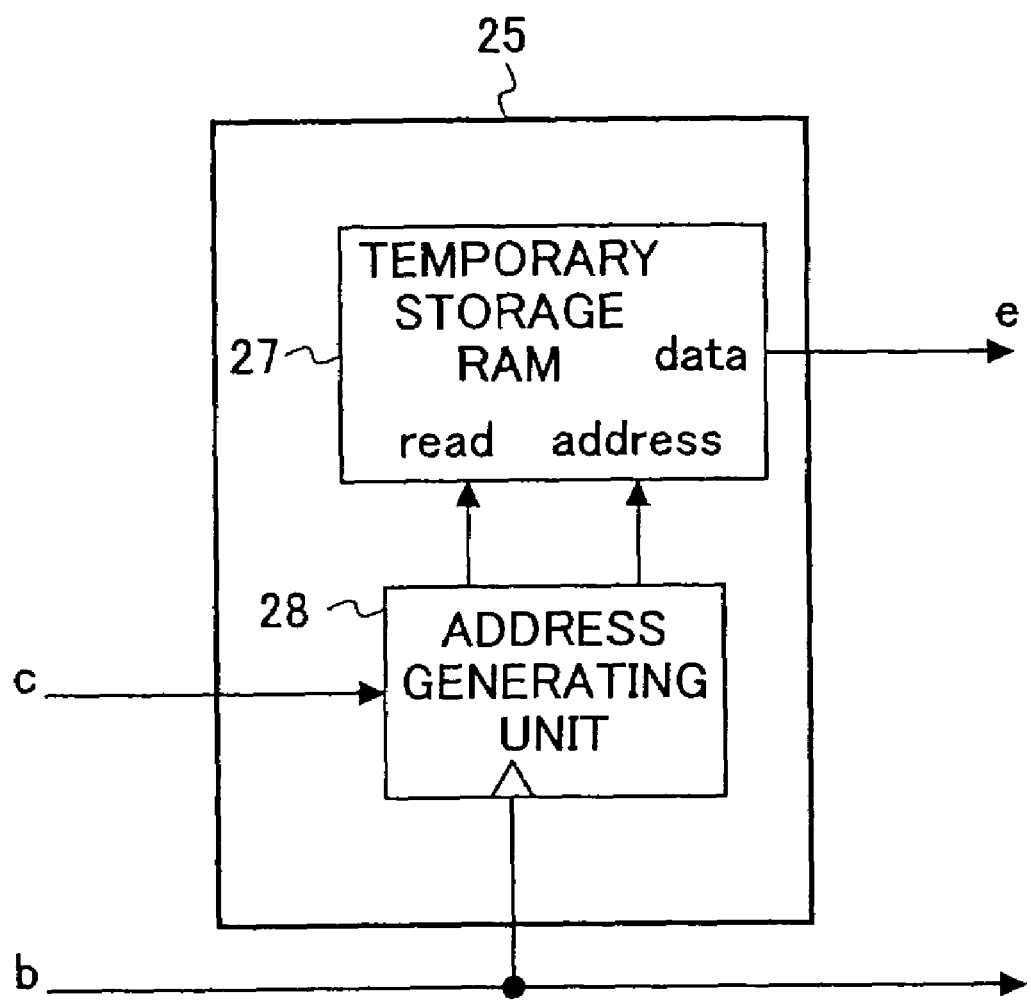
FIG. 11 is a block diagram of an example of a structure of a digital retaining unit thereof.

FIG. 10 is a block diagram used for explaining a structure of an information recording/reproducing device according to the present second embodiment. The structure of the information recording/reproducing device shown in FIG. 10 is basically the same as the structure of the information recording/reproducing device shown in FIG. 7 except the following points. The reproduction signal "a" detected by the PD 6 is amplified by the RF amplifier 9, and the inter-code interference is suppressed by a waveform equalization circuit (not shown in the figure). Thereafter, the reproduction signal "a" is converted into digital data c by a digitizing unit 24 consisting of a sampling-synchronization detecting unit 22 and an A/D converting unit 23. In the present embodiment, though not shown in FIG. 10, the digital data c is subjected to a normalization process as described above so that a value of reproduced digital data does not fluctuate. In the present embodiment, the digital data is normalized also by the above-described expression (2).

This digital data c is temporarily stored in a digital retaining unit (a digital-data retaining unit) 25 so that signal data e of groups of sampled cells can be selectively read on an individual cell basis by a CPU 26.

At this point, for the purpose of reproducing multivalued data, three criterion tables (a present-cell judgment table 29, a preceding-cell reference table 33, an ensuing-cell reference table 35) used for judging multivalued levels are created. In the eight-value recording, combinations of three successive cells total ($8^3$=512). Thereupon, all combination patterns of a group of three marks (cells) are recorded as learned pattern information of known multivalued levels by a learned-pattern recording unit (not shown in the figure) on an innermost area of the recording medium 3 on which user data is not recorded. Thereafter, the learned pattern information is reproduced by a learning unit (not shown in the figure), and the digital data c sampled at a central cell of the three successive cells is temporarily stored in the digital retaining unit 25. The data is stored in a temporary storage RAM 27 provided in the digital retaining unit 25 show in FIG. 11 in an arrangement shown in FIG. 12. The data can be selectively read by designating an address of the data in the temporary storage RAM 27 by an address generating unit 28.

Figure 12:
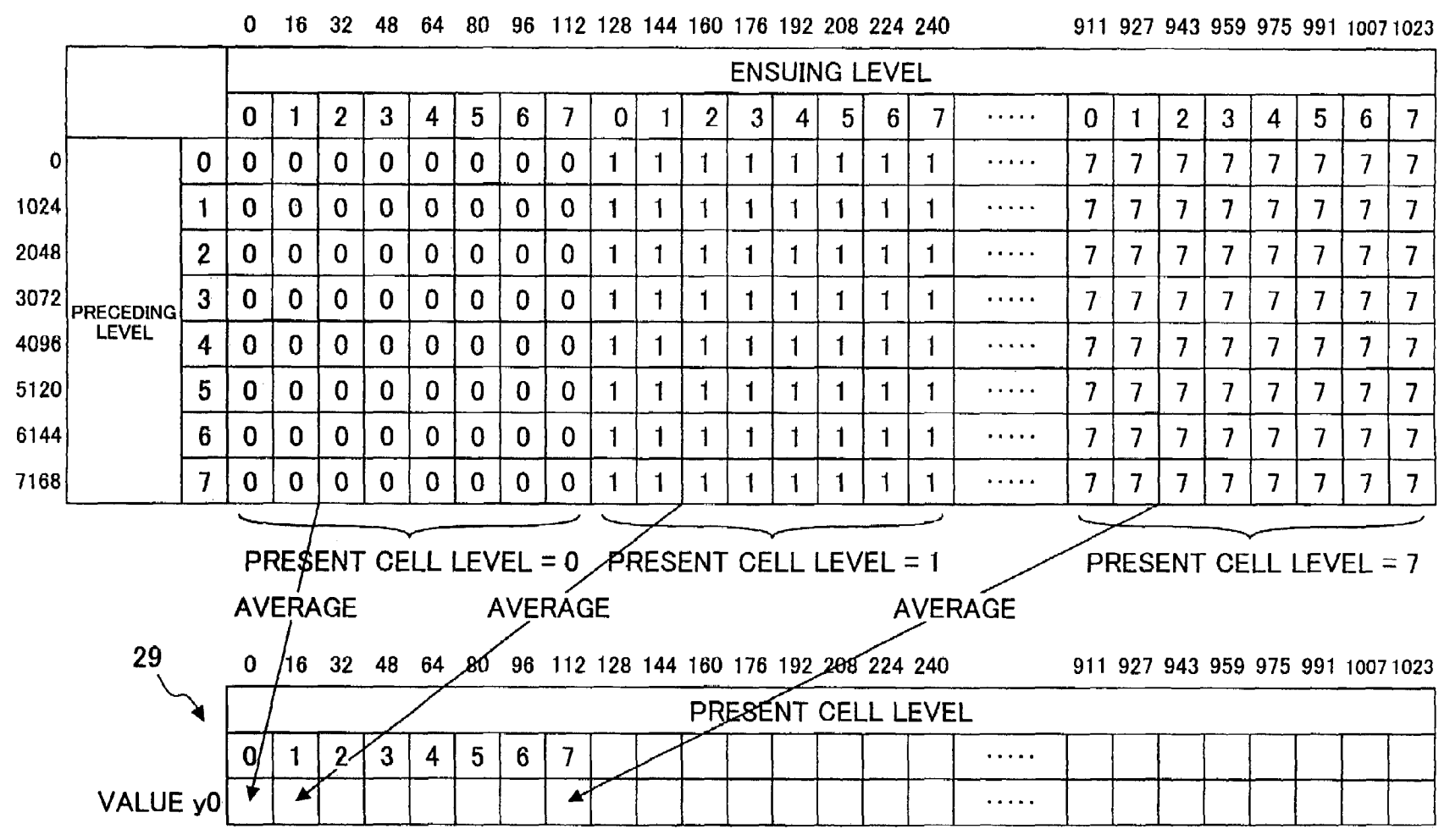

First, based on the information stored in the temporary storage RAM 27, the present-cell judgment table 29 ignoring (preceding) levels of a preceding cell and (ensuing) levels of an ensuing cell is created. For example, regarding the cell level of the present cell being "0", there are 64 combinations (8 values for the preceding level times 8 values for the ensuing level). A criterion signal y0 used in judging each level is calculated as an average of these 64 combinations. Also, regarding the cell level of the present cell being "1" to "7", the criterion signal y0 is calculated similarly so as to create the present-cell judgment table 29 as shown in FIG. 12. In the structure shown in FIG. 10, the learned patterns (the 512 combinations) stored in the temporary storage RAM 27 are read in succession, and are subjected to the above-described calculation by the CPU 26, results of which are recorded on a RAM 30. This process is performed by the CPU 26 as a function of a criterion-table creating unit.

Besides, present-cell judgment tables 32a and 32b regarding a four-value cell can be created similarly. The present-cell judgment table 32a shown in FIG. 13A corresponds to the example shown in FIG. 6A where each of the four values is an even number. The present-cell judgment table 32b shown in FIG. 13B corresponds to the example shown in FIG. 6B where each of the four values is an odd number.

Next, a description will be given of a method for creating the preceding-cell reference table 33. The signal data e of sampled cells obtained from recordings of all combinations of three successive cells is selectively read, as in creating the present-cell judgment table 29. The preceding-cell reference table 33 ignoring levels of an ensuing cell is created as follows.

Figure 14:
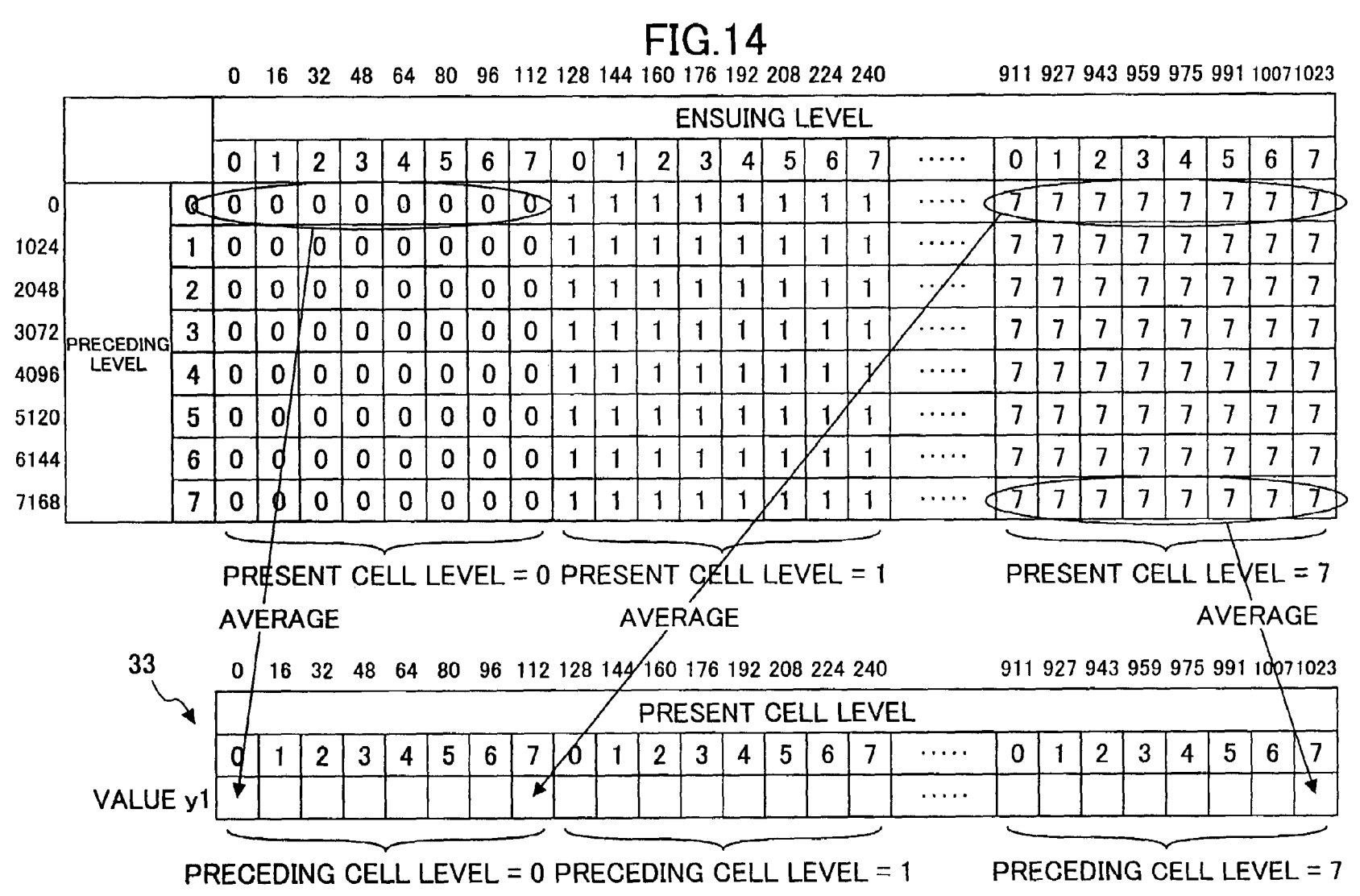

FIG. 14 is a diagram used for explaining the method for creating the preceding-cell reference table 33. For example, regarding combinations when the cell level of the preceding cell being "0" and the cell level of the present cell being "0", eight items of data circled by ○ among the data temporarily stored in the temporary storage RAM 27 in the same arrangement as shown in FIG. 12 are subjected to an average process so as to calculate a criterion signal y1 used in judging the cell level. As a result of this, the preceding-cell reference table 33 containing 64 combinations ignoring levels of an ensuing cell can be created. Also, regarding the cell level of the present cell being "1" to "7", the criterion signal y1 is calculated similarly so as to create the table as shown in FIG. 14. In the structure shown in FIG. 10, the learned patterns (the 512 combinations) stored in the temporary storage RAM 27 are read in succession, and are subjected to the above-described calculation by the CPU 26, results of which are recorded on the RAM 30. This process is performed by the CPU 26 as a function of the criterion-table creating unit.

Besides, preceding-cell reference tables 34$a$ and 34$b$ regarding a four-value cell can be created similarly. The preceding-cell reference table 34$a$ shown in FIG. 15A corresponds to the example shown in FIG. 6A where each of the four values is an even number. The preceding-cell reference table 34$b$ shown in FIG. 15B corresponds to the example shown in FIG. 6B where each of the four values is an odd number.

Further, a description will be given of a method for creating the ensuing-cell reference table 35. The signal data e of sampled cells obtained from recordings of all combinations of three successive cells is selectively read, as in creating the present-cell judgment table 29. The ensuing-cell reference table 35 ignoring levels of a preceding cell is created as follows.

Figure 16:
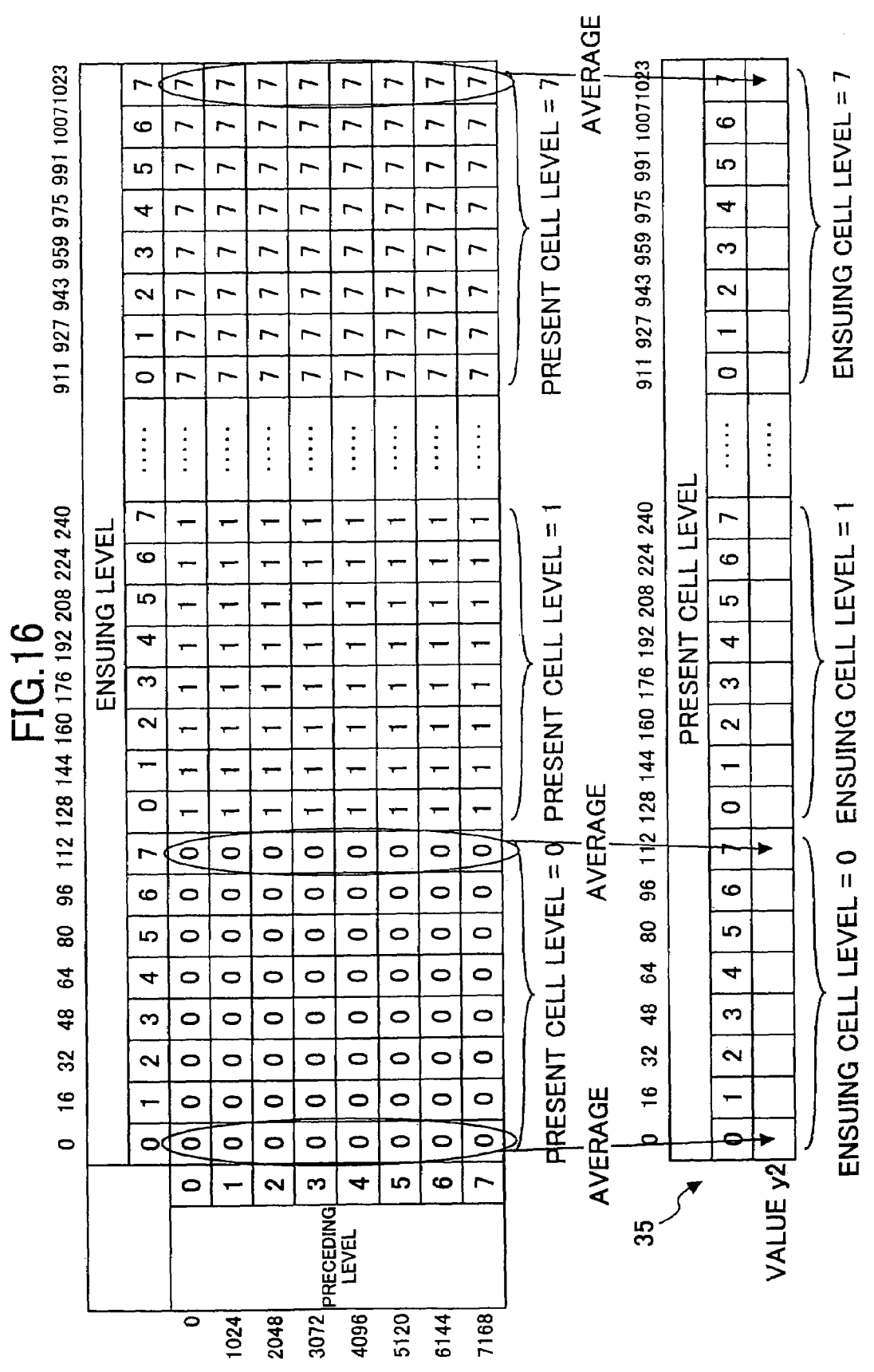

FIG. 16 is a diagram used for explaining the method for creating the ensuing-cell reference table 35. For example, regarding combinations when the cell level of the ensuing cell being "0" and the cell level of the present cell being "0", eight items of data circled by ○ among the data temporarily stored in the temporary storage RAM 27 in the same arrangement as shown in FIG. 12 are subjected to an average process so as to calculate a criterion signal y2 used in judging the cell level. As a result of this, the ensuing-cell reference table 35 containing 64 combinations ignoring levels of a preceding cell can be created. Also, regarding the cell level of the present cell being "1" to "7", the criterion signal y2 is calculated similarly so as to create the table as shown in FIG. 16. In the structure shown in FIG. 10, the learned patterns (the 512 combinations) stored in the temporary storage RAM 27 are read in succession, and are subjected to the above-described calculation by the CPU 26, results of which are recorded on the RAM 30. This process is performed by the CPU 26 as a function of the criterion-table creating unit.

Besides, ensuing-cell reference tables 36$a$ and 36$b$ regarding a four-value cell can be created similarly. The ensuing-cell reference table 36$a$ shown in FIG. 17A corresponds to the example shown in FIG. 6A where each of the four values is an even number. The ensuing-cell reference table 36$b$ shown in FIG. 17B corresponds to the example shown in FIG. 6B where each of the four values is an odd number.

Figure 18:
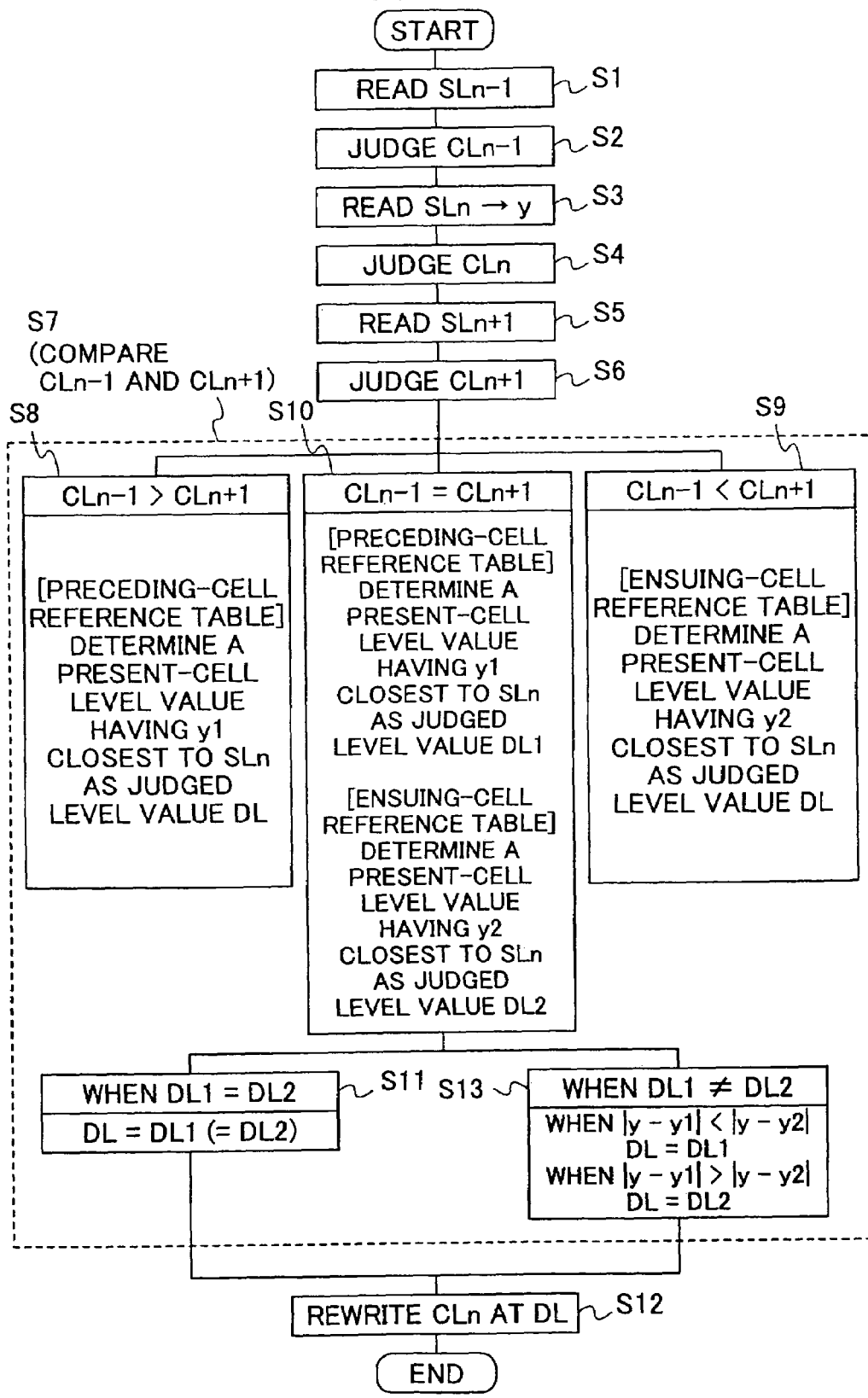
FIG. 18 is a flowchart outlining an example of a process of judging a multivalued level.

A description will be given of a method for judging a multivalued level by using the combination of the fourth principle and the fifth principle, which refers to the RAM 30 on which the learned results (the present-cell judgment table 29, the preceding-cell reference table 33, the ensuing-cell reference table 35) obtained as above are recorded. FIG. 18 is a flowchart outlining an example of a process of judging a multivalued level performed by the CPU 26 according to the combination of the fourth principle and the fifth principle.

A data row of the cell 1 is digitized on an individual cell basis, and is temporarily stored in the temporary storage RAM 27, as a digitized signal value y. Here, reading of digital data $SL_{n-1}$ of a preceding cell $C_{n-1}$ preceding a present cell $C_n$ (step S1), judging of a cell level $CL_{n-1}$ thereof (step S2), reading of digital data $SL_n$ of the present cell $C_n$ (step S3), judging of a cell level $CL_n$ thereof (step S4), reading of digital data $SL_{n+1}$ of an ensuing cell $C_{n+1}$ ensuing the present cell $C_n$ (step S5), judging of a cell level $CL_{n+1}$ thereof (step S6), are performed successively. In the step S4, the cell level $CL_n$ closest to the value y is determined in the present-cell judgment table 29; this process in the step S4 is performed as a function of a primary operation unit. Additionally, the process in the step S6 is performed as a function of an ensuing cell-level operation unit. Then, the cell level data $CL_n$ and the signal value y are written to a RAM 31, which functions as a judged-value retaining unit, by specifying addresses. such that a relation therebetween is known.

Subsequently, three consecutive items of the cell level information ($CL_{n-1}$, $CL_n$, $CL_{n+1}$) and the digitized signal value y of the present cell $C_n$ are read from the RAM 31, and magnitudes of the cell levels $CL_{n-1}$ and $CL_{n+1}$ are compared according to the fourth principle and the fifth principle (step S7) so as to perform a re-judgment process regarding the present cell $C_n$.

At this point, as a result of the comparison, when $CL_{n-1} > CL_{n+1}$, a present-cell level value having the value y1 closest to the digital data $SL_n$ is determined as a judged level value DL of the present cell $C_n$ by referring to the preceding-cell reference table 33 (step S8). Otherwise, as a result of the above-mentioned comparison, when $CL_{n-1} < CL_{n+1}$, a present-cell level value having the value y2 closest to the digital data $SL_n$ is determined as the judged level value DL of the present cell $C_n$ by referring to the ensuing-cell reference table 35 (step S9).

On the other hand, as a result of the above-mentioned comparison, when $CL_{n-1} = CL_{n+1}$, a present-cell level value having the value y1 closest to the digital data $SL_n$ is provisionally determined as a judged level value DL1 of the present cell $C_n$ by referring to the preceding-cell reference table 33, and a present-cell level value having the value y2 closest to the digital data $SL_n$ is provisionally determined as a judged level value DL2 of the present cell $C_n$ by referring to the ensuing-cell reference table 35 (step S10). Then, magnitudes of these judged level values DL1 and DL2 are compared. When DL1=DL2, either of DL1 and DL2 is arbitrarily selected as the judged level value DL of the present cell $C_n$ (step S11) so as to settle the cell level $CL_n$ of the present cell $C_n$ at DL, and rewrite the settled DL to the RAM 31 (step S12).

Otherwise, when DL1≠DL2, according to a magnitude relation between |y-y1| and |y-y2|, when |y-y1|<|y-y2|, DL1 is selected as the judged level value DL of the present cell $C_n$; when |y-y1|>|y-y2|, DL2 is selected as the judged level value DL of the present cell $C_n$ (step S13); thus, the cell level $CL_n$ of the present cell $C_n$ is settled at DL, and the settled DL is rewritten to the RAM 31 (step S12).

Processes of these steps S7 to S13 are performed as functions of a reference judged value selecting unit and a re-judgment operation unit.

Figure 19:
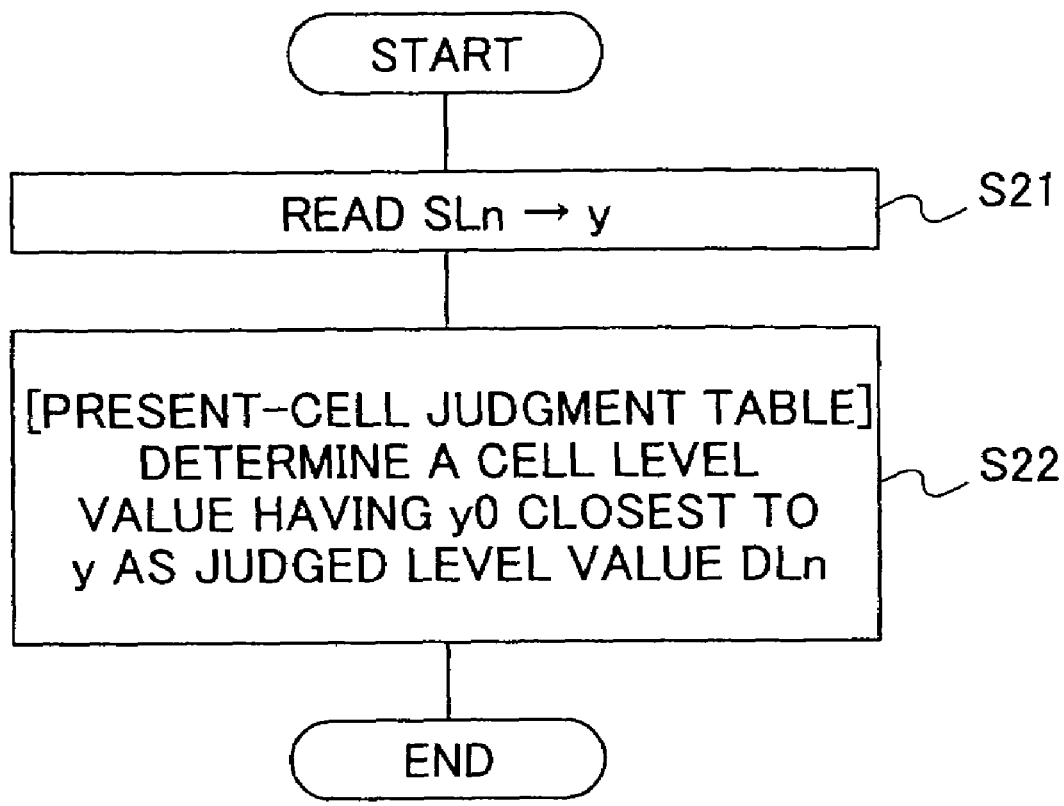
FIG. 19 is a flowchart of an example of a process of judging a multivalued level only based on a present cell.

Besides, as shown in FIG. 19, regarding a cell of a four-valued level, a cell level of the present cell is judged only from the present cell per se, as follows: digital data $SL_n$ of the present cell $C_n$ is read (step S21), and a cell level value having the value y0 closest to the value y is determined as a judged value $DL_n$ by referring to the present-cell judgment table 32$a$ or 32$b$ (step S22).

Successively, judging multivalued levels of the following cells by using the multivalued data rewritten as above can further decrease a probability of erroneous judgment.

Besides, readings and writings from/to the RAMs 27, 30 and 31 and other operational processes are timed in synchronization with a sampling timing by the sampling-synchronization detecting unit 22 shown in FIG. 10.

Figure 20:
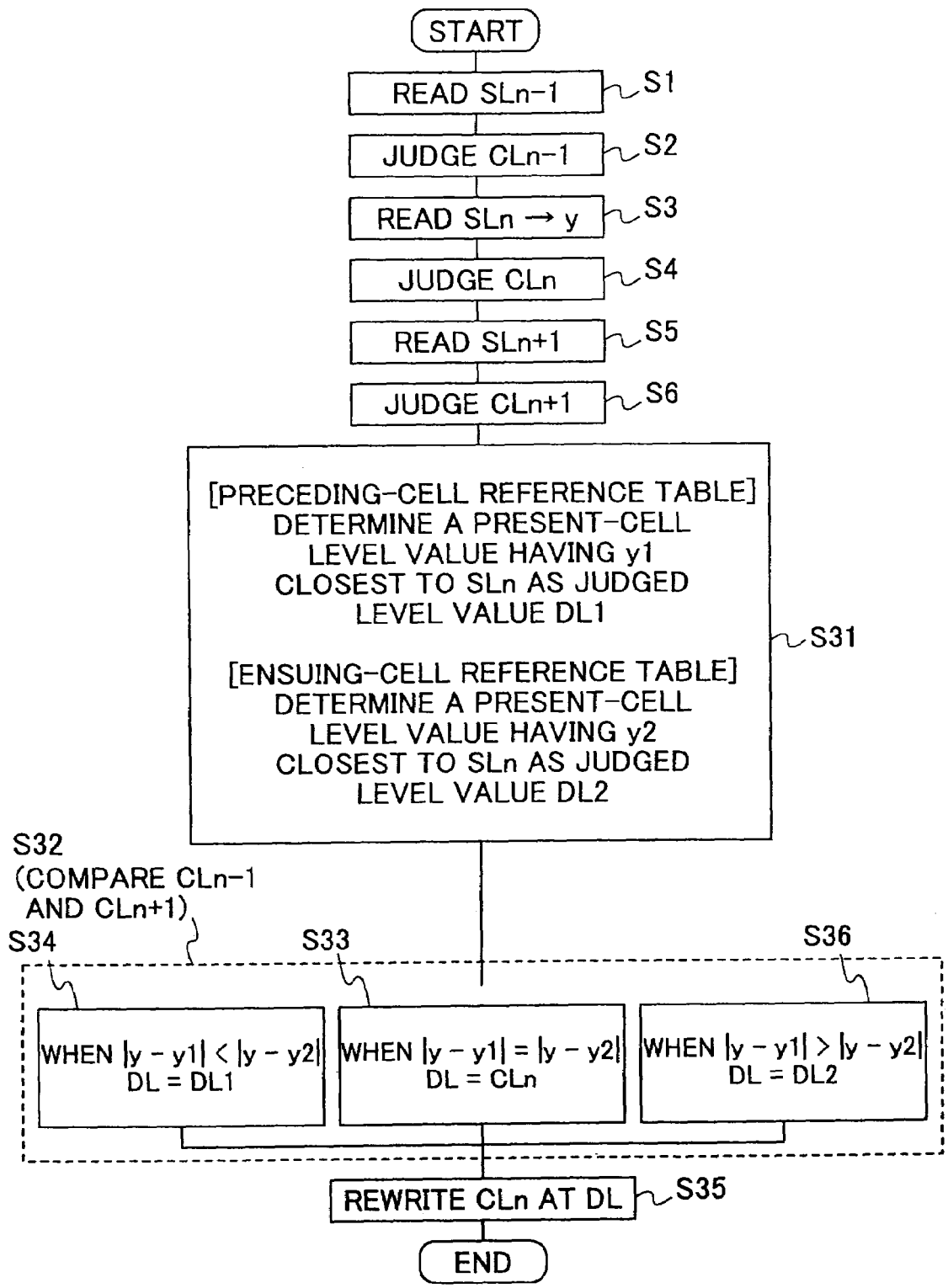
FIG. 20 is a flowchart outlining an example of a process of judging a multivalued level according to a third embodiment of the present invention.

Next, a description will be given, with reference to FIG. 20, of a third embodiment according to the present invention. The present third embodiment is an example of applying the present invention to a multi-value (eight-value) recording in which user data is recorded as a combination of an eight-valued mark, an eight-valued mark and a four-valued mark, as in the example shown in FIG. 1C and FIG. 1D. The present third embodiment uses the seventh principle in judging a multivalued level so as to prevent a level-judgment error. Additionally, the present third embodiment uses the information recording/reproducing device shown in FIG. 10, and also creates the three criterion tables (the present-cell judgment table 29, the preceding-cell reference table 33, the ensuing-cell reference table 35) used for performing a multivalued-level judgment, as does the foregoing second embodiment.

A description will be given, with reference to a flowchart shown in FIG. 20, of a method for judging a multivalued level-according to the seventh-principle by referring to the RAM 30 on which the learned results (the present-cell judgment table 29, the preceding-cell reference table 33, the ensuing-cell reference table 35) are recorded. Processes in steps S1 to S6 shown in FIG. 20 are performed in the same manner as in the steps S1 to S6 shown in FIG. 18.

After the step S6, a provisional judgment process is performed in which a present-cell level value having the value y1 closest to the digital data SLn is provisionally determined as a judged level value DL1 of the present cell Cn by referring to the preceding-cell reference table 33, and a present-cell level value having the value y2 closest to the digital data SLn is provisionally determined as a judged level value DL2 of the present cell Cn by referring to the ensuing-cell reference table 35 (step S31). Thereafter, magnitudes of the cell levels CLn−1 and CLn+1 are compared (step S32) so as to perform a re-judgment process regarding the present cell Cn.

As a result of the comparison, when |y−y1|=|y−y2|, the judged level value is kept to be the original cell level CLn (step S33). When |y−y1|<|y−y2|, DL1 is selected as the judged level value DL of the present cell Cn (step S34) so as to settle the cell level CLn of the present cell Cn at DL, and rewrite the settled DL to the RAM 31 (step S35). When |y−y1|>|y−y2|, DL2 is selected as the judged level value DL of the present cell Cn (step S36) so as to settle the cell level CLn of the present cell Cn at DL, and rewrite the settled DL to the RAM 31 (step S35).

Successively, judging multivalued levels of the following cells by using the multivalued data rewritten as above can further decrease a probability of erroneous judgment.

Besides, readings and writings from/to the RAMs 27, 30 and 31 and other operational processes are timed in synchronization with the sampling timing by the sampling-synchronization detecting unit 22 shown in FIG. 10.

Table 3 shows results of comparing degrees of effects of the second and third embodiments with that of a level judgment based only on a present cell. Error rates shown in Table 3 are on an individual cell basis. Besides, a recording density depends on a cell length such that.the shorter the cell length is, the higher the recording density is.

TABLE 3

| Cell length | Present cell judgment | 4th + 5th principle judgment | 7th principle judgment |
|---|---|---|---|
| 0.56 | 2.25 | 0.42 | 0.17 |
| 0.45 | 5.68 | 2.76 | 1.42 |
| 0.40 | 10.90 | 6.85 | 4.67 |
| μm | | % | |

According to the results shown in Table 3, although reduction effects of error rates vary depending on the recording densities, it is understood that the error judgment rate on an individual cell basis is reduced by approximately 0.2-0.6 times according to the combination of the fourth principle and the fifth principle, and that the error judgment rate is reduced by approximately 0.1-0.4 times according to the seventh principle.

As described above, upon judging a level of a present cell by associating the level with cell information of a preceding cell and an ensuing cell preceding and ensuing the present cell, it has been confirmed that an erroneous judgment can be largely improved according to the "combination of the fourth principle and the fifth principle" and the "seventh principle".

Figure 22:
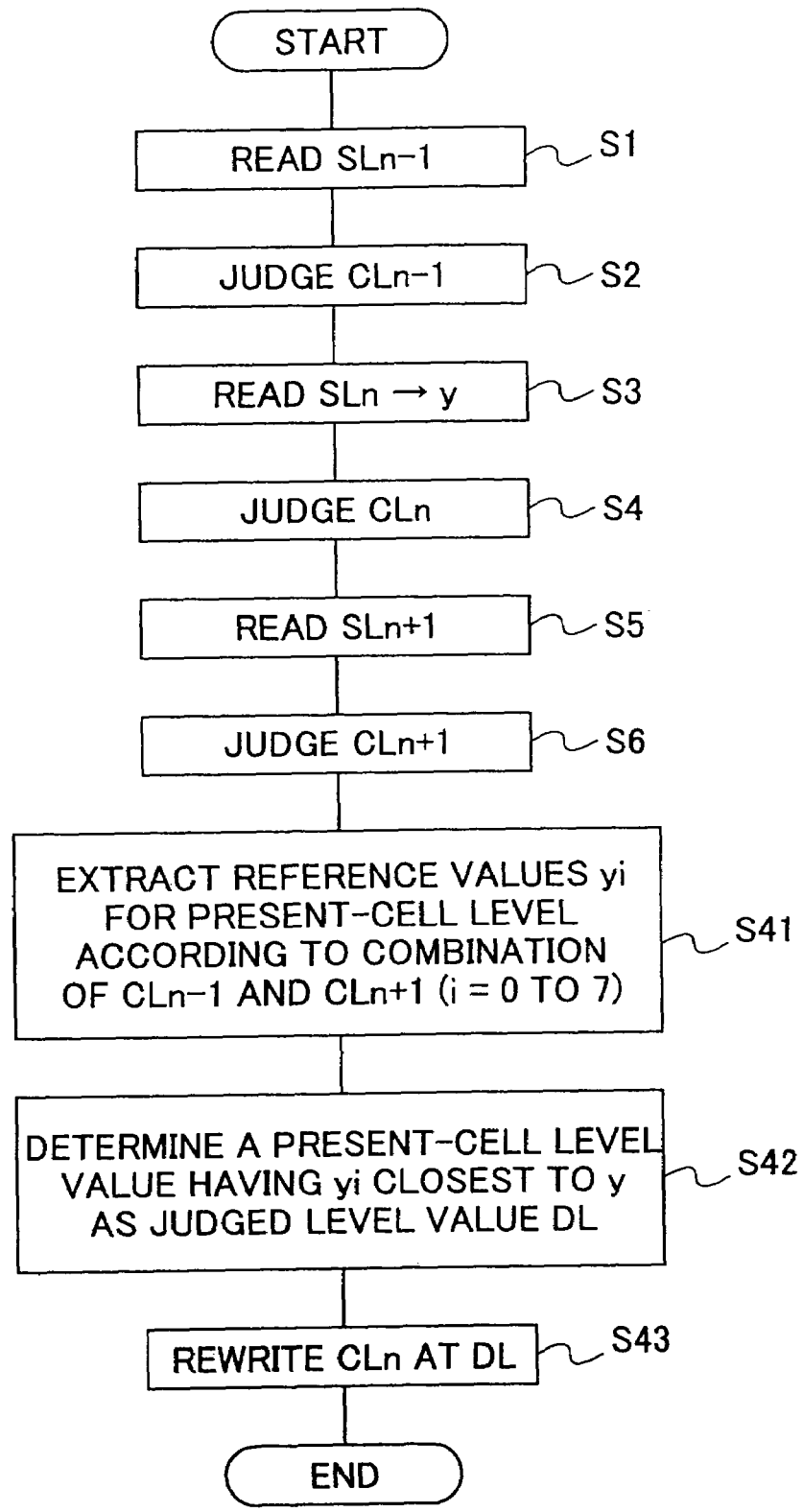
FIG. 22 is a flowchart outlining an example of a process of judging a multivalued level.

Next, a description will be given, with reference to FIG. 21 and FIG. 22, of a fourth embodiment according to the present invention. The present fourth embodiment is an example of applying the present invention to a multi-value (eight-value) recording in which user data is recorded as a combination of an eight-valued mark, an eight-valued mark and a four-valued mark, as in the example shown in FIG. 1C and FIG. 1D. However, in the present fourth embodiment, a method for judging a multivalued level is not a method of switching the reference tables as described above, but is a method of judging according to a result learned from all patterns of combinations of three successive recording marks. FIG. 21 shows an example of a learned table 37 according to the present fourth embodiment. This learned table 37 is in a state prior to calculating the above-described three tables (the present-cell judgment table 29, the preceding-cell reference table 33, the ensuing-cell reference table 35). Hereinbelow, this learned table 37 is also referred to as a three-successive-recording-mark learned table.

A description will be given, with reference to a flowchart shown in FIG. 22, of a method for judging a multivalued level by referring to the RAM 30 on which the learned result (the three-successive-recording-mark learned table 37) is recorded. Processes in steps S1 to S6 shown in FIG. 22 are performed in the same manner as in the steps S1 to S6 shown in FIG. 18 and FIG. 20.

After the step S6, upon performing a re-judgment of a level of the present cell, eight candidate values for the cell level CLn of the present cell Cn are selected according to a combination of the preceding and ensuing cell level data CLn−1 and CLn+1 as shown in FIG. 21, and ideal values y0 to y7 are read from the learned table 37 (step S41), and a cell level CLn having a value closest to the actually measured value y is determined as the judged level value DL of the present cell Cn (step S42). In FIG. 21, eight reference values for the present-cell level are extracted from the learned table 37, corresponding to a combination of (CLn−1=1) and (CLn+1=5). By performing the re-judgment as described above, the judged level value DL is decided as the cell level CLn, and the cell level CLn is rewritten to the decided value DL in the RAM 31 (step S43).

Successively, judging multivalued levels of the following cells by using the multivalued data rewritten as above can further decrease a probability of erroneous judgment.

Besides, readings and writings from/to the RAMs 27, 30 and 31 and other operational processes are timed in synchronization with the sampling timing by the sampling-synchronization detecting unit 22 shown in FIG. 10.

Measuring error rates on an individual cell basis according to the present fourth embodiment has revealed that the error rate becomes approximately 0.4% in a case of a cell length being 0.40 μm, which is improved with respect to a level judgment based only on a present cell.

Next, a description will be given, with reference to FIG. 23 to FIG. 27, of a fifth embodiment according to the present invention. In the above-described embodiments, relations between the present cell and the preceding cell, the ensuing cell or the preceding cell and the ensuing cell are learned beforehand, and the learned table representing the learned results is used for judging a level of a present cell; however, the present fifth embodiment provides a method for judging a level of a present cell in which judgment processes as mentioned above are performed with respect to a plurality of consecutive cell rows so as to select out a plurality of correct-level candidate rows, among which a combination involving a smallest error is determined as a judged level value of the present cell.

A description will be given, with reference to FIG. 23, of a concept of the present fifth embodiment. First, an operation begins with a known multivalued level as an initial value. The preceding-cell reference table 33 is referred to according to this known initial value so as to select three candidates (a cell level value involving a smallest error between y and yi, a level value equaling the cell level value plus 1, and a level value equaling the cell level value minus 1). Similarly, with these three candidates being as known values, the preceding-cell reference table 33 is referred to according to these known values so as to select further three candidates. By the heretofore-performed operation, combinations of nine candidates can be extracted as combinations of a present-cell level and an ensuing-cell level.

Figures 23, 24:
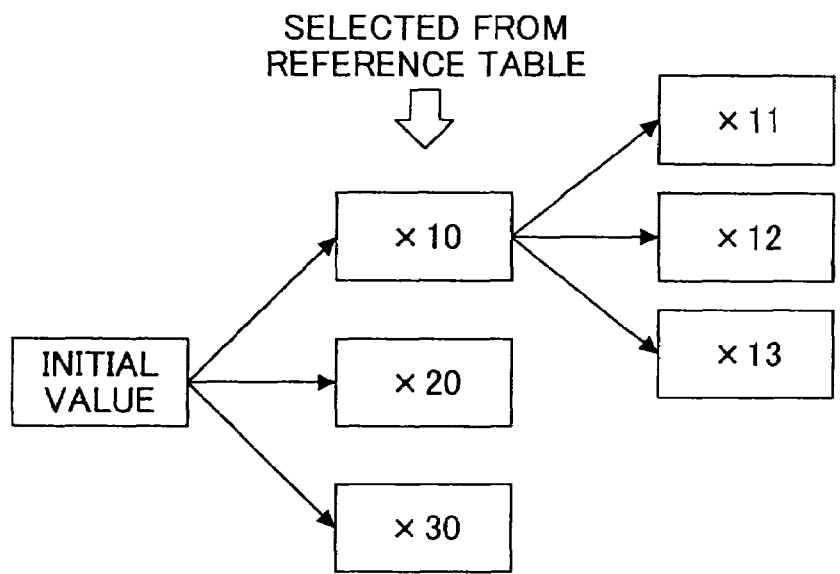
FIG. 23 is an explanatory diagram symbolically illustrating a method for judging a multivalued level according to a fifth embodiment of the present invention.
FIG. 24 is an explanatory diagram illustrating an error sum algorithm thereof.
Figure 25:
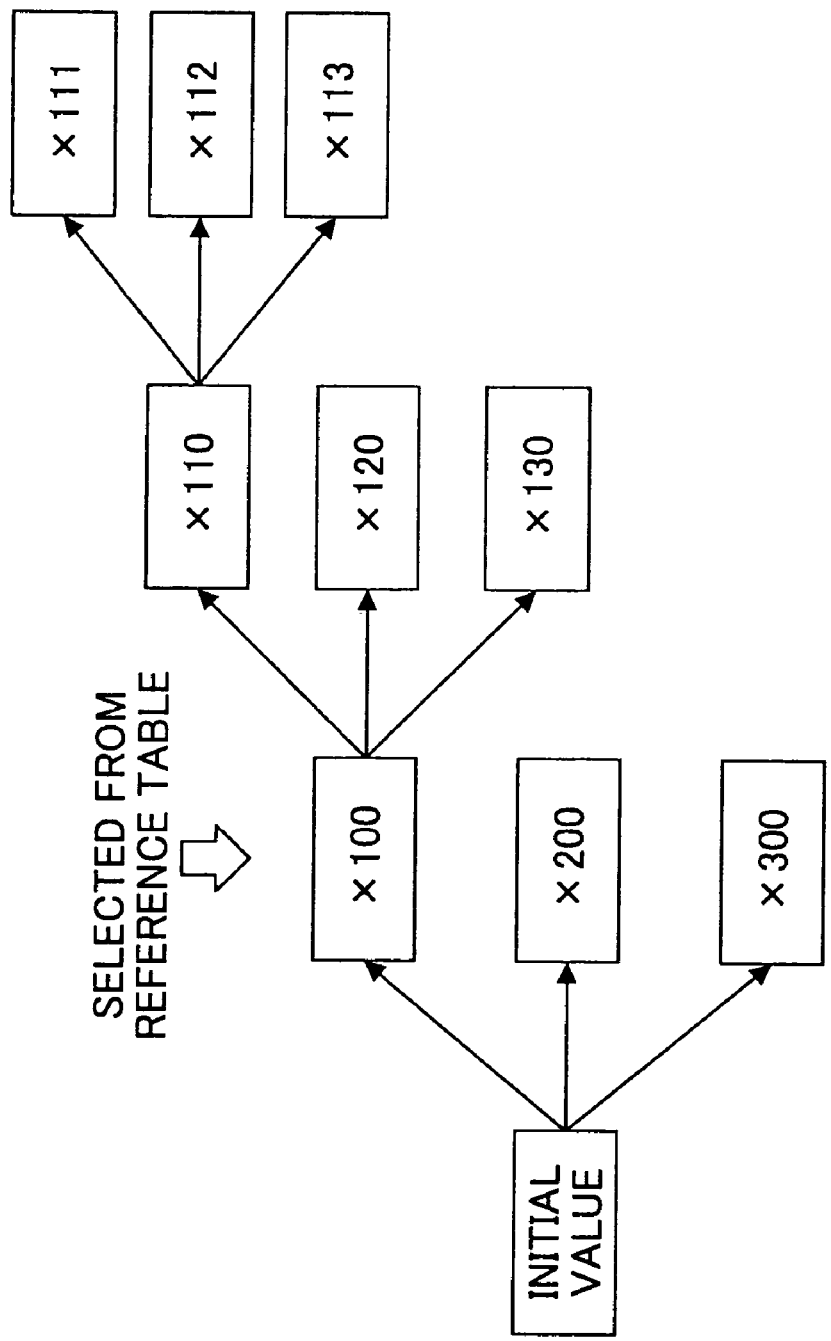
FIG. 25 is an explanatory diagram symbolically illustrating a variation of the method for judging a multivalued level according to the fifth embodiment of the present invention.

With respect to each of these combinations of the nine candidates, a sum of squares $\Sigma(\sigma i0^2+\sigma ij^2)$ of errors between the learned table and observed values is calculated, where $1 \leq i, j \leq 3$ stands (see FIG. 24). A combination involving the smallest sum of squares of errors is calculated so as to determine a judged level value of the present cell corresponding to this combination to be a correct level. Repeating this operation successively can further enhance a probability of obtaining a correct level. Additionally, although selection of candidates is performed with respect only to combinations of a present cell and an ensuing cell in the present fifth embodiment, the selection of candidates may be repeated with respect further to a cell following the ensuing cell, as shown in FIG. 25 and FIG. 26, so as to further enhance a probability of obtaining a correct level.

In the present fifth embodiment, the table referred to according to a preceding-cell level (the preceding-cell reference table 33) is used; however, a probability of obtaining a correct judgment can be similarly enhanced by a method of judging a level of only the present cell first, and based on a result of this judgment, switching the preceding-cell reference table 33 and the ensuing-cell reference table 35 as described above; alternatively, a probability of obtaining a correct judgment can be similarly enhanced by performing the selection of candidate values and the calculation of errors by using the three-successive-recording-mark learned table 37.

FIG. 27 is a flowchart showing an algorithm of extracting combinations of candidate values for a present cell and an ensuing cell, and selecting a correct combination, by using the three-successive-recording-mark learned table 37. Processes in steps S1 to S6 and S41 shown in FIG. 27 are performed in the same manner as in the steps S1 to S6 and S41 shown in FIG. 22. After the step S41, based on a comparison between y and yi, candidate values X10, X20 and X30 are selected (step S51), and errors $\sigma 10$, $\sigma 20$ and $\sigma 30$ between y and yi are calculated (step S52). Thereafter, assuming one candidate value X10 to be CLn, comparison reference values y0 to y7 for a present-cell level are extracted according to a relation between CLn−1 and CLn+1 (step S53). Then, according to a comparison between y and yi, candidate values X11, X12 and X13 are selected (step S54), and errors $\sigma 11$, $\sigma 12$ and $\sigma 13$ between y and yi are calculated (step S55).

Also, assuming another candidate value X20 to be CLn, comparison reference values y0 to y7 for the present-cell level are extracted according to a relation between CLn−1 and CLn+1 (step S56). Then, according to a comparison between y and yi, candidate values X21, X22 and X23 are selected (step S57), and errors $\sigma 21$, $\sigma 22$ and $\sigma 23$ between y and yi are calculated (step S58). Similarly, assuming another candidate value X30 to be CLn, comparison reference values y0 to y7 for the present-cell level are extracted according to a relation between CLn−1 and CLn+1 (step S59). Then, according to a comparison between y and yi, candidate values X31, X32 and X33 are selected (step S60), and errors $\sigma 31$, $\sigma 32$ and $\sigma 33$ between y and yi are calculated (step S61).

Based on results of these calculations, a combination path involving the smallest sum of squares of errors is found to be correct so as to determine the cell level CLn corresponding to this combination as a judged level value DLn (step S62).

Besides, as a method for reducing an amount of calculation, not only the present cell, but also the ensuing cell of the above-mentioned combination involving the smallest sum of squares of errors may be treated as correct. Specifically, the above-described operation may be commenced successively by treating the ensuing cell as having a known value in a following process. Additionally, although the present fifth embodiment uses a combination of the three candidates "a cell level value involving a smallest error between y and yi, a level value equaling the cell level value plus 1, and a level value equaling the cell level value minus 1," using two candidates close to y can reduce an amount of calculation. In this case, the number of combinations of candidates for a present cell and an ensuing cell becomes four so as to reduce an amount of calculation by more than half.

In addition, although the above-described embodiments feature a system with which a user can record and reproduce information, the same applies to a ROM (Read Only Memory) disc as a recording medium used only for reproduction. For instance, the learned patterns used for creating the present-cell judgment table 29, the preceding-cell reference table 33 and the ensuing-cell reference table 35 are formed beforehand as phase pits (pits formed on a disc substrate in an uneven form) together with ROM information used by a user. Reading these learned patterns as described above enables a prevention of an erroneous judgment of a level also in a ROM disc.

Further, in the above-described embodiments, the learned information area is provided on the innermost area of the recording medium 3 on which user data is not recorded; however, the learned information area may be provided at a head of each block (e.g., a unit of 256 cells, i.e., a unit of 256*3 bits) in which user data is recorded. According to this arrangement, recording/reproducing can be performed while learning so as to further decrease a probability of erroneous judgment.

Next, a description will be given, with reference to FIG. 28 to FIG. 30, of a sixth embodiment according to the present invention. The present sixth embodiment adopts the first principle and the sixth principle of the present invention.

Figure 28:
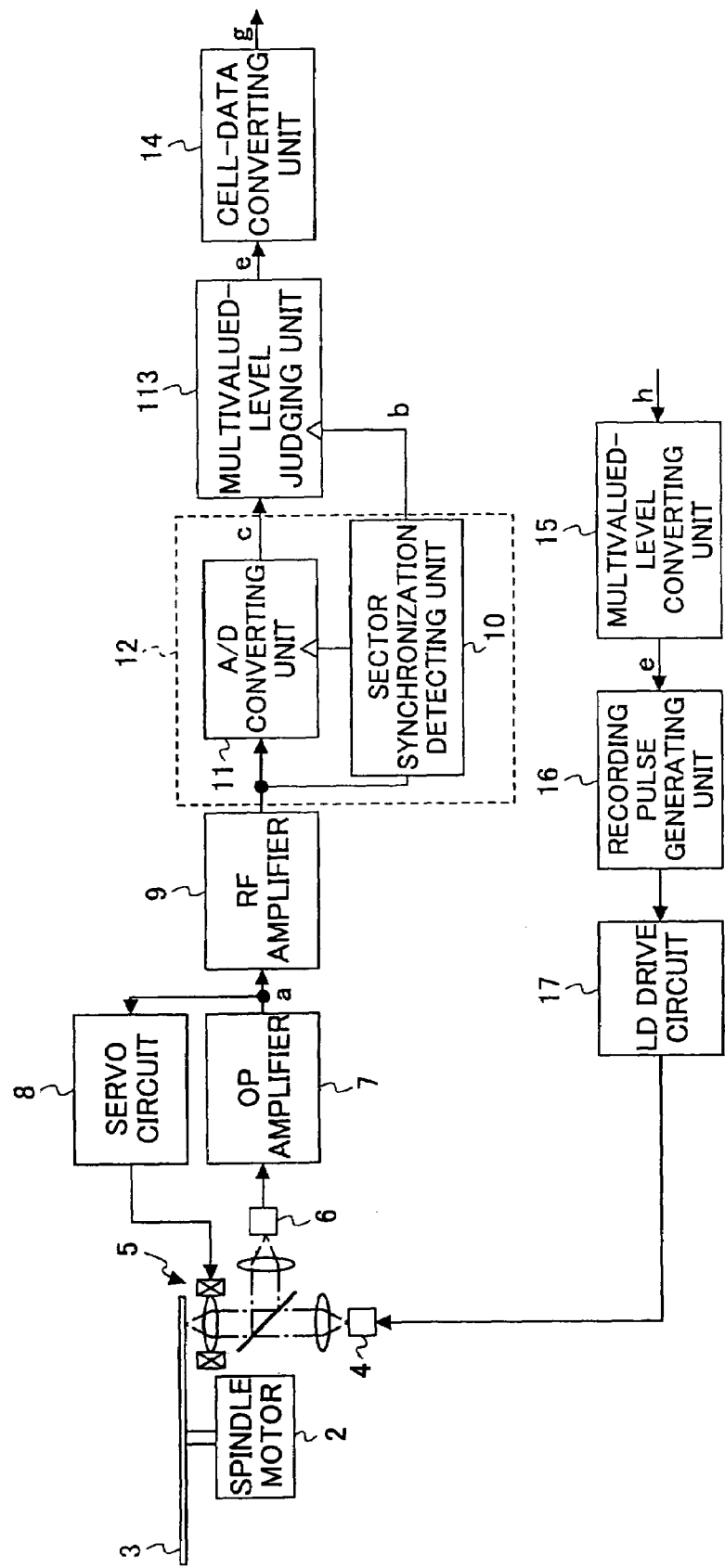
FIG. 28 is a block diagram of an information recording/reproducing device according to a sixth embodiment of the present invention.

As shown in FIG. 28, an information recording/reproducing device according to the present sixth embodiment has basically the same structure as the information recording/reproducing device shown in FIG. 7, except the hereinbelow-described points. In the present sixth embodiment using the first principle and the sixth principle, upon recording information on the information recording medium 3, while performing a recording with N-valued marks (N=8), an M-valued mark (M=4) with a reduced number of levels is recorded on one cell in every predetermined number (=3) of cells, as described above with reference to FIG. 1C; by reproducing information according to the first principle from the information recording medium 3 on which multivalued information is recorded as described above, an erroneous judgment with respect to a multivalued level can be prevented, and also successive erroneous readings starting from one erroneous reading of a cell level due to a defect and so forth can be prevented.

Figure 29:
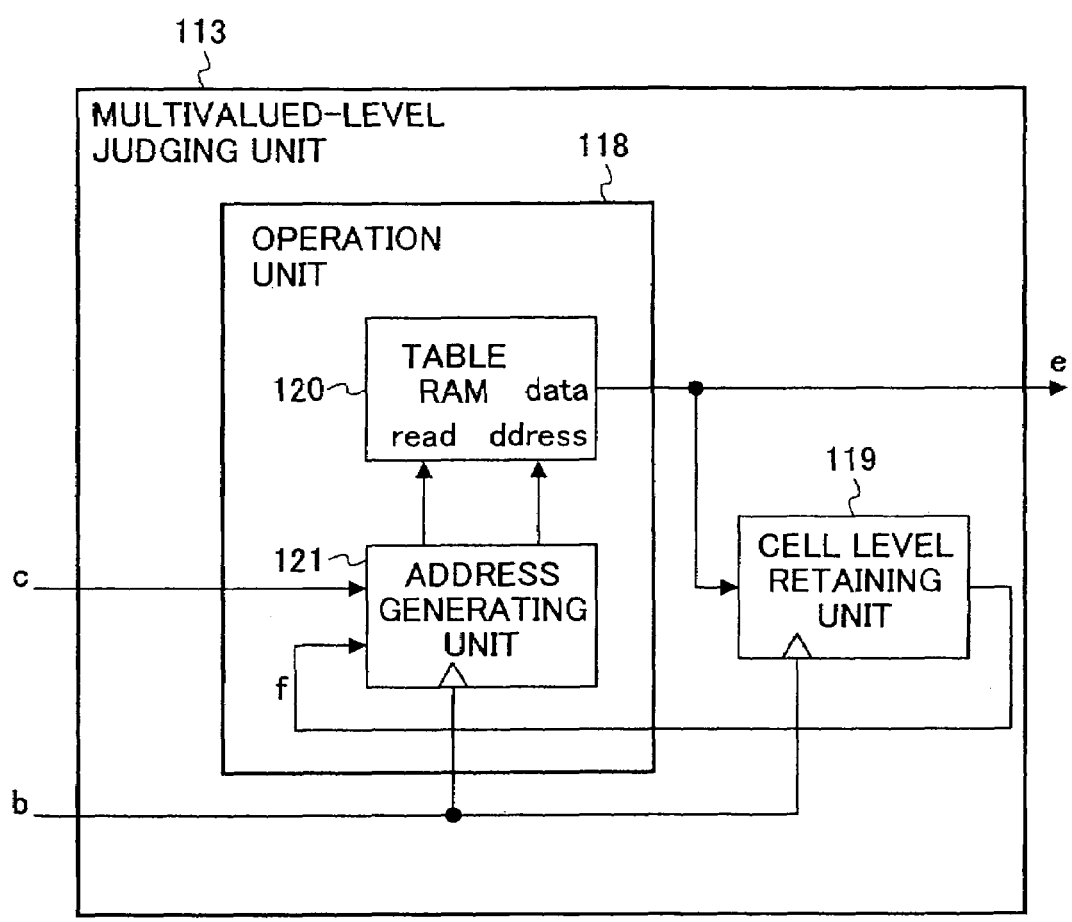
FIG. 29 is a block diagram of an example of a structure of a multivalued-level judging unit thereof.

Therefor, a multivalued-level judging unit 113 according to the present sixth embodiment comprises an operation unit 118 judging a cell level, and a cell level retaining unit (a judged level value retaining unit) 119 retaining cell level data of a preceding cell, as shown in FIG. 29. The operation unit 118 comprises a table RAM 120 storing level data corresponding to each input digital data (each reproduction level), and an address generating unit 121 reading cell level data e from the table RAM 120 according to a preceding cell level f and a value of the digital data c.

The table RAM 120 comprises a preceding-cell-based table area (addresses 0-8191) storing groups of cell level data determined according to each of cell levels of a preceding cell, and a four-valued cell table area (addresses 8192-9215) storing cell level data of four-valued cells, as shown in FIG. 30. That is, the table RAM 120 stores cell level data at addresses corresponding to values of the digital data c, the cell level data being divided according to cell level data of a preceding cell. For example, when the cell level data of the preceding cell is "2", and the digital data is "131", cell level data "1" is read from an address of "2*1024+131". That is, by adding an offset generated from the cell level data of the preceding cell to the address of the digital data and reading from the address, criteria for judging the cell level can be changed according to the preceding cell so as to generate the cell level thereby. This 3-bit cell level data row reproduced from each cell is collected by the cell-data converting unit 14 so as to form the reproduction information g which is an 8-bit data row. As for a cell on which a four-valued mark is recorded, a level thereof is judged according to the four-valued cell table area. As described above, since the table RAM 120 separately comprises the preceding-cell-based table area (addresses 0-8191) and the four-valued cell table area (addresses 8192-9215), numbers of multivalued judgment levels can be switched between eight values and four values. Thus, multivalued levels of cells having different numbers of levels are judged by accessing appropriate addresses on the table RAM 120.

Figure 31:
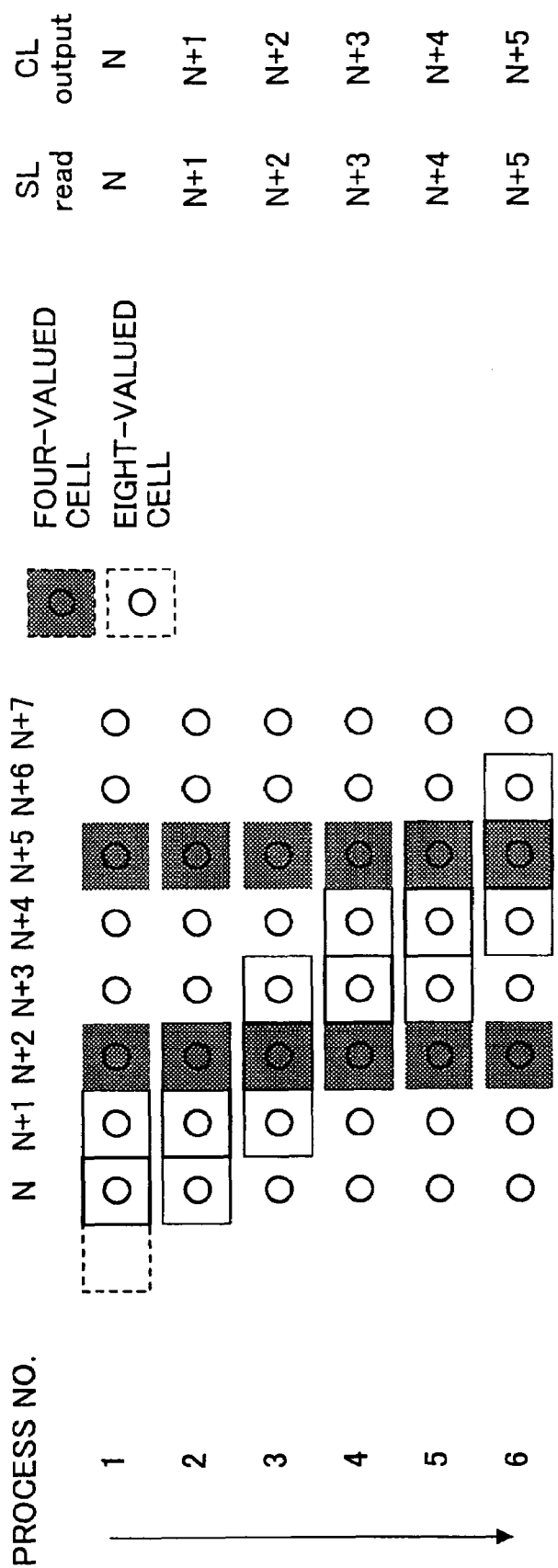
FIG. 31 is a process transition diagram illustrating an example of an information reproducing process according to the sixth embodiment of the present invention.
Figure 32:
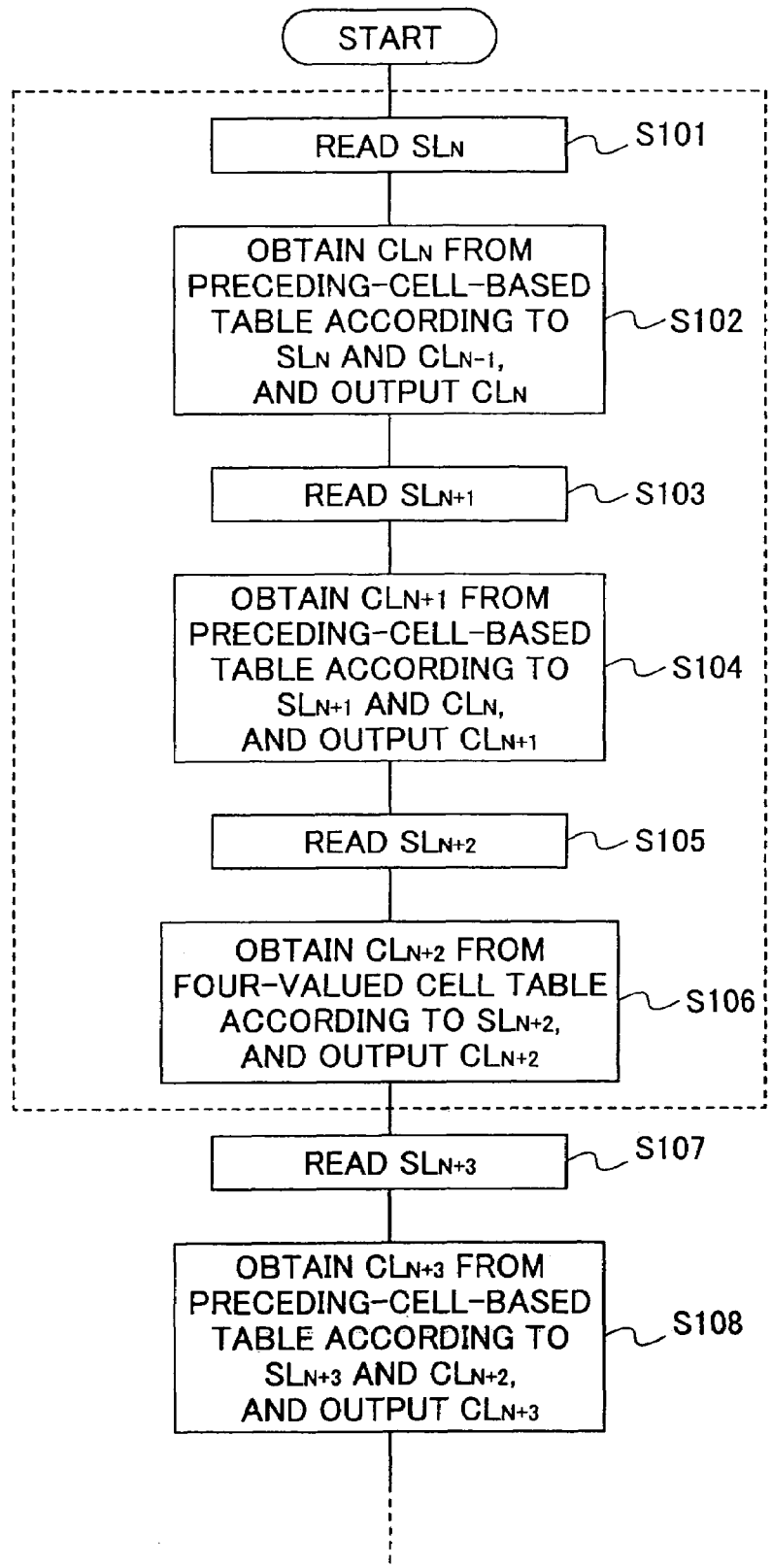
FIG. 32 is a flowchart of the example of the information reproducing process according to the sixth embodiment of the present invention.

A description will be given, with reference to a process transition diagram shown in FIG. 31 and a flowchart shown in FIG. 32, of an example of an information reproducing process according to the present sixth embodiment. In this example, multivalued information is recorded on the information recording medium 3 such that a four-valued mark is recorded on one cell in every three cells, as shown in FIG. 1C and FIG. 31, according to the method indicated in FIG. 6A with the lowest-order bit being fixed at 0.

First, digital data $SL_N$ of an Nth cell is read (step S101 shown in FIG. 32), and cell level data $CL_N$ thereof is obtained from the preceding-cell-based table area of the table RAM 120 according to the digital data $SL_N$ and a known reproduction level $CL_{N-1}$ of a preceding cell located at a start of an information recording (step S102). By this process, the judged cell level of the Nth cell is retained in the cell level retaining unit 119 so as to be used for generating an address upon reproducing a next (N+1)st cell. Subsequently, digital data $SL_{N+1}$ of the (N+1)st cell is read (step S103), and cell level data $CL_{N+1}$ thereof is obtained from the preceding-cell-based table area of the table RAM 120 according to the digital data $SL_{N+1}$ and the cell level data $CL_N$ (step S104). Next, digital data $SL_{N+2}$ of an (N+2)nd cell is read (step S105). Since this (N+2)nd cell is a cell with a four-valued mark, cell level data $CL_{N+2}$ thereof is obtained from the four-valued cell table area of the table RAM 120 according to the digital data $SL_{N+2}$ alone by switching the number of multivalued judgment levels to four (=M) values (step S106). By this process, the judged (four-valued) cell level of the (N+2)nd cell is retained in the cell level retaining unit 119 so as to be used for generating an address upon reproducing a next (N+3)rd cell.

From step S107 onward, processes similar to the steps S101 to S106 are repeated so as to obtain a multivalued level of each cell of the information recording medium 3 on which a four-valued mark (with the lowest-order bit being fixed at 0) is recorded on one cell in every three cells.

The cell level data e of 3-bit cells obtained as above is converted by the cell-data converting unit 14 into an 8-bit data row by omitting the lowest-order bit of the four-valued cell, as shown in FIG. 1D, so as to form the reproduction information g.

According to the above-described information reproducing process, even when one cell is erroneously reproduced due to a defect and so forth, subsequent cells can be reproduced without causing successive errors.

Next, a description will be given, with reference to FIG. 33 to FIG. 36, of a seventh embodiment according to the present invention. The present seventh embodiment adopts the second principle and the sixth principle of the present invention. Upon recording multivalued information on the information recording medium 3, an M-valued mark (M=4) with the reduced number of levels is recorded on one cell in every two cells such that a cell with an N-valued mark (N=8) and a cell with an M-valued mark (M=4) alternate (see FIG. 35); thus-recorded information is reproduced from the information recording medium 3 by referring to a judged level value of an ensuing cell, whereby an erroneous detection of a multivalued level can be prevented, and also successive erroneous readings starting from one erroneous reading of a cell level due to a defect and so forth can be prevented.

Figure 33:
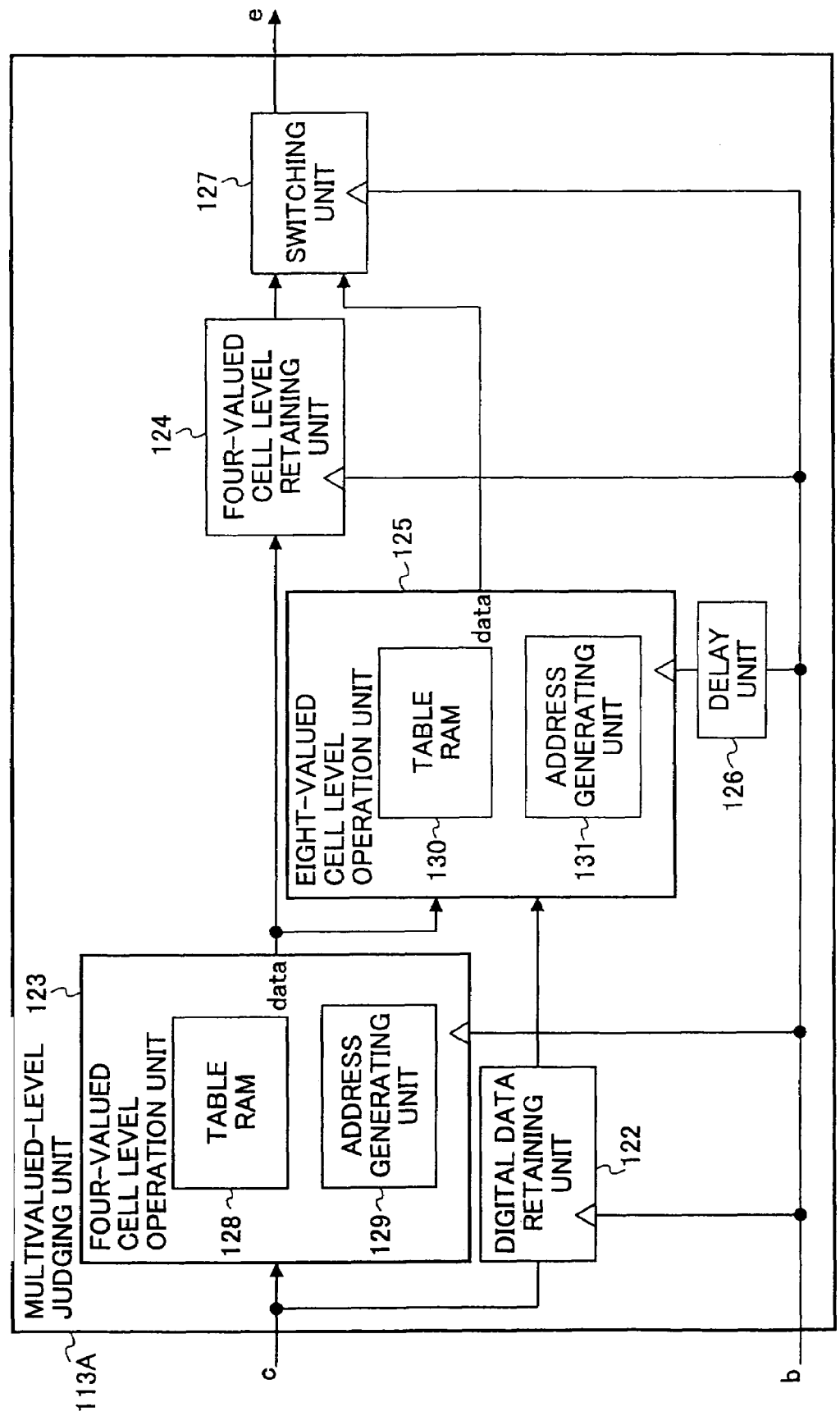
FIG. 33 is a block diagram of an example of a structure of a multivalued-level judging unit according to a seventh embodiment of the present invention.

In the present seventh embodiment, an information recording/reproducing device has basically the same structure as the information recording/reproducing device shown in FIG. 28, except that a multivalued-level judging unit 113A shown in FIG. 33 is used in place of the multivalued-level judging unit 113 shown in FIG. 29. The multivalued-level judging unit 113A according to the present seventh embodiment comprises a digital data retaining unit 122, a four-valued cell level operation unit 123 as an ensuing cell level operation unit, a four-valued cell level retaining unit 124, an eight-valued cell level operation unit 125, a delay unit 126, and a switching unit 127. The digital data retaining unit 122 retains digital data c of a preceding cell. The four-valued cell level operation unit 123 detects a cell level of an M-valued mark (M=4). The four-valued cell level retaining unit 124 retains the cell level data of a four-valued mark detected by the four-valued cell level operation unit 123, and outputs the cell level data of a four-valued mark upon reproducing a next cell level. The eight-valued cell level operation unit 125 detects a cell level of a present cell according to a cell level of an ensuing cell ensuing the present cell. The delay unit 126 delays an operational timing of the eight-valued cell level operation unit 125 by a one-cell period. The switching unit 127 switches output controls so as to alternately output the cell level of a four-valued mark detected by the four-valued cell level operation unit 123 and the cell level of an eight-valued mark detected by the eight-valued cell level operation unit 125.

Figures 34A, 34B:
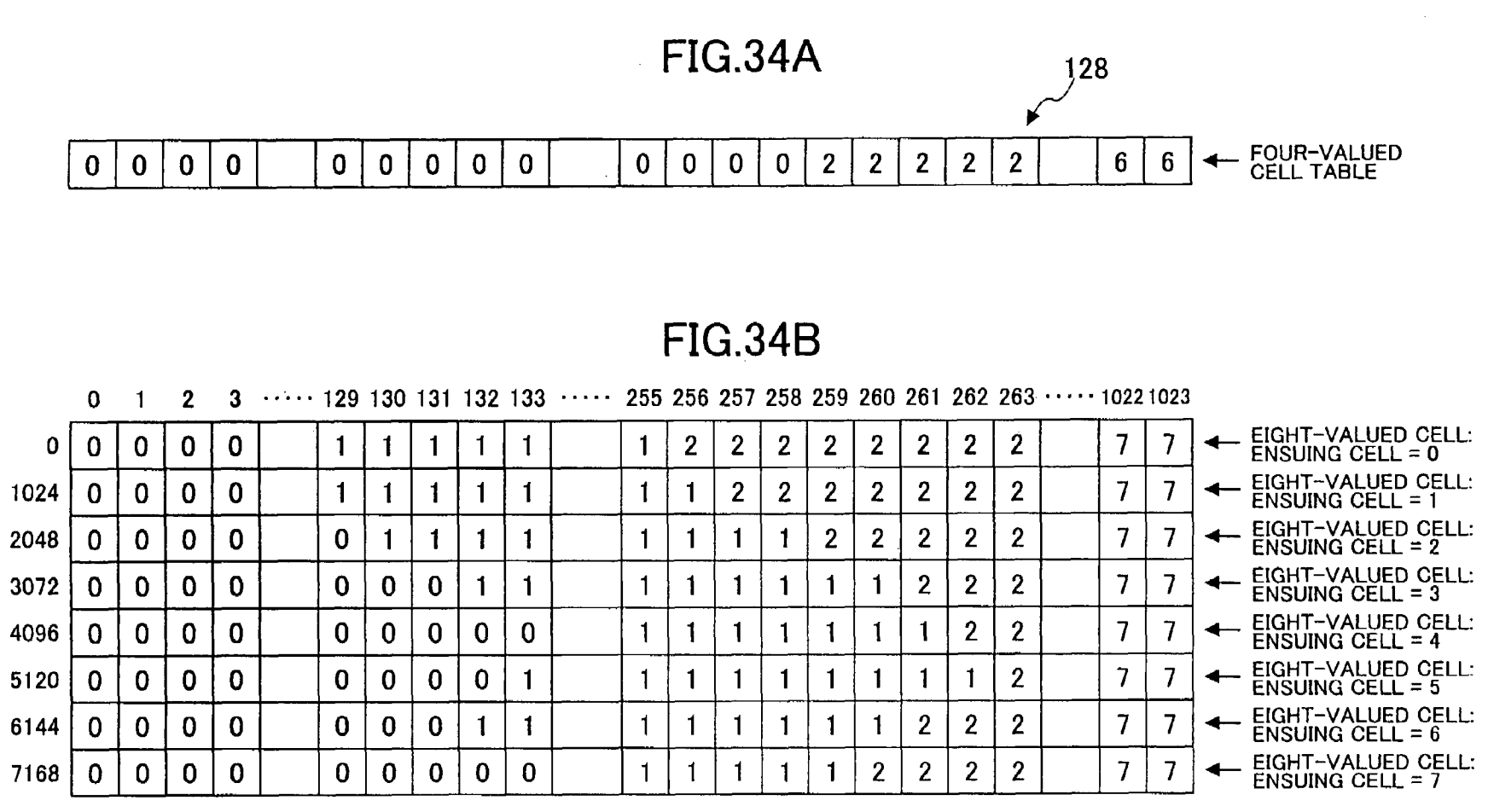

Similarly to the operation unit 118 shown in FIG. 29, the four-valued cell level operation unit 123 comprises a table RAM 128, and an address generating unit 129 generating an address on the table RAM 128 according to digital data c so as to read a cell level of a four-valued mark from the table RAM 128 according to the address. The table RAM 128 comprises only a four-valued cell table exclusively storing cell level data of a four-valued mark, as shown in FIG. 34A.

The eight-valued cell level operation unit 125 detects a cell level of a present cell by referring to a cell level of an ensuing cell, as mentioned above, and comprises a table RAM 130, and an address generating unit 131. The table RAM 130 comprises an ensuing-cell-based table storing cell levels of a present cell grouped according to each of cell levels of an ensuing cell, as shown in FIG. 34B. The address generating unit 131 reads cell level data from the table RAM 130 according to the digital data c.

Figure 35:
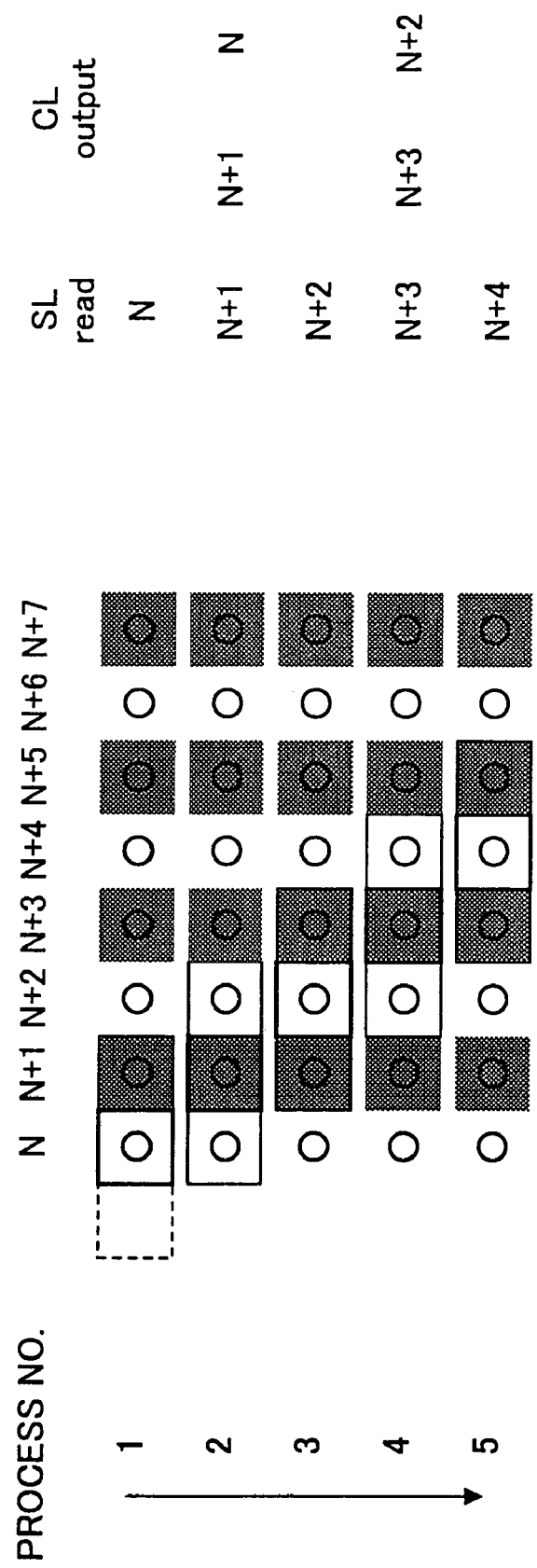
FIG. 35 is a process transition diagram illustrating an example of an information reproducing process according to the seventh embodiment of the present invention.
Figure 36:
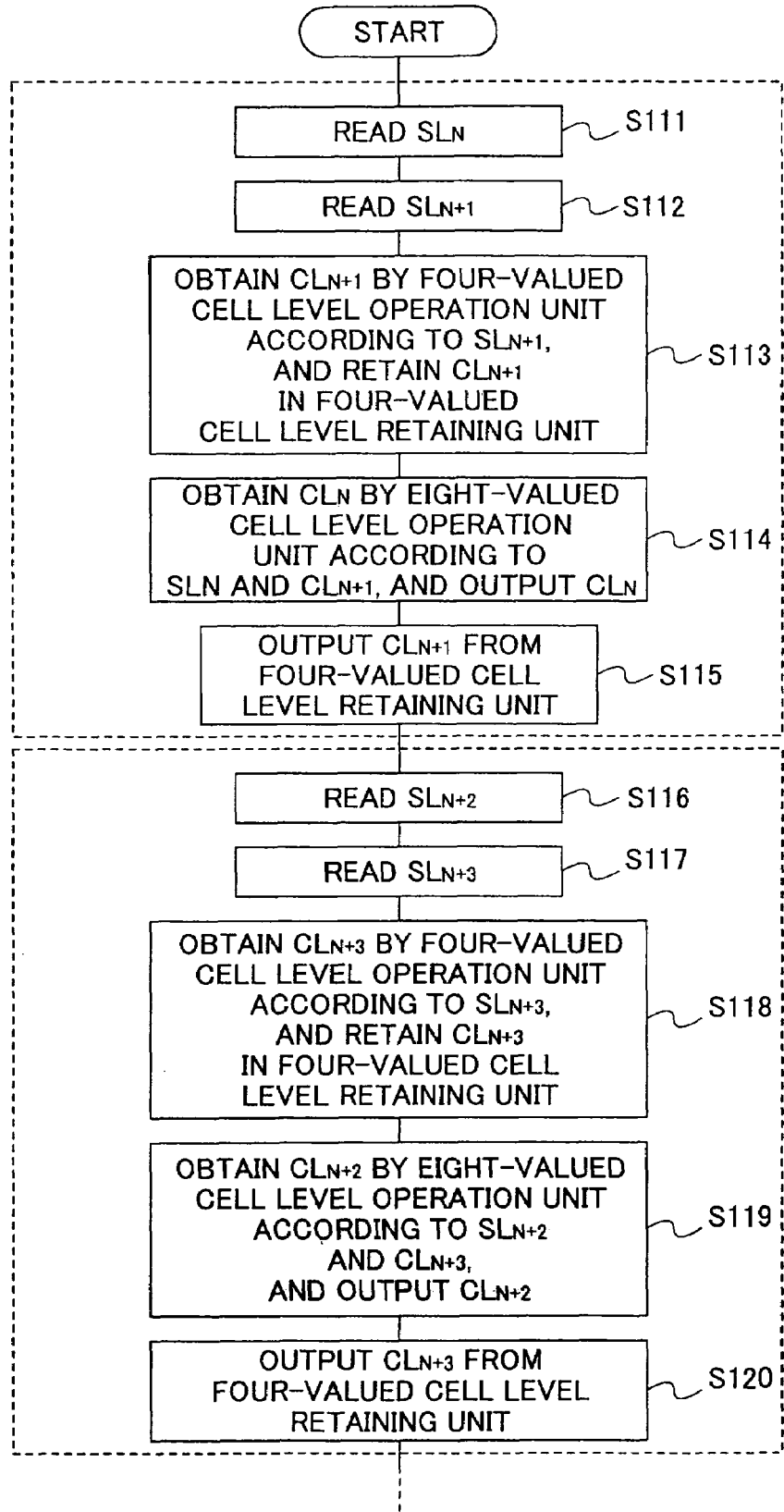
FIG. 36 is a flowchart of the example of the information reproducing process according to the seventh embodiment of the present invention.

With the above-described structure, a description will be given, with reference to a process transition diagram shown in FIG. 35 and a flowchart shown in FIG. 36, of an example of an information reproducing process according to the present seventh embodiment. In this example, multivalued information is recorded on the information recording medium 3 such that a four-valued mark is recorded on one cell in every two cells, as shown in FIG. 35, according to the method indicated in FIG. 6A with the lowest-order bit being fixed at 0.

First, digital data $SL_N$ of an Nth cell is read as digital data of a present cell (step S111), and the digital data $SL_N$ is retained in the digital data retaining unit 122. Successively, digital data $SL_{N+1}$ of an (N+1)st cell is also read (step S112). Since this (N+1)st cell is a cell with a four-valued mark, four-valued cell level data $CL_{N+1}$ thereof is read by the four-valued cell level operation unit 123 referring to the table RAM 128 according to the digital data $SL_{N+1}$ alone obtained from a reproduction signal, and the four-valued cell level data $CL_{N+1}$ is retained in the four-valued cell level retaining unit 124 (step S113). That is, an operation for an ensuing cell, i.e., the (N+1)st cell, is performed first. After this operation, according to the digital data $SL_N$ of the Nth cell retained in the digital data retaining unit 122 and the four-valued cell level data $CL_{N+1}$ supplied from the four-valued cell level operation unit 123, eight-valued cell level data $CL_N$ is read by the eight-valued cell level operation unit 125 referring to the table RAM 130, and is output via the switching unit 127 (step S114). Thereafter, the switching unit 127 switches output controls so as to output the four-valued cell level data $CL_{N+1}$ of the (N+1)st cell retained in the four-valued cell level retaining unit 124 (step S115). Thereby, the cell level data $CL_N$ and the cell level data $CL_{N+1}$ are output in a correct order.

From step S116 onward, processes similar to the steps S111 to S115 are repeated with respect to an (N+2)nd cell, an (N+3)rd cell, and so forth so as to obtain a cell level of each cell of the information recording medium 3 on which a four-valued mark is recorded on one cell in every two cells. Thus-obtained cell level data e of 3-bit cells is converted by the cell-data converting unit 14 into an 8-bit data row by omitting the lowest-order bit of the four-valued cell so as to form the reproduction information g.

According to the above-described information reproducing process, even when one cell is erroneously reproduced due to a defect and so forth, subsequent cells can be reproduced without causing successive errors.

Next, a description will be given, with reference to FIG. 37 to FIG. 40, of an eighth embodiment according to the present invention. The present eighth embodiment adopts the third principle and the sixth principle of the present invention. Upon recording multivalued information on the information recording medium 3, an M-valued mark (M=4) with the reduced number of levels is recorded on one cell in every two cells such that a cell with an N-valued mark (N=8) and a cell with an M-valued mark (M=4) alternate (see FIG. 39); thus-recorded information is reproduced from the information recording medium 3 by referring to judged level values of a preceding cell and an ensuing cell, whereby an erroneous detection of a multivalued level can be prevented, and also successive erroneous readings starting from one erroneous reading of a cell level due to a defect and so forth can be prevented.

Figure 37:
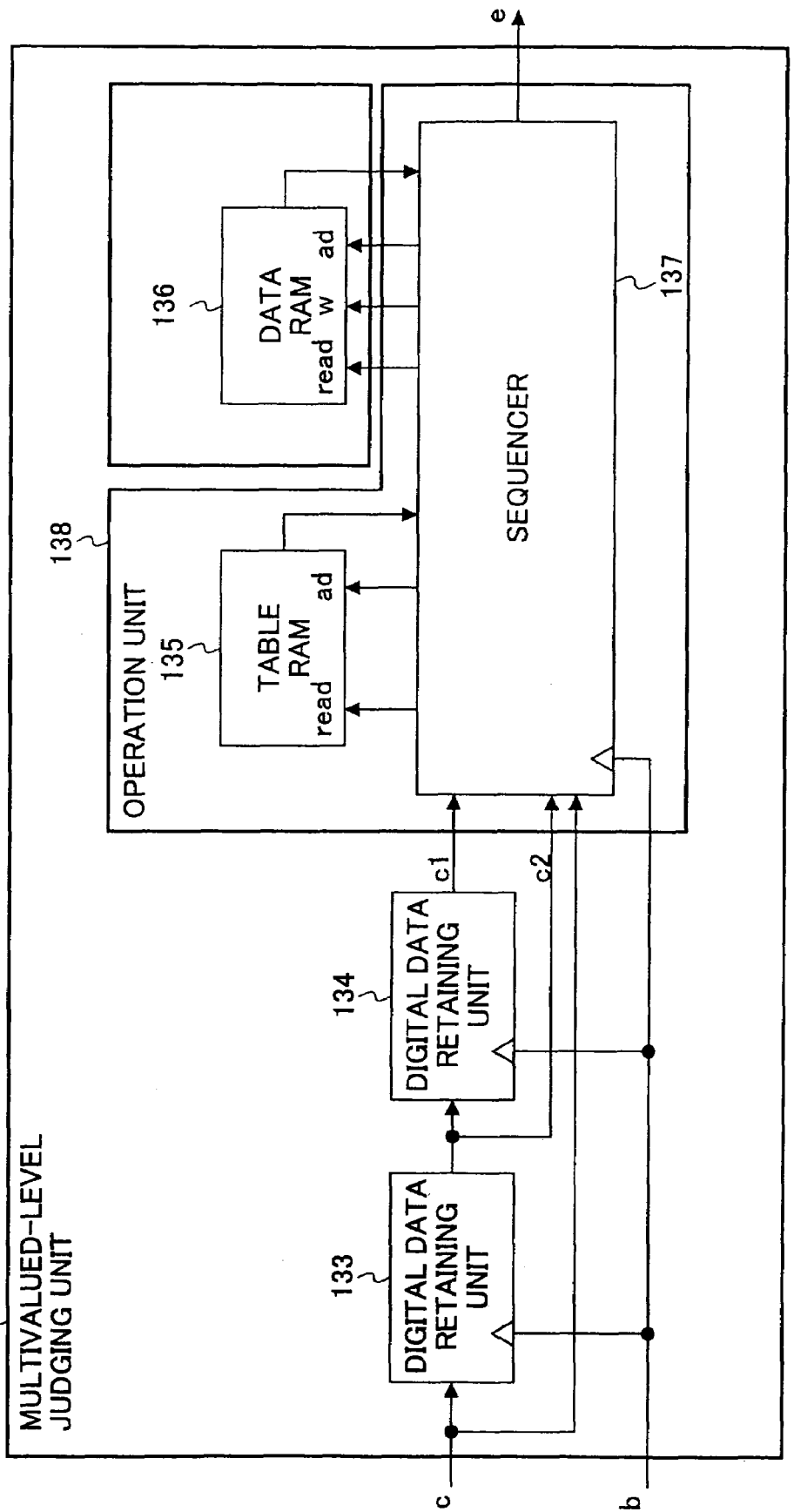
FIG. 37 is a block diagram of an example of a structure of a multivalued-level judging unit according to an eighth embodiment of the present invention.

In the present eighth embodiment, an information recording/reproducing device has basically the same structure as the information recording/reproducing device shown in FIG. 28, except that a multivalued-level judging unit 113B shown in FIG. 37 is used in place of the multivalued-level judging unit 113 shown in FIG. 29. The multivalued-level judging unit 113B according to the present eighth embodiment comprises a digital data retaining unit 133, a digital data retaining unit 134, a table RAM 135, a data RAM 136 corresponding to the cell level retaining unit 119, and a sequencer 137. The digital data retaining unit 133 retains digital data c2 of a first preceding cell. The digital data retaining unit 134 retains digital data c1 of a second preceding cell preceding the first preceding cell. The table RAM 135 stores cell levels to be detected in an information reproducing process. The data RAM 136 temporarily retains detected and judged cell level data. The sequencer 137 controls the data RAM 136 and the table RAM 135. In the present eighth embodiment, the sequencer 137 and the table RAM 135 together form an operation unit 138 judging a cell level.

Figure 38:
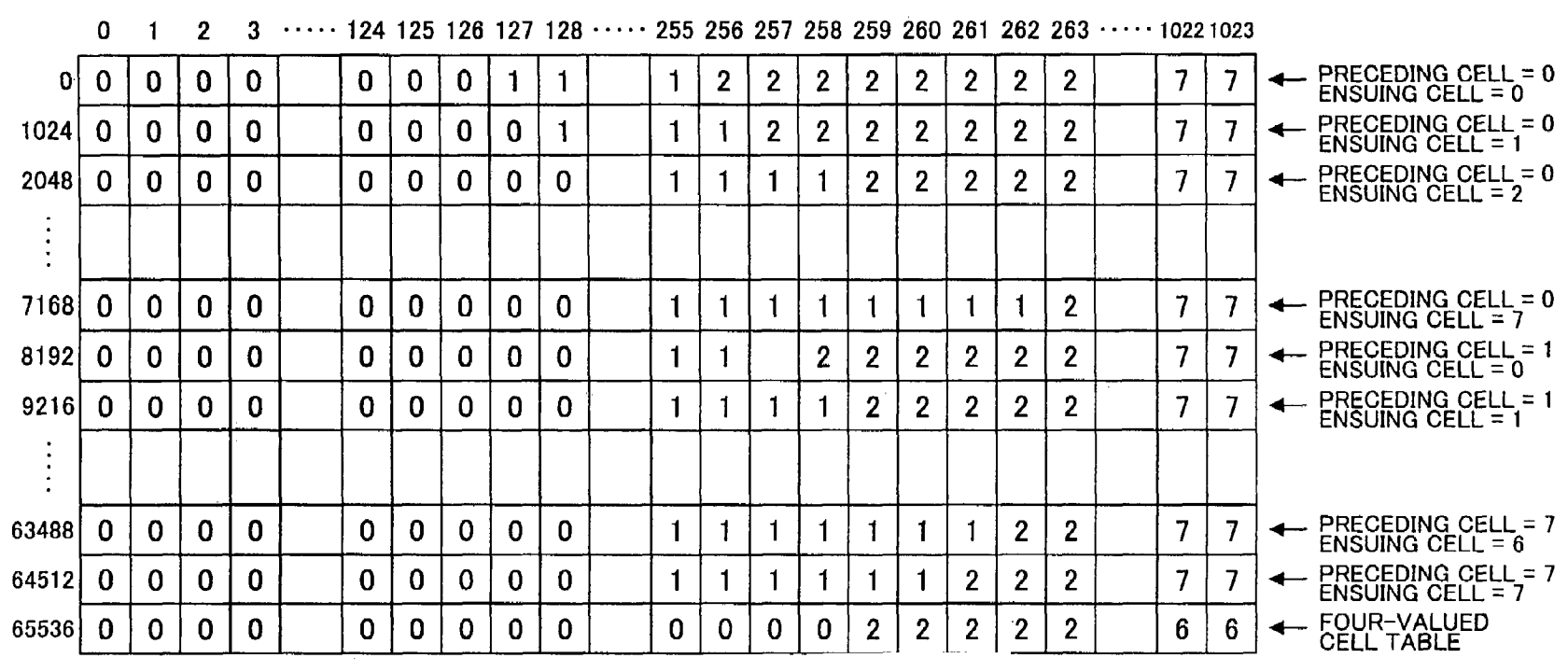

The table RAM 135 according to the present eighth embodiment comprises a preceding-and-ensuing-cell-based table area (addresses 0-65535) storing groups of cell level data determined according to each of cell levels of a preceding cell and an ensuing cell, and a four-valued cell table area (addresses 65536-66559) storing cell level data of four-valued cells, as shown in FIG. 38. That is, the table RAM 135 stores cell level data at addresses corresponding to values of digital data c, the cell level data being divided according to cell level data of a preceding cell and an ensuing cell. For example, when the cell level data of the preceding cell is "0", the cell level data of the ensuing cell is "2", and the digital data is "259", cell level data "2" is read from an address of "2*1024+259". As for a cell on which a four-valued mark is recorded, a level thereof is judged according to the four-valued cell table area. As described above, since the table RAM 135 separately comprises the preceding-and-ensuing-cell-based table area (addresses 0-65535) and the four-valued cell table area (addresses 65536-66559), numbers of multivalued judgment levels can be switched between eight values and four values. Thus, multivalued levels of cells having different numbers of levels are judged by accessing appropriate addresses on the table RAM 135.

Figure 39:
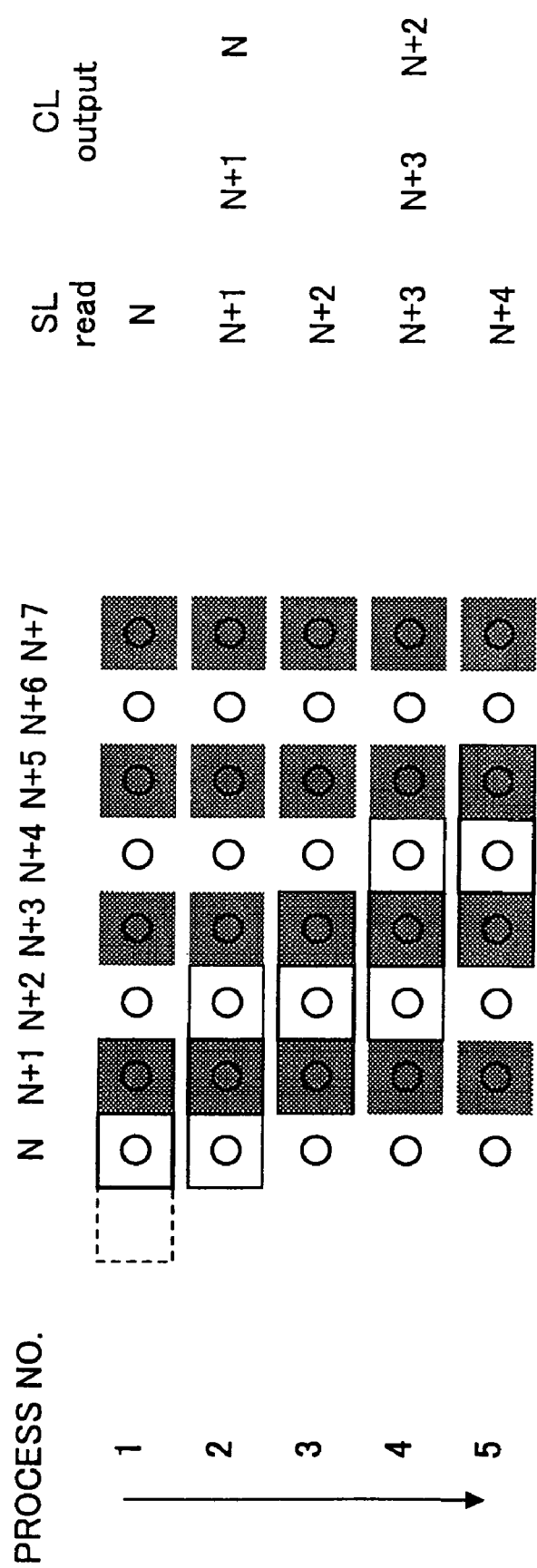
FIG. 39 is a process transition diagram illustrating an example of an information reproducing process according to the eighth embodiment of the present invention.
Figure 40:
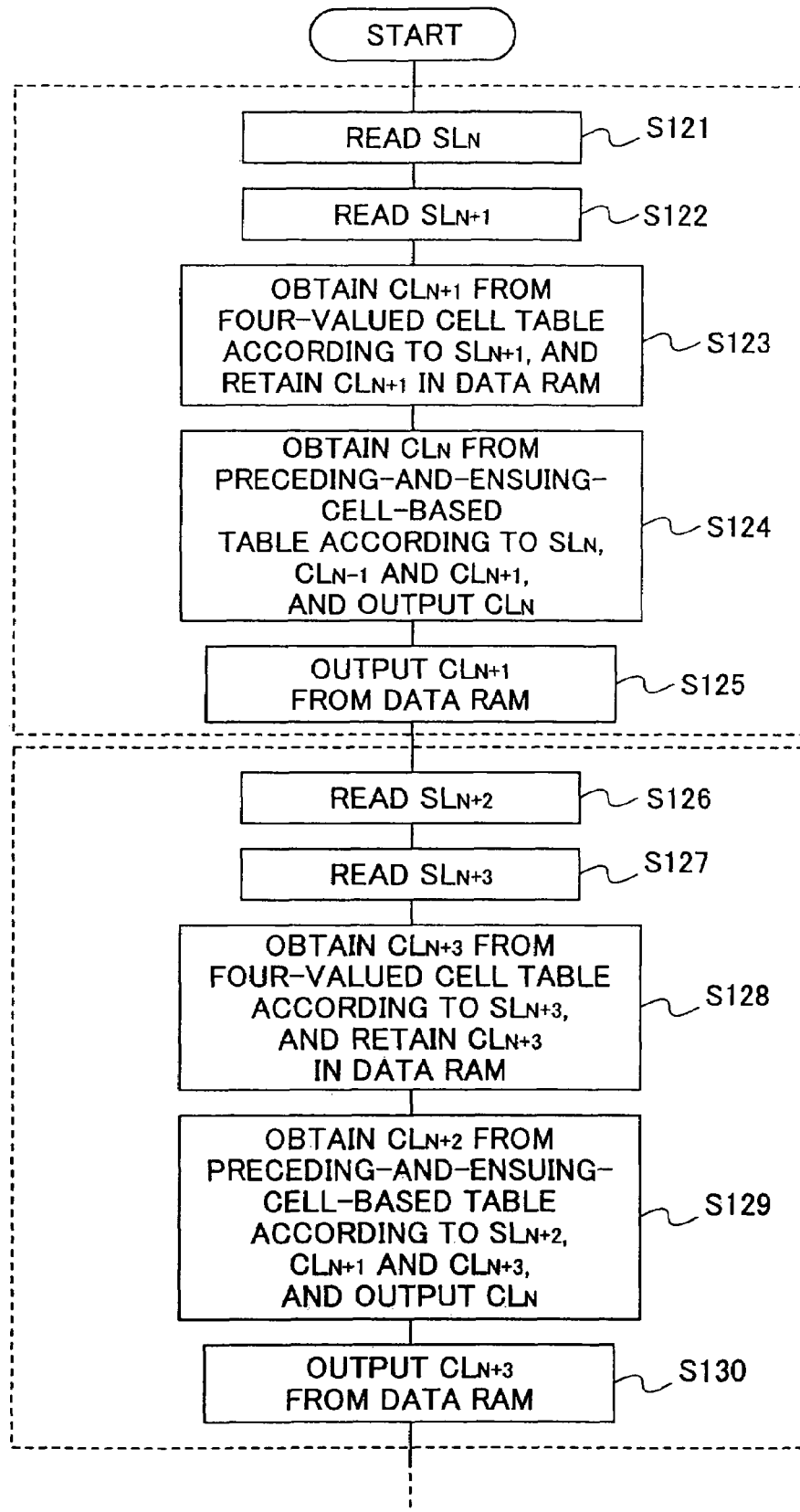
FIG. 40 is a flowchart of the example of the information reproducing process according to the eighth embodiment of the present invention.

With the above-described structure, a description will be given, with reference to a process transition diagram shown in FIG. 39 and a flowchart shown in FIG. 40, of an example of an information reproducing process according to the present eighth embodiment. In this example, multivalued information is recorded on the information recording medium 3 such that a four-valued mark is recorded on one cell in every two cells, as shown in FIG. 39, according to the method indicated in FIG. 6A with the lowest-order bit being fixed at 0. Besides, a known reproduction level $CL_{N-1}$ of a preceding cell at a start of an information recording is stored in the data RAM 136.

First, digital data $SL_N$ of an Nth cell with an eight-valued mark is read as digital data of a present cell (step S121), and the digital data $SL_N$ is retained in the digital data retaining unit 133. Successively, digital data $SL_{N+1}$ of an (N+1)st cell is also read (step S122). Since this (N+1)st cell is a cell with a four-valued mark, four-valued cell level data $CL_{N+1}$ thereof is read by the operation unit 138 referring to the four-valued cell table area in the table RAM 135 according to the digital data $SL_{N+1}$ alone obtained from a reproduction signal, and the four-valued cell level data $CL_{N+1}$ is retained in the data RAM 136 (step S123). After this operation, according to the digital data $SL_N$ of the Nth cell retained in the digital data retaining unit 133 and the judged cell level data $CL_{N-1}$ and $CL_{N+1}$ stored in the data RAM 136, eight-valued cell level data $CL_N$ is read by the operation unit 138 referring to the preceding-and-ensuing-cell-based table area of the table RAM 135, and is output under control of the sequencer 137 (step S124). Subsequently, under control of the sequencer 137, the four-valued cell level data $CL_{N+1}$ of the (N+1)st cell stored in the data RAM 136 is output (step S125). Thereby, the cell level data $CL_N$ and the cell level data $CL_{N+1}$ are output in a correct order.

From step S126 onward, processes similar to the steps S121 to S125 are repeated with respect to an (N+2)nd cell, an (N+3)rd cell, and so forth so as to obtain a cell level of each cell of the information recording medium 3 on which a four-valued mark is recorded on one cell in every two cells. Thus-obtained cell level data e of 3-bit cells is converted by the cell-data converting unit 14 into an 8-bit data row by omitting the lowest-order bit of the four-valued cell so as to form the reproduction information g.

According to the above-described information reproducing process, even when one cell is erroneously reproduced due to a defect and so forth, subsequent cells can be reproduced without causing successive errors.

Next, a description will be given, with reference to FIG. 4 to FIG. 43, of a ninth embodiment according to the present invention. The present ninth embodiment adopts the first principle, the second principle and the sixth principle of the present invention. On the information recording medium 3, a four-valued mark is recorded on one cell in every three cells, as in the case described above with reference to FIG. 1C. In the present ninth embodiment, an information recording/reproducing device has the same structure as the information recording/reproducing device shown in FIG. 28, and a multivalued-level judging unit has the same structure as the multivalued-level judging unit 113B shown in FIG. 37, except that the table RAM 135 according to the present ninth embodiment comprises a preceding-cell-based table area (addresses 0-8191), a four-valued cell table area (addresses 8192-9215), and an ensuing-cell-based table area (addresses 9216-17407) as shown in FIG. 41. That is, the table RAM 135 according to the present ninth embodiment has an arrangement equivalent to a combination of the table RAM 120 shown in FIG. 30 and the table RAM 130 shown in FIG. 34B.

Figure 42:
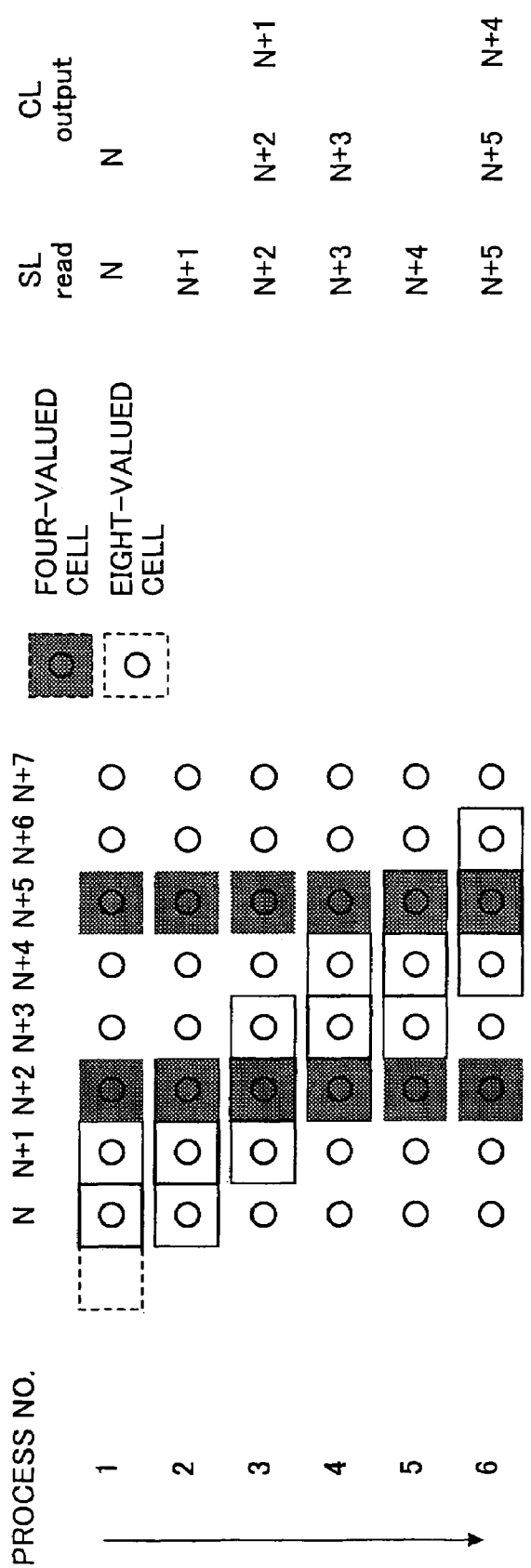
FIG. 42 is a process transition diagram illustrating an example of an information reproducing process according to the ninth embodiment of the present invention.
Figure 43:
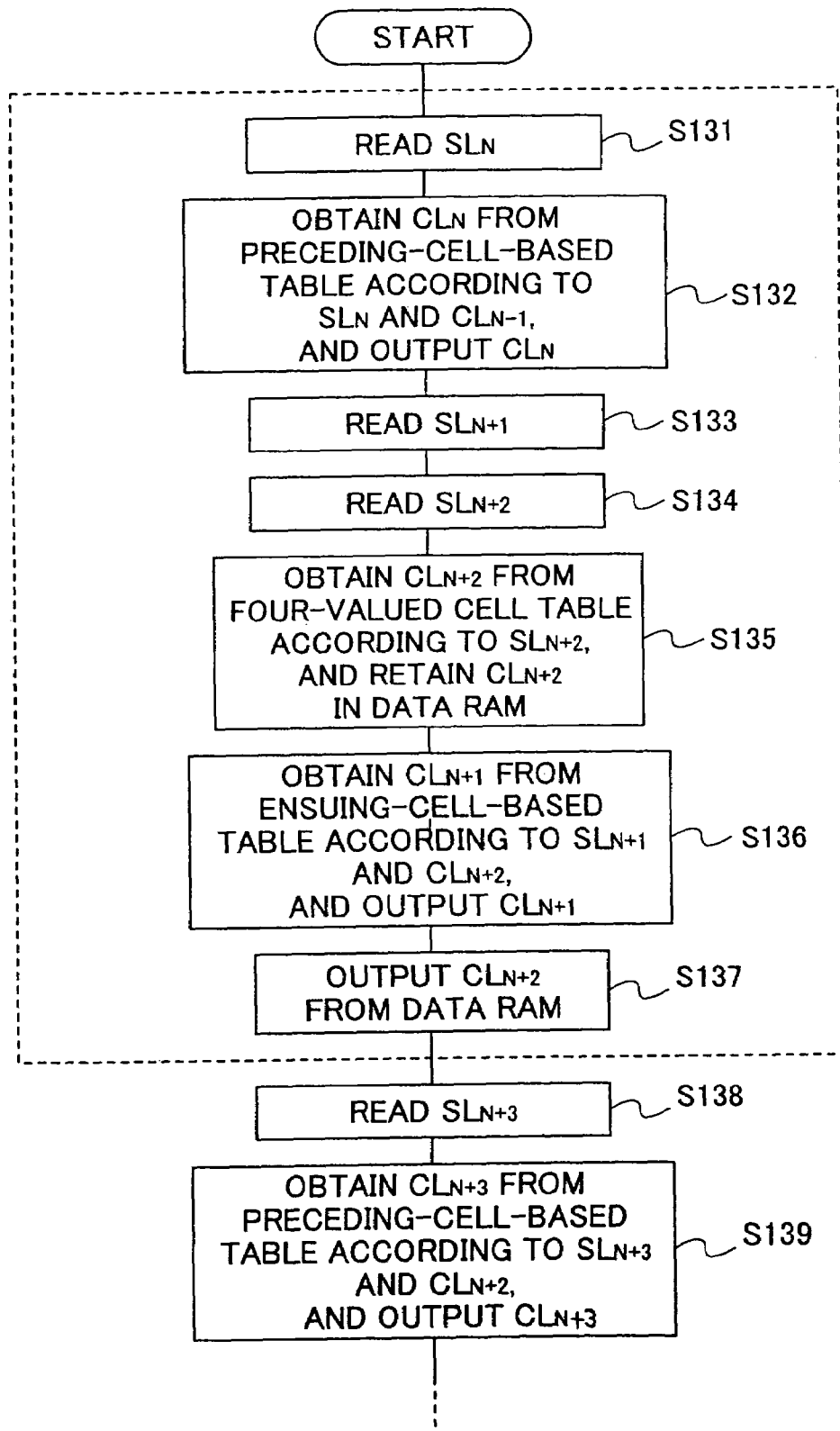
FIG. 43 is a flowchart of the example of the information reproducing process according to the ninth embodiment of the present invention.

With the above-described structure, a description will be given, with reference to a process transition diagram shown in FIG. 42 and a flowchart shown in FIG. 43, of an example of an information reproducing process according to the present ninth embodiment. In this example, multivalued information is recorded on the information recording medium 3 such that a four-valued mark is recorded on one cell in every three cells, as shown in FIG. 42, according to the method indicated in FIG. 6A with the lowest-order bit being fixed at 0. This flowchart for detecting cell levels includes a reading of cell level data of a cell with a four-valued mark from the four-valued cell table area, a reading of cell level data of a cell with an eight-valued mark following immediately after the cell with the four-valued mark from the preceding-cell-based table area according to the cell level data of the four-valued mark, and a reading of cell level data of a cell with an eight-valued mark preceding immediately before the cell with the four-valued mark from the ensuing-cell-based table area according to the cell level data of the four-valued mark.

First, digital data $SL_N$ of an Nth cell with an eight-valued mark is read (step S131), and cell level data $CL_N$ thereof is obtained from the preceding-cell-based table area of the table RAM 135 shown in FIG. 41 according to the digital data $SL_N$ and a known reproduction level $CL_{N-1}$ of a preceding cell located at a start of an information recording and is output (step S132). Subsequently, digital data $SL_{N+1}$ of an (N+1)st cell with an eight-valued mark is read (step S133), and the digital data $SL_{N+1}$ is retained in the digital data retaining unit 133. Successively, digital data $SL_{N+2}$ of an (N+2)nd cell is also read (step S134). Since this (N+2)nd cell is a cell with a four-valued mark, four-valued cell level data $CL_{N+2}$ thereof is read by the operation unit 138 referring to the four-valued cell table area of the table RAM 135 shown in FIG. 41 according to the digital data $SL_{N+2}$ alone obtained from a reproduction signal, and the four-valued cell level data $CL_{N+2}$ is retained in the data RAM 136 (step S135). After this operation, according to the digital data $SL_{N+1}$ of the (N+1)st cell retained in the digital data retaining unit 133 and the judged cell level data $CL_{N+2}$ stored in the data RAM 136, eight-valued cell level data $CL_{N+1}$ is read by the operation unit 138 referring to the ensuing-cell-based table area of the table RAM 135 shown in FIG. 41, and is output under control of the sequencer 137 (step S136). Subsequently, under control of the sequencer 137, the four-valued cell level data $CL_{N+2}$ of the (N+2)nd cell stored in the data RAM 136 is output (step S137). Thereby, the cell level data $CL_{N+1}$ and the cell level data $CL_{N+2}$ are output in a correct order.

From step S138 onward, processes similar to the steps S131 to S137 are repeated with respect to an (N+3)rd cell, an (N+4)th cell, and so forth so as to obtain a cell level of each cell of the information recording medium 3 on which a four-valued mark is recorded on one cell in every three cells. Thus-obtained cell level data e of 3-bit cells is converted by the cell-data converting unit 14 into an 8-bit data row by omitting the lowest-order bit of the four-valued cell so as to form the reproduction information g.

According to the above-described information reproducing process, even when one cell is erroneously reproduced due to a defect and so forth, subsequent cells can be reproduced without causing successive errors.

Figure 45:
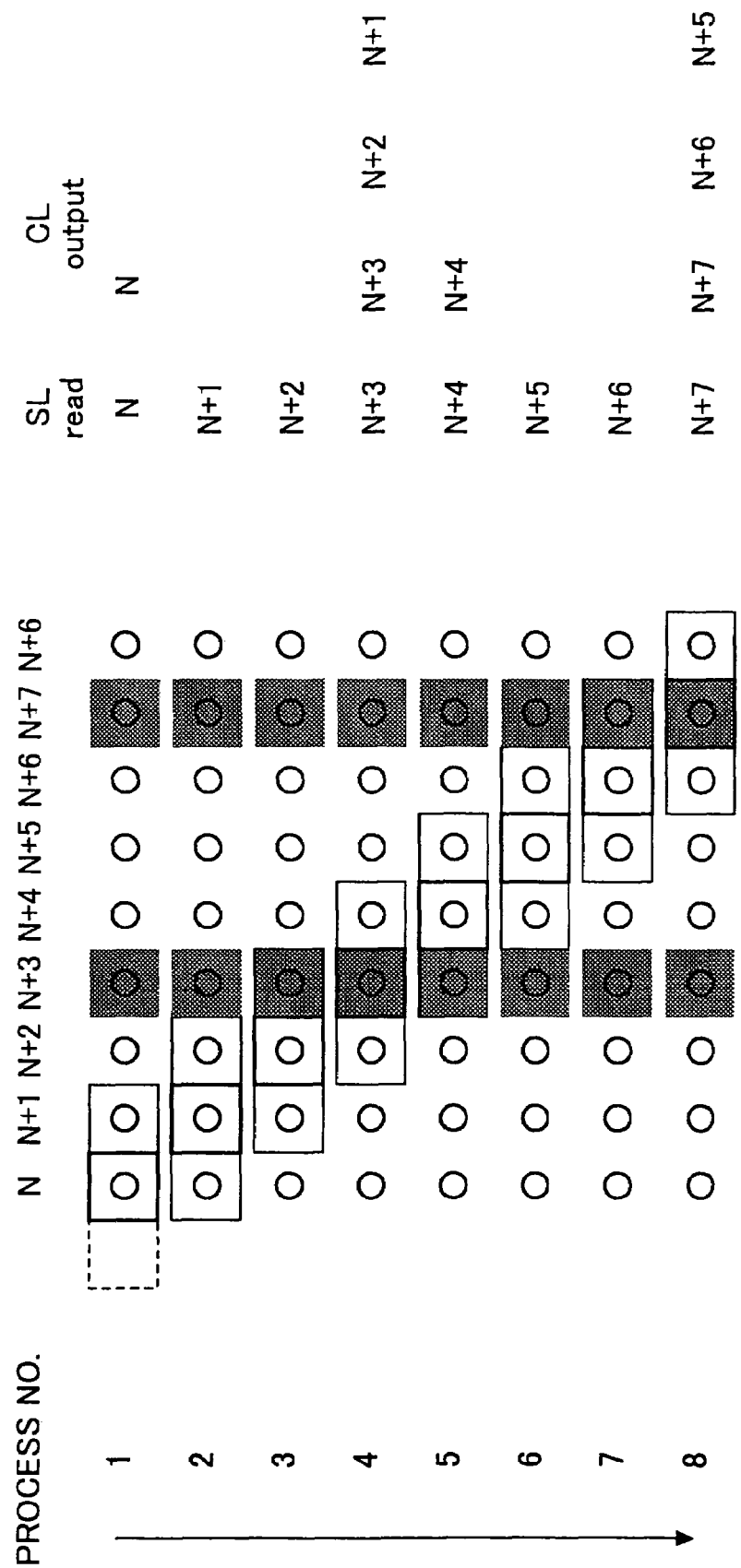
FIG. 45 is a process transition diagram illustrating an example of an information reproducing process according to the tenth embodiment of the present invention.

Next, a description will be given, with reference to FIG. 44 to FIG. 46, of a tenth embodiment according to the present invention. The present tenth embodiment adopts the first principle, the second principle, the third principle and the sixth principle of the present invention. On the information recording medium 3, a four-valued mark is recorded on one cell in every four cells, as shown in FIG. 45. In the present tenth embodiment, an information recording/reproducing device has the same structure as the information recording/reproducing device shown in FIG. 28, and a multivalued-level judging unit has the same structure as the multivalued-level judging unit 113B shown in FIG. 37, except that the table RAM 135 according to the present tenth embodiment comprises a preceding-cell-based table area (addresses 0-8191), a four-valued cell table area (addresses 8192-9215), an ensuing-cell-based table area (addresses 9216-17407), and a preceding-and-ensuing-cell-based table area (addresses 17408-82943), as shown in FIG. 44. That is, the table RAM 135 according to the present tenth embodiment has an arrangement equivalent to a combination of the table RAM 120 shown in FIG. 30, the table RAM 130 shown in FIG. 34B, and the table RAM 135 shown in FIG. 38.

With the above-described structure, a description will be given, with reference to a process transition diagram shown in FIG. 45 and a flowchart shown in FIG. 46, of an example of an information reproducing process according to the present tenth embodiment. In this example, multivalued information is recorded on the information recording medium 3 such that a four-valued mark is recorded on one cell in every four cells, as shown in FIG. 45, according to the method indicated in FIG. 6A with the lowest-order bit being fixed at 0. This flowchart for detecting cell levels includes a reading of cell level data of a cell with a four-valued mark from the four-valued cell table area, a reading of cell level data of a cell with an eight-valued mark following immediately after the cell with the four-valued mark from the preceding-cell-based table area according to the cell level data of the four-valued mark, a reading of cell level data of a cell with an eight-valued mark preceding immediately before the cell with the four-valued mark from the ensuing-cell-based table area according to the cell level data of the four-valued mark, and a reading of cell level data of a cell with an eight-valued mark two cells away from the cell with the four-valued mark (a cell not adjacent to the cell with the four-valued mark) from the preceding-and-ensuing-cell-based table area according to both the cell level data read from the preceding-cell-based table area and the cell level data read from the ensuing-cell-based table area. In this example, the cell with the four-valued mark is a fourth cell (N+3) from a start of an information recording, as shown in FIG. 45.

First, digital data $SL_N$ of an Nth cell with an eight-valued mark is read (step S141), and cell level data $CL_N$ thereof is obtained from the preceding-cell-based table area of the table RAM 135 shown in FIG. 44 according to the digital data $SL_N$ and a known reproduction level $CL_{N-1}$ of a preceding cell located at the start of the information recording (step S142). By this process, the judged cell level of the Nth cell is stored in the data RAM 136 (step S143) so as to be used for generating an address upon reproducing a next (N+1)st cell. Subsequently, digital data $SL_{N+1}$, $SL_{N+2}$ and $SL_{N+3}$ of the (N+1)st cell, an (N+2)nd cell and an (N+3)rd cell are read in succession (steps S144, S145, S146). The digital data $SL_{N+1}$ is retained in the digital data retaining unit 134, and the digital data $SL_{N+2}$ is retained in the digital data retaining unit 133. Since the (N+3)rd cell is a cell with a four-valued mark, four-valued cell level data $CL_{N+3}$ thereof is read by the operation unit 138 referring to the four-valued cell table area of the table RAM 135 shown in FIG. 44 according to the digital data $SL_{N+3}$ alone obtained from a reproduction signal, and the four-valued cell level data $CL_{N+3}$ is stored in the data RAM 136 (step S147).

After this operation, according to the digital data $SL_{N+2}$ retained in the digital data retaining unit 133 and the judged four-valued cell level data $CL_{N+3}$ stored in the data RAM 136, cell level data $CL_{N+2}$ of the (N+2)nd cell is read by the operation unit 138 referring to the ensuing-cell-based table area of the table RAM 135 shown in FIG. 44, and is stored in the data RAM 136 (step S148).

Subsequently, according to the digital data $SL_{N+1}$ retained in the digital data retaining unit 134 and the judged cell level data $CL_{N+1}$ and $CL_{N+2}$ stored in the data RAM 136, cell level data $CL_{N+1}$ of the (N+1)st cell is read by the operation unit 138 referring to the preceding-and-ensuing-cell-based table area of the table RAM 135 shown in FIG. 44, and is output (step S149). Subsequently, under control of the sequencer 137, the cell level data $CL_{N+2}$ of the (N+2)nd cell stored in the data RAM 136 is output (step S150), and the cell level data $CL_{N+3}$ of the (N+3)rd cell stored in the data RAM 136 is output (step S151). Thereby, the cell level data $CL_{N+1}$, the cell level data $CL_{N+2}$ and the cell level data $CL_{N+3}$ are output in a correct order.

From step S152 onward, processes similar to the steps S141 to S151 are repeated with respect to an (N+4)th cell, an (N+5)th cell, and so forth so as to obtain a cell level of each cell of the information recording medium 3 on which a four-valued mark is recorded on one cell in every four cells. Thus-obtained cell level data e of 3-bit cells is converted by the cell-data converting unit 14 into an 8-bit data row by omitting the lowest-order bit of the four-valued cell so as to form the reproduction information g.

According to the above-described information reproducing process, even when one cell is erroneously reproduced due to a defect and so forth, subsequent cells can be reproduced without causing successive errors.

Besides, although the above-described embodiments set forth cases involving the information recording medium 3 using a phase change film as a (recording-erasable) recording material allowing information recorded thereon to be erased, the present invention is also applicable to a case involving an information recording medium using an information recording film composed of magneto-optical material. Additionally, the present invention is applicable, not only to a rewritable-medium system using the recording-erasable recording material, but also to a write-once-medium system using an organic dye or a metal film as a recordable (non-erasable) recording material. Further, in respect of an information reproduction, the present invention is applicable to a read-only-medium system using a read-only recording medium on which multivalued information marks are formed as phase pits having multiple depths, for example.

The present invention is not limited to the specifically disclosed embodiments, and variations and modifications may be made without departing from the scope of the present invention.

The present application is based on Japanese priority applications No. 2001-232471 filed on Jul. 31, 2001 and No. 2001-232474 filed on Jul. 31, 2001, the entire contents of which are hereby incorporated by reference.

What is claimed is:

1. An information reproducing device reproducing a multivalued level from a reproduction signal of a recording medium in which a mark representing information of said multivalued level is recorded on a cell, the device comprising:

an A/D converting unit converting said reproduction signal into digital data;

a digital-data retaining unit retaining said digital data;

a primary operation unit judging a multivalued level of said digital data according to the reproduction signal deriving only from the mark of a present cell;

a judged-value retaining unit temporarily retaining the judged multivalued level judged by said primary operation unit;

an ensuing cell level operation unit determining a multivalued level of an ensuing cell ensuing said present cell prior to re-judging the multivalued level of said present cell;

a reference judged value selecting unit selecting either of the judged multivalued levels of a preceding cell preceding said present cell and said ensuing cell according to an amount of an inter-code interference from either of said preceding cell and said ensuing cell to the reproduction signal of said present cell; and a re-judgment operation unit re-judging the multivalued level of said present cell by referring to the judged multivalued level selected by said reference judged value selecting unit.

2. The information reproducing device as claimed in claim 1, wherein said reference judged value selecting unit determines the amount of said inter-code interference according to a result of a multivalued-level judgment performed by using a level of the reproduction signal deriving from each of said present cell, said preceding cell and said ensuing cell.

3. The information reproducing device as claimed in claim 2, wherein said reference judged value selecting unit selects the judged multivalued level of said preceding cell when the amount of the inter-code interference from said preceding cell to the reproduction signal of said present cell is larger than the amount of the inter-code interference from said ensuing cell to the reproduction signal of said present cell.

4. The information reproducing device as claimed in claim 2, wherein said reference judged value selecting unit selects the judged multivalued level of said ensuing cell when the amount of the inter-code interference from said preceding cell to the reproduction signal of said present cell is smaller than the amount of the inter-code interference from said ensuing cell to the reproduction signal of said present cell.

5. The information reproducing device as claimed in claim 2, wherein said reference judged value selecting unit selects the judged multivalued level of said preceding cell and the judged multivalued level of said ensuing cell when the amount of the inter-code interference from said preceding cell to the reproduction signal of said present cell is substantially equal to the amount of the inter-code interference from said ensuing cell to the reproduction signal of said present cell, and said re-judgment operation unit determines a judged multivalued level of said present cell to be either of Y1 and Y2, Y1 being a judged multivalued level of said present cell re-judged by referring to the judged multivalued level of said preceding cell, and Y2 being a judged multivalued level of said present cell re-judged by referring to the judged multivalued level of said ensuing cell when the judged multivalued levels Y1 and Y2 coincide.

6. The information reproducing device as claimed in claim 2, wherein said reference judged value selecting unit selects the judged multivalued level of said preceding cell and the judged multivalued level of said ensuing cell when the amount of the inter-code interference from said preceding cell to the reproduction signal of said present cell is substantially equal to the amount of the inter-code interference from said ensuing cell to the reproduction signal of said present cell, and said re-judgment operation unit compares magnitudes of $|y-y1|$ and $|y-y2|$, y1 being a learned level value of the reproduction signal estimated from a judged multivalued level Y1 of said present cell re-judged by referring to the judged multivalued level of said preceding cell, y2 being a learned level value of the reproduction signal estimated from a judged multivalued level Y2 of said present cell re-judged by referring to the judged multivalued level of said ensuing cell, and y being an actually measured level value of the reproduction signal of said present cell, when said judged multivalued level Y1 and said judged multivalued level Y2 do not coincide, so as to determine a judged multivalued level of said present cell to be said judged multivalued level Y1 when $|y-y1|$ is smaller than $|y-y2|$, and to determine a judged multivalued level of said present cell to be said judged multivalued level Y2 when $|y-y1|$ is larger than $|y-y2|$.

7. The information reproducing device as claimed in claim 2, wherein said reference judged value selecting unit determines the amount of said inter-code interference by comparing a learned level value y1 of the reproduction signal estimated from a judged multivalued level Y1 of said present cell re-judged by referring to the judged multivalued level of said preceding cell, a learned level value y2 of the reproduction signal estimated from a judged multivalued level Y2 of said present cell re-judged by referring to the judged multivalued level of said ensuing cell, and an actually measured level value y of the reproduction signal of said present cell, after performing the multivalued-level judgment by using the level of the reproduction signal of each of said present cell, said preceding cell and said ensuing cell.

8. The information reproducing device as claimed in claim 7, wherein said re-judgment operation unit determines a judged multivalued level of said present cell to be said judged multivalued level Y1 when $|y-y1|$ is smaller than $|y-y2|$, according to a result of comparison between magnitudes of $|y-y1|$ and $|y-y2|$.

9. The information reproducing device as claimed in claim 7, wherein said re-judgment operation unit determines a judged multivalued level of said present cell to be said judged multivalued level Y2 when $|y-y1|$ is larger than $|y-y2|$, according to a result of comparison between magnitudes of $|y-y1|$ and $|y-y2|$.

10. The information reproducing device as claimed in claim 2, wherein said re-judgment operation unit uses a judged multivalued level of said present cell for judging multivalued levels of ensuing cells when said judged multivalued level of said present cell is rewritten.

11. The information reproducing device as claimed in claim 2, comprising:

a learning unit reproducing learned pattern information of known multivalued levels from the recording medium in which all combination patterns of a group of three marks are recorded beforehand as said learned pattern information; and a criterion-table creating unit creating at least one criterion table according to level-value information of the reproduction signal obtained from said learned pattern information by said learning unit, wherein said criterion table is used for judging the multivalued level of said present cell.

12. The information reproducing device as claimed in claim 11, including a present-cell judgment table, a preceding-cell reference table and an ensuing-cell reference table as the criterion tables.

13. The information reproducing device as claimed in claim 12, wherein said criterion-table creating unit creates said present-cell judgment table according to a process ignoring level values of said preceding cell and said ensuing cell among the level-value information of the reproduction signal obtained from said learned pattern information, creates said preceding-cell reference table according to a process ignoring a level value of said ensuing cell among the level-value information of the reproduction signal obtained from said learned pattern information, and creates said ensuing-cell reference table according to a process ignoring a level value of said preceding cell among the level-value information of the reproduction signal obtained from said learned pattern information.

14. An information recording and reproducing device reproducing a multivalued level from a reproduction signal of a writable recording medium in which a mark representing information of said multivalued level is recorded on a cell, the device comprising:

an A/D converting unit converting said reproduction signal into digital data;

a digital-data retaining unit retaining said digital data;

a primary operation unit judging a multivalued level of said digital data according to the reproduction signal deriving only from the mark of a present cell;

a judged-value retaining unit temporarily retaining the judged multivalued level judged by said primary operation unit;

an ensuing cell level operation unit determining a multivalued level of an ensuing cell ensuing said present cell prior to re-judging the multivalued level of said present cell;

a reference judged value selecting unit selecting either of the judged multivalued levels of a preceding cell preceding said present cell and said ensuing cell according to an amount of an inter-code interference from either of said preceding cell and said ensuing cell to the reproduction signal of said present cell;

a re-judgment operation unit re-judging the multivalued level of said present cell by referring to the judged multivalued level selected by said reference judged value selecting unit;

a learned-pattern recording unit recording all combination patterns of a group of three marks as learned pattern information of known multivalued levels in said recording medium;

a learning unit reproducing said learned pattern information from said recording medium; and a criterion-table creating unit creating at least one criterion table according to level-value information of the reproduction signal obtained from said learned pattern information by said learning unit, the criterion table being used for judging the multivalued level of said present cell.

15. The information recording and reproducing device as claimed in claim 14, wherein said learned-pattern recording unit records all the combination patterns outside a user data area in said recording medium.

16. The information recording and reproducing device as claimed in claim 14, including a present-cell judgment table, a preceding-cell reference table and an ensuing-cell reference table as the criterion tables.

17. The information recording and reproducing device as claimed in claim 16, wherein said criterion-table creating unit creates said present-cell judgment table according to a process ignoring level values of said preceding cell and said ensuing cell among the level-value information of the reproduction signal obtained from said learned pattern information, creates said preceding-cell reference table according to a process ignoring a level value of said ensuing cell among the level-value information of the reproduction signal obtained from said learned pattern information, and creates said ensuing-cell reference table according to a process ignoring a level value of said preceding cell among the level-value information of the reproduction signal obtained from said learned pattern information.

* * * * *